(12) United States Patent
Yakubo et al.

(10) Patent No.: US 11,133,336 B2
(45) Date of Patent: Sep. 28, 2021

(54) SEMICONDUCTOR DEVICE AND MANUFACTURING METHOD OF SEMICONDUCTOR DEVICE

(71) Applicant: SEMICONDUCTOR ENERGY LABORATORY CO., LTD., Atsugi (JP)

(72) Inventors: Yuto Yakubo, Kanagawa (JP); Toshinobu Asami, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/626,420

(22) PCT Filed: Jun. 18, 2018

(86) PCT No.: PCT/IB2018/054449
§ 371 (c)(1),
(2) Date: Dec. 24, 2019

(87) PCT Pub. No.: WO2019/003042
PCT Pub. Date: Jan. 3, 2019

(65) Prior Publication Data
US 2020/0144308 A1 May 7, 2020

(30) Foreign Application Priority Data
Jun. 27, 2017 (JP) .............................. JP2017-125126

(51) Int. Cl.
*H01L 27/12* (2006.01)
*H01L 27/105* (2006.01)

(52) U.S. Cl.
CPC ........ *H01L 27/1248* (2013.01); *H01L 27/105* (2013.01); *H01L 27/1211* (2013.01)

(58) Field of Classification Search
CPC . H01L 27/105; H01L 27/1211; H01L 27/124; H01L 27/1248; H01L 27/11519;
(Continued)

(56) References Cited

U.S. PATENT DOCUMENTS 7,847,342 B2  12/2010  Fukuzumi et al.
8,247,863 B2   8/2012  Fukuzumi et al.
(Continued)

FOREIGN PATENT DOCUMENTS

JP  2007-317874 A    12/2007
JP  2007317874 A  *  12/2007  ........ H01L 27/11582
(Continued)

OTHER PUBLICATIONS

International Search Report (Application No. PCT/IB2018/054449) dated Sep. 25, 2018.
(Continued)

*Primary Examiner* — David C Spalla
(74) *Attorney, Agent, or Firm* — Fish & Richardson P.C.

(57) ABSTRACT

A semiconductor device having a large storage capacity per unit area is provided.
The semiconductor device including a memory string, where the memory string includes a memory cell and a transistor; the memory cell includes a first conductor having a first opening, a first insulator provided inside the first opening, a second insulator provided inside the first insulator, a third insulator provided inside the second insulator, and a first oxide provided inside the third insulator; the transistor includes a second conductor having a second opening, the first insulator provided inside the second opening, the first oxide provided inside the first insulator, a fifth insulator provided inside the first oxide, and a third conductor provided inside the fifth insulator; the second conductor includes a region overlapping with the first oxide with the
(Continued)

first insulator therebetween; and the third conductor includes a region overlapping with the first oxide with the fifth insulator therebetween.

8 Claims, 39 Drawing Sheets

(58) Field of Classification Search
CPC ......... H01L 27/11556; H01L 27/11565; H01L 27/1157; H01L 27/11578; H01L 27/11582; H01L 27/1225; H01L 29/78642; H01L 29/7869; H01L 29/7926
See application file for complete search history.

(56) References Cited

U.S. PATENT DOCUMENTS

| | | | |
|---|---|---|---|
| 8,902,663 B1 | 12/2014 | Or-Bach et al. | |
| 9,117,749 B1 | 8/2015 | Or-Bach et al. | |
| 9,634,097 B2 | 4/2017 | Rabkin et al. | |
| 9,679,907 B1* | 6/2017 | Kaneko | H01L 21/31111 |
| 9,780,170 B2 | 10/2017 | Ota et al. | |
| 2007/0133358 A1 | 6/2007 | Kubo et al. | |
| 2008/0149913 A1 | 6/2008 | Tanaka et al. | |
| 2008/0239799 A1 | 10/2008 | Watanabe | |
| 2009/0027955 A1 | 1/2009 | Koh et al. | |
| 2009/0034123 A1 | 2/2009 | Aoki et al. | |
| 2009/0146206 A1 | 6/2009 | Fukuzumi et al. | |
| 2010/0052042 A1 | 3/2010 | Tanaka et al. | |
| 2010/0142091 A1 | 6/2010 | Tsukamoto et al. | |
| 2010/0142261 A1 | 6/2010 | Kubo et al. | |
| 2010/0142262 A1 | 6/2010 | Tsukamoto et al. | |
| 2010/0182828 A1 | 7/2010 | Shima et al. | |
| 2010/0213537 A1 | 8/2010 | Fukuzumi et al. | |
| 2010/0259960 A1 | 10/2010 | Samachisa | |
| 2010/0296338 A1 | 11/2010 | Park et al. | |
| 2011/0006277 A1 | 1/2011 | Kubo et al. | |
| 2011/0026294 A1 | 2/2011 | Tsukamoto et al. | |
| 2011/0031467 A1 | 2/2011 | Kubo et al. | |
| 2011/0065270 A1 | 3/2011 | Shim et al. | |
| 2011/0068319 A1 | 3/2011 | Tsukamoto et al. | |
| 2011/0122676 A1 | 5/2011 | Murooka et al. | |
| 2011/0140070 A1 | 6/2011 | Kim | |
| 2011/0216575 A1 | 9/2011 | Yamaguchi et al. | |
| 2011/0216582 A1 | 9/2011 | Tsukamoto et al. | |
| 2011/0235408 A1 | 9/2011 | Minemura et al. | |
| 2011/0273927 A1 | 11/2011 | Hanzawa et al. | |
| 2012/0008369 A1 | 1/2012 | Shimuta et al. | |
| 2012/0087178 A1 | 4/2012 | Watanabe et al. | |
| 2012/0261722 A1 | 10/2012 | Tang et al. | |
| 2012/0268980 A1 | 10/2012 | Awaya et al. | |
| 2012/0287697 A1 | 11/2012 | Hanzawa et al. | |
| 2013/0075684 A1 | 3/2013 | Kinoshita et al. | |
| 2013/0128651 A1 | 5/2013 | Kubo | |
| 2013/0141968 A1 | 6/2013 | Sasago et al. | |
| 2013/0228739 A1 | 9/2013 | Sasago et al. | |
| 2013/0258752 A1 | 10/2013 | Park | |
| 2014/0268996 A1 | 9/2014 | Park | |
| 2014/0301128 A1 | 10/2014 | Park | |
| 2014/0321193 A1 | 10/2014 | Park | |
| 2016/0343434 A1 | 11/2016 | Lee et al. | |
| 2017/0040416 A1* | 2/2017 | Ota | H01L 27/11575 |
| 2017/0236872 A1 | 8/2017 | Kanemura et al. | |

FOREIGN PATENT DOCUMENTS

| | | |
|---|---|---|
| JP | 2009-135324 A | 6/2009 |
| JP | 2010-199314 A | 9/2010 |
| JP | 2017-034144 A | 2/2017 |

OTHER PUBLICATIONS

Written Opinion (Application No. PCT/IB2018/054449) dated Sep. 25, 2018.

* cited by examiner

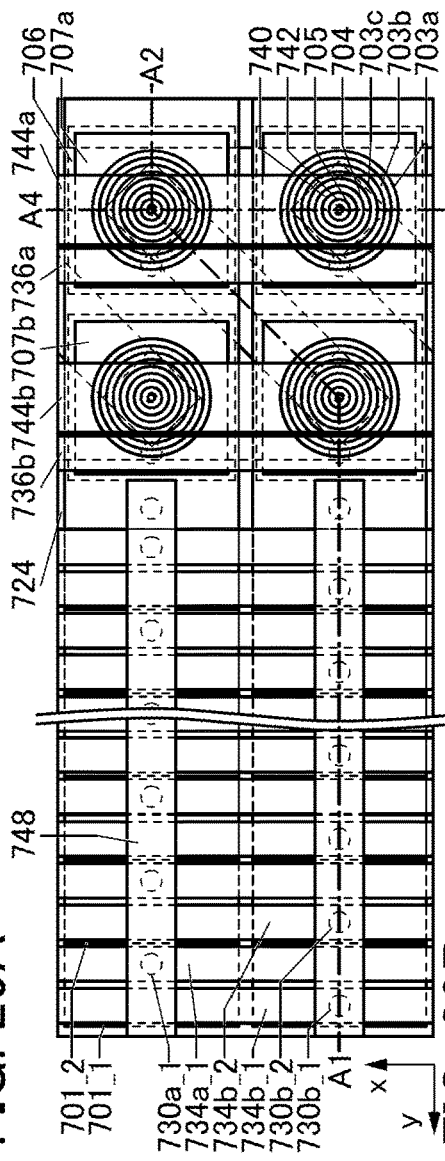
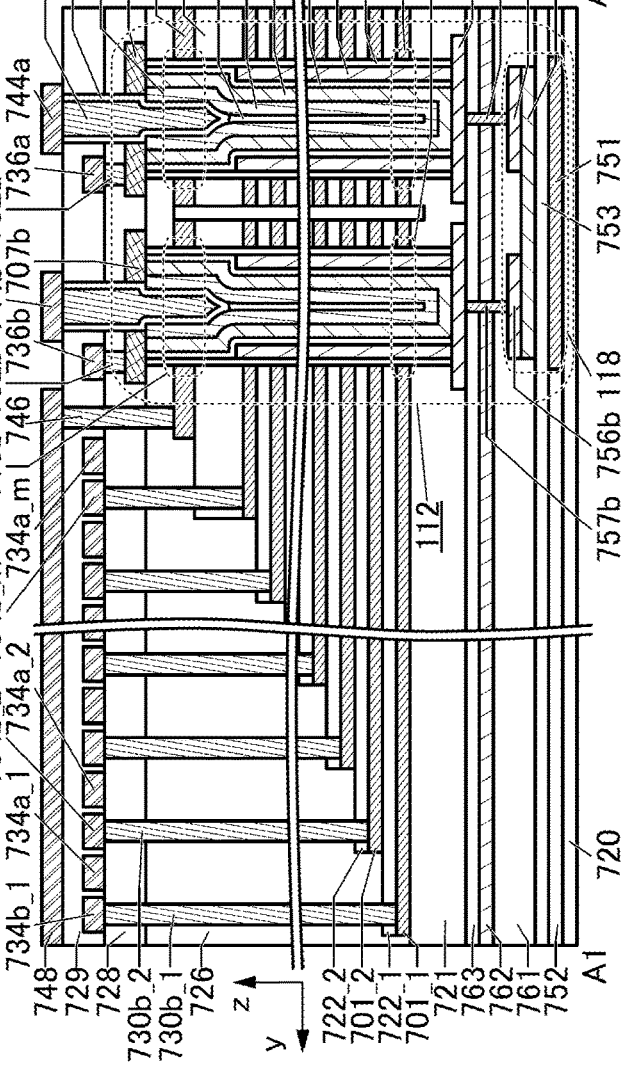
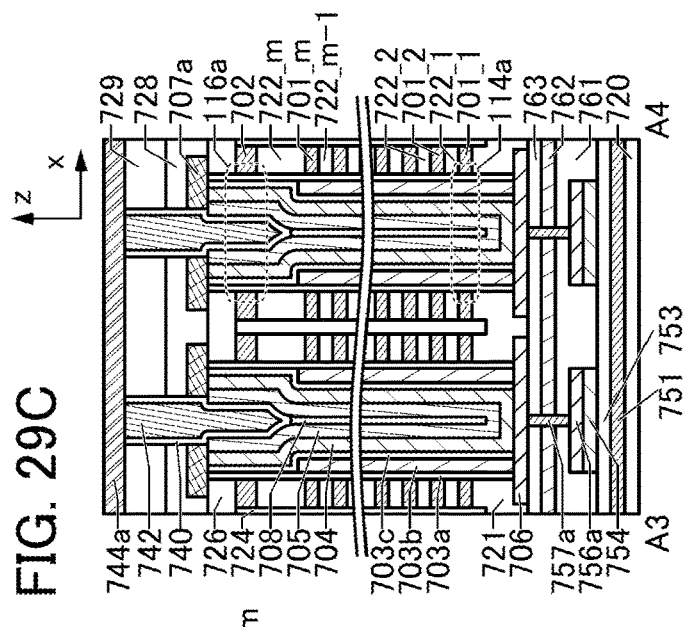
FIG. 29A
FIG. 29B
FIG. 29C

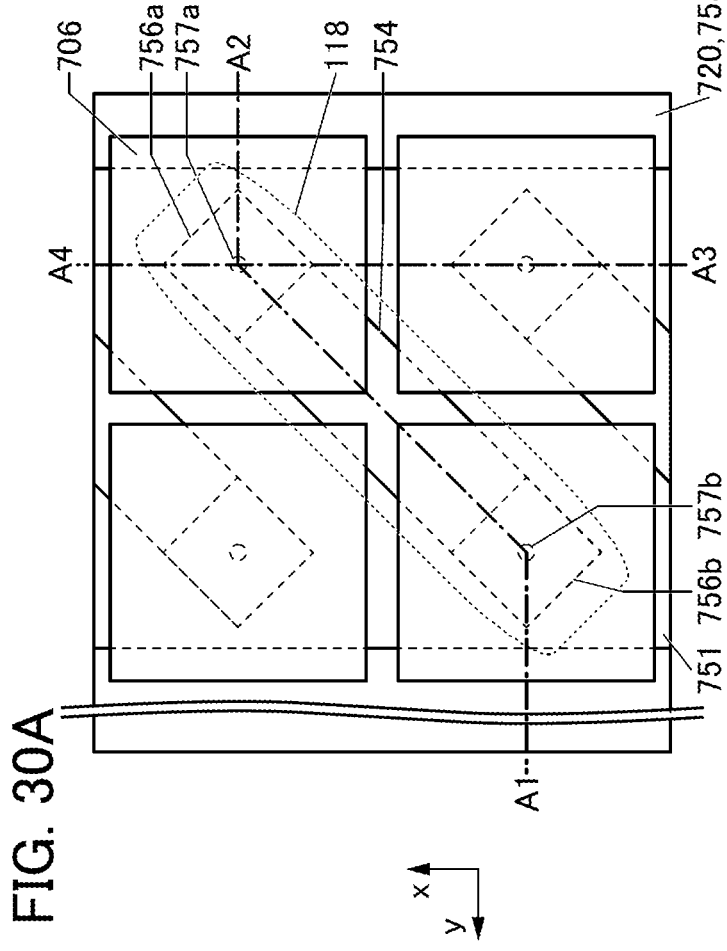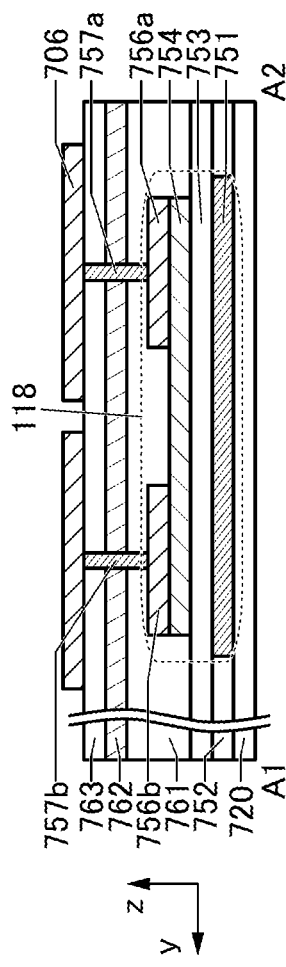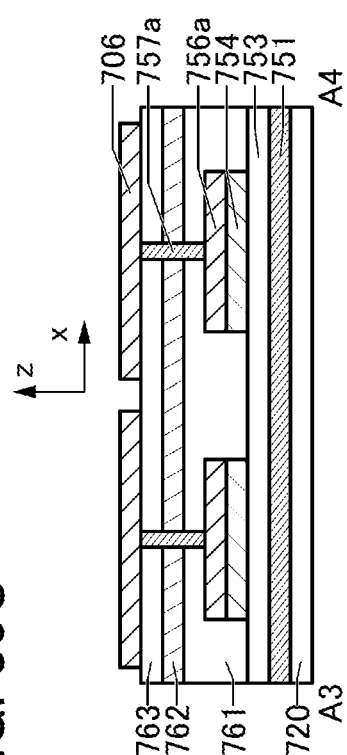
FIG. 30A
FIG. 30B
FIG. 30C

110

SEMICONDUCTOR DEVICE AND MANUFACTURING METHOD OF SEMICONDUCTOR DEVICE

CROSS REFERENCE TO RELATED APPLICATIONS

This application is a U.S. National Phase Application under 35 U.S.C. § 371 of International Application PCT/IB2018/054449, filed on Jun. 18, 2018, which is incorporated by reference, and which claims the benefit of a foreign priority application filed in Japan on Jun. 27, 2017, as Application No. 2017-125126.

TECHNICAL FIELD

The present invention relates to, for example, a semiconductor device and a semiconductor device. Alternatively, the present invention relates to a semiconductor device and a manufacturing method of the semiconductor device. Alternatively, the present invention relates to a transistor and a memory cell which are included in a semiconductor device. Alternatively, the present invention relates to a manufacturing method of a transistor and a memory cell. Alternatively, the present invention relates to a memory device, a processor, and an electronic device. Alternatively, the present invention relates to a manufacturing method of the memory device, the processor, and the electronic device. Alternatively, the present invention relates to a driving method of the memory device, the processor, and the electronic device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter.

Note that in this specification and the like, a semiconductor device refers to a device that can function by utilizing semiconductor characteristics in general. A display device, a light-emitting device, a lighting device, an electro-optical device, a memory device, a semiconductor circuit, and an electronic device include a semiconductor device in some cases.

BACKGROUND ART

In recent years, with the increase in the amount of data manipulated, a semiconductor device having a larger storage capacity has been required. To increase storage capacity per unit area, stacking memory cells is effective (see Patent Documents 1 and 2). Stacking memory cells can increase storage capacity per unit area in accordance with the number of stacked memory cells.

REFERENCES

[Patent Document 1] United States Patent Application Publication No. 2011/0065270A1
[Patent Document 2] U.S. Pat. No. 9,634,097B2

SUMMARY OF THE INVENTION

Problems to be Solved by the Invention

An object of one embodiment of the present invention is to provide a semiconductor device having a large storage capacity per unit area. Another object of one embodiment of the present invention is to provide a semiconductor device having a novel structure where memory cells are stacked. Alternatively, another object of one embodiment of the present invention is to provide a semiconductor device with high productivity. Another object of one embodiment of the present invention is to provide a highly reliable semiconductor device.

Another object of one embodiment of the present invention is to provide a module including the semiconductor device. Another object of one embodiment of the present invention is to provide an electronic device including the above semiconductor device or the module. Alternatively, another object of one embodiment of the present invention is to provide a novel semiconductor device. Another object of one embodiment of the present invention is to provide a novel module. Another object of one embodiment of the present invention is to provide a novel electronic device.

Note that the descriptions of these objects do not disturb the existence of other objects. One embodiment of the present invention does not need to achieve all of these objects. Other objects will be apparent from and can be derived from the description of the specification, the drawings, the claims, and the like.

Means for Solving the Problems

One embodiment of the present invention is a semiconductor device including a memory string, where the memory string includes a memory cell and a transistor; the memory cell includes a first conductor having a first opening, a first insulator provided inside the first opening, a second insulator provided inside the first insulator, a third insulator provided inside the second insulator, a first oxide provided inside the third insulator, and a fourth insulator provided inside the first oxide; the transistor includes a second conductor having a second opening, the first insulator provided inside the second opening, the third insulator provided inside the first insulator, the first oxide provided inside the third insulator, a fifth insulator provided inside the first oxide, and a third conductor provided inside the fifth insulator; the second conductor includes a region overlapping with the first oxide with the first insulator therebetween; and the third conductor includes a region overlapping with the first oxide with the fifth insulator therebetween.

In the above, the second conductor preferably functions as a first gate, and the third conductor preferably functions as a second gate.

Furthermore, in the above, the first oxide preferably include In, an element M (M is Al, Ga, Y, or Sn), and Zn.

Furthermore, in the above, the fourth insulator preferably has a stacked-layer structure.

Furthermore, in the above, the semiconductor device preferably further includes a base, the semiconductor device preferably includes a plurality of the memory cells over the base, and the plurality of the memory cells and the transistor are preferably provided so as to be stacked in a direction perpendicular to one surface of the base.

Furthermore, in the above, the second insulator is preferably formed over or under the third conductor in a direction perpendicular to one surface of the base.

Furthermore, in the above, the first insulator is preferably an oxide including any one of silicon, aluminum, and hafnium.

Furthermore, in the above, the third insulator is preferably an oxide including any one of silicon, aluminum, and hafnium.

Effect of the Invention

With one embodiment of the present invention, a semiconductor device having a large storage capacity per unit area can be provided. Furthermore, with one embodiment of the present invention, a semiconductor device having a novel structure where memory cells are stacked can be provided. Alternatively, with one embodiment of the present invention, a semiconductor device with high productivity can be provided. Alternatively, with one embodiment of the present invention, a highly reliable semiconductor device can be provided.

Furthermore, with one embodiment of the present invention, a module including the semiconductor device can be provided. Alternatively, with one embodiment of the present invention, an electronic device including the above semiconductor device or the module can be provided. Alternatively, with one embodiment of the present invention, a novel semiconductor device can be provided. Alternatively, with one embodiment of the present invention, a novel module can be provided. Alternatively, a novel electronic device can be provided.

Note that the descriptions of these effects do not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIGS. 29A-29C A top view and cross-sectional views illustrating a semiconductor device of one embodiment of the present invention.

FIGS. 30A-30C A top view and cross-sectional views illustrating a transistor of one embodiment of the present invention.

MODE FOR CARRYING OUT THE INVENTION

Figure 1A:
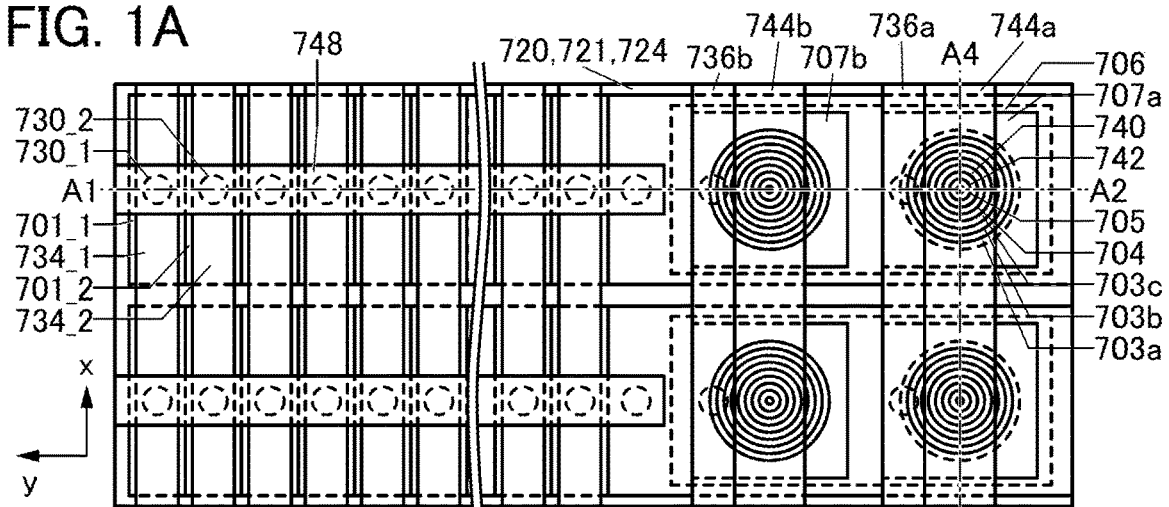
FIGS. 1A-1C A top view and cross-sectional views illustrating a semiconductor device of one embodiment of the present invention.

Embodiments of the present invention will be described in detail with reference to the drawings. Note that the present invention is not limited to the description below, and it is easily understood by those skilled in the art that modes and details of the present invention can be modified in various ways. In addition, the present invention should not be construed as being limited to the description in the embodiments given below. In describing structures of the invention with reference to the drawings, common reference numerals are used for the same portions in different drawings. Note that the same hatched pattern is applied to similar parts, and the similar parts are not especially denoted by reference numerals in some cases.

A structure in the following embodiments can be appropriately applied to, combined with, or replaced with another structure in the embodiments, for example, and the resulting structure is also one embodiment of the present invention.

Note that the size, the film (layer) thickness, or regions in drawings is sometimes exaggerated for simplicity.

Note that in this specification, the term "film" and the term "layer" can be interchanged with each other.

Note that a voltage usually refers to a potential difference between a given potential and a reference potential (e.g., a ground potential (GND) or a source potential). Thus, a voltage can be replaced with a potential. In general, a potential (voltage) is relative, and its quantity depends on the relative quantity from a reference potential. Therefore, a potential which is represented as a "ground potential" or the like is not always 0 V. For example, the lowest potential in a circuit may be represented as a "ground potential". Alternatively, a substantially intermediate potential in a circuit may be represented as a "ground potential". In those cases, a positive potential and a negative potential are defined using the potential as a reference.

Note that the ordinal numbers such as first and second are used for convenience and do not denote the order of steps or the stacking order of layers. Therefore, for example, description can be made even when "first" is replaced with "second", "third", or the like, as appropriate. In addition, the ordinal numbers put in this specification and the like do not correspond to the ordinal numbers that are used to specify one embodiment of the present invention in some cases.

In this specification, the expression "A and B are connected" means the case where A and B are electrically connected as well as the case where A and B are directly connected. Here, the expression "A and B are electrically connected" means the case where electric signals can be transmitted and received between A and B when an object having any electric action exists between A and B.

Note that in this specification, a source of a transistor means a source region that is part of a semiconductor film functioning as an active layer or a source electrode connected to the above semiconductor film. Similarly, a drain of a transistor means a drain region that is part of the above semiconductor film or a drain electrode connected to the above semiconductor film. Moreover, a gate means a gate electrode.

The names of a source and a drain of a transistor interchange with each other depending on the conductivity type of the transistor or levels of potentials applied to the terminals. In general, in an n-channel transistor, a terminal to which a lower potential is applied is referred to as a source, and a terminal to which a higher potential is applied is referred to as a drain. In a p-channel transistor, a terminal to which a lower potential is applied is referred to as a drain, and a terminal to which a higher potential is applied is referred to as a source. In this specification, although connection relation of the transistor is described assuming that the source and the drain are fixed for convenience in some cases, actually, the names of the source and the drain interchange with each other depending on the above relation of the potentials.

Unless otherwise specified, off-state current in this specification refers to drain current of a transistor in an off state. Unless otherwise specified, an off state refers to a state where the potential difference ($V_{GS}$) between its gate and source is lower than the threshold voltage (Vth) in an n-channel transistor, and a state where $V_{GS}$ is higher than Vth in a p-channel transistor. For example, the off-state current of an n-channel transistor sometimes refers to a drain current that flows when $V_{GS}$ is lower than Vth. The off-state current of a transistor depends on $V_{GS}$ in some cases. Thus, "the off-state current of a transistor is lower than or equal to $10^{-21}$ A" may mean that there is $V_{GS}$ at which the off-state current of the transistor is lower than or equal to $10^{-21}$ A.

Furthermore, the off-state current of a transistor depends on the potential difference between a drain and a source ($V_{DS}$) in some cases. Unless otherwise specified, the off-state current in this specification may be off-state current at an absolute value of $V_{DS}$ of 0.1 V, 0.8 V, 1 V, 1.2 V, 1.8 V, 2.5 V, 3 V, 3.3 V, 10 V, 12 V, 16 V, or 20 V. Alternatively, the off-state current sometimes expresses off-state current at $V_{DS}$ at which the reliability of a semiconductor device or the like including the transistor is ensured or $V_{DS}$ at which the semiconductor device or the like including the transistor is used.

Note that a "semiconductor" includes characteristics of an "insulator" in some cases when the conductivity is sufficiently low, for example. Furthermore, a "semiconductor" and an "insulator" cannot be strictly distinguished from each other in some cases because a border therebetween is not clear. Accordingly, a "semiconductor" described in this specification can be called an "insulator" in some cases. Similarly, an "insulator" described in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border therebetween is not clear. Accordingly, a "semiconductor" described in this specification can be called a "conductor" in some cases. Similarly, a "conductor" described in this specification can be called a "semiconductor" in some cases.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

Note that an impurity in a semiconductor refers to, for example, elements other than the main components of a semiconductor. For example, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, in the case where the semiconductor is silicon, examples of an impurity which changes the characteristics of the semiconductor include oxygen, Group 1 elements except hydrogen, Group 2 elements, Group 13 elements, and Group 15 elements.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

A channel width refers to, for example, the length of a portion where a source and a drain face each other in a region where a semiconductor (or a portion where current flows in a semiconductor when a transistor is in an on state) and a gate electrode overlap with each other, or a region where a channel is formed. Note that in one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel formation region formed in the side surface of the semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Accordingly, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, the simple term "channel width" refers to a surrounded channel width or an apparent channel width in some cases. Alternatively, in this specification, the simple term "channel width" refers to an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, the calculation is performed using a surrounded channel width in some cases. In that case, a value different from one calculated using an effective channel width is obtained in some cases.

In this specification, "parallel" indicates a state where the angle formed between two straight lines is greater than or equal to $-10°$ and less than or equal to $10°$. Accordingly, the case where the angle is greater than or equal to $-5°$ and less than or equal to $5°$ is also included. The term "substantially parallel" indicates that the angle formed between two straight lines is greater than or equal to $-30°$ and less than or equal to $30°$. In addition, "perpendicular" indicates a state where the angle formed between two straight lines is greater than or equal to $80°$ and less than or equal to $100°$. Accordingly, the case where the angle is greater than or equal to $85°$ and less than or equal to $95°$ is also included. The term "substantially perpendicular" indicates that the angle formed between two straight lines is greater than or equal to $60°$ and less than or equal to $120°$.

Furthermore, in this specification, in the case where a crystal is a trigonal crystal or a rhombohedral crystal, the crystal is regarded as a hexagonal crystal system.

Note that in this specification and the like, a silicon oxynitride film is a film in which oxygen content is higher than nitrogen content in its composition. A silicon oxynitride film preferably contains, for example, oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Moreover, a silicon nitride oxide film is a film in which nitrogen content is higher than oxygen content in its composition. A silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, a metal oxide means an oxide of a metal in a broad expression. Metal oxides are classified into an oxide insulator, an oxide conductor (including a transparent oxide conductor), an oxide semiconductor (also simply referred to as an OS), and the like. For example, when a metal oxide is used in an active layer of a transistor, the metal oxide is called an oxide semiconductor in some cases. In addition, in the case where an OS FET (or OS transistor) is mentioned, the OS FET can also be referred to as a transistor including a metal oxide or an oxide semiconductor.

Note that in this specification and the like, "In:Ga:Zn=4:2:3 or a neighborhood thereof" refers to an atomic ratio where, when In:Ga:Zn=4:x:y, x is greater than or equal to 1 and less than or equal to 3 (1≤x≤3) and y is greater than or equal to 2 and less than or equal to 4.1 (2≤y≤4.1). In addition, "In:Ga:Zn=5:1:6 or a neighborhood thereof" refers to an atomic ratio where, when In:Ga:Zn=5:x:y, x is greater than 0.1 and less than or equal to 2 (0.1<x≤2) and y is greater than or equal to 5 and less than or equal to 7 (5≤y≤7). In addition, "In:Ga:Zn=1:1:1 or a neighborhood thereof" refers to an atomic ratio where, when In:Ga:Zn=1:x:y, x is greater than 0.1 and less than or equal to 2 (0.1<x≤2) and y is greater than 0.1 and less than or equal to 2 (0.1<y≤2).

Embodiment 1

In this embodiment, a structure and a manufacturing method of a semiconductor device including a memory string 112 of one embodiment of the present invention will be described with reference to FIG. 1 to FIG. 24.
(Memory Cell 114, Memory String 112)

Figure 1B:
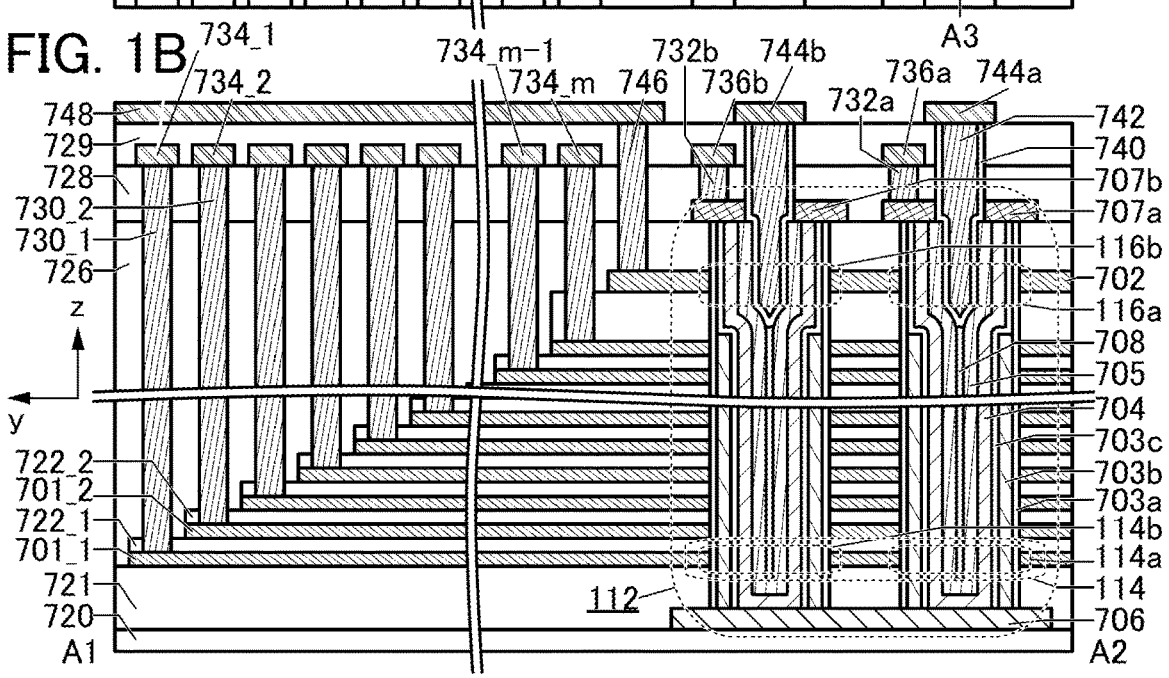
Figure 1C:
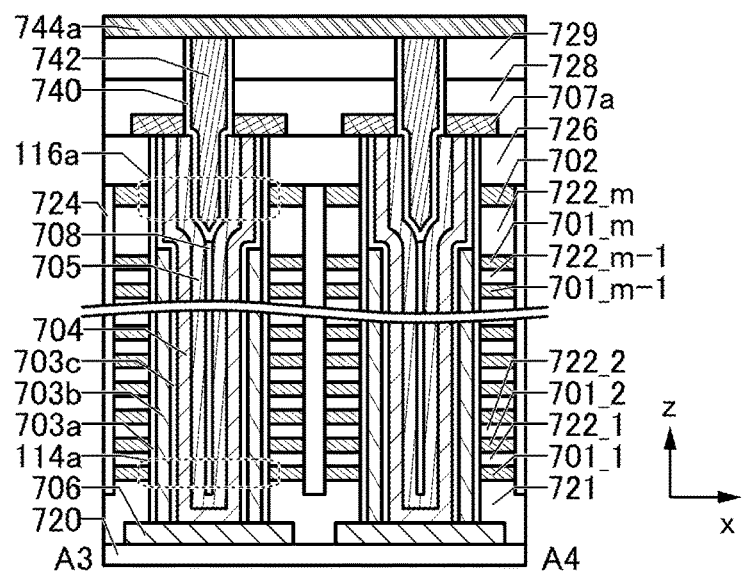

First, the structure of the semiconductor device including the memory string 112 of one embodiment of the present invention will be described with reference to FIG. 1. FIG. 1(A) is a top view of a semiconductor device including the memory string 112. FIG. 1(B) is a cross-sectional view of a portion indicated by a dashed-dotted line A1-A2 in FIG. 1(A). Furthermore, FIG. 1(C) is a cross-sectional view of a portion indicated by a dashed-dotted line A3-A4 in FIG. 1(A). Note that in the following description, a rectangular coordinate system using an x-axis, a y-axis, and a z-axis is set as illustrated in FIG. 1 for the sake of convenience. Here, the x-axis and the y-axis are parallel to the top surface of a base 720 provided with the memory string 112 and the z-axis is perpendicular to the top surface of the base 720.

The semiconductor device of one embodiment of the present invention includes the memory string 112, an insulating film 721 functioning as an interlayer film, an insulating film 724, an insulating film 726, an insulating film 728, and an insulating film 729. The semiconductor device further includes conductors 734 (a conductor 734_1 to a conductor 734_m (m is a natural number greater than or equal to 2)), conductors 736 (a conductor 736a and a conductor 736b), conductors 744 (a conductor 744a and a conductor 744b), and a conductor 748, which are electrically connected to the memory string 112 and function as wirings, and conductors 730 (a conductor 730_1 to a conductor 730_m), conductors 732 (a conductor 732a and a conductor 732b), and a conductor 746, which function as plugs.

Note that the conductor 730_1 to the conductor 730_m are electrically connected to the conductor 734_1 to the conductor 734_m, respectively; the conductor 732a and the conductor 732b are electrically connected to the conductor 736a and the conductor 736b, respectively; and the conductor 746 is electrically connected to the conductor 748.

Furthermore, the memory string 112 according to one embodiment of the present invention includes, over the base 720, a stack where conductors 701 (a conductor 701_1 to a conductor 701_m) and insulators 722 (an insulator 722_1 to an insulator 722_m) are alternately stacked in a z-axis direction and a conductor 702 is stacked over the insulator 722m, and includes insulators 703 (an insulator 703a, an insulator 703b, and insulator 703c) inside an opening that is formed so as to penetrate the stack.

Note that the insulator 703b is formed so that a top surface of the insulator 703b is located at a height between a bottom surface of the conductor 702 and a top surface of the conductor 701_m. In other words, in the opening, at heights from a bottom surface of the conductor 701_1 to the top surface of the conductor 701_m, the memory string 112 includes the insulator 703a, the insulator 703b, and the insulator 703c inside the above opening; an oxide 704 inside the insulators 703; an insulator 705 inside the oxide 704; and an insulator 708 inside the insulator 705. Furthermore, at heights from the bottom surface to a top surface of the conductor 702, the memory string 112 includes the insulator 703a and the insulator 703c inside the opening; the oxide 704 inside the insulators 703; the insulator 705 inside the oxide 704; an insulator 740 inside the insulator 705; and a conductor 742 inside the insulator 740.

The conductor 742 is formed so that a bottom surface of the conductor 742 is located higher than the insulator 703b in the opening.

Furthermore, the memory string 112 includes conductors 707 (a conductor 707a and a conductor 707b) electrically connected to an upper end portion of the oxide 704, and a conductor 706 electrically connected to a lower end portion of the oxide 704.

Note that the conductor 701_1 to the conductor 701_m are electrically connected to the conductor 730_1 to the conductor 730_m, respectively; the conductor 702 is electrically connected to the conductor 746; the conductor 707a and the conductor 707b are electrically connected to the conductor 732a and the conductor 732b, respectively; and the conductor 742 is electrically connected to the conductors 744.

Here, as illustrated in FIG. 1(A) and FIG. 1(B), the conductors 701 are provided so as to extend in a y-axis direction. Furthermore, as illustrated in FIG. 1(B) and FIG. 1(C), the insulators 703 and the oxide 704 are provided so as to extend in the z-axis direction. That is, it is preferable that the conductors 701 be provided so as to perpendicularly intersect with the insulators 703 and the oxide 704. Moreover, as illustrated in FIG. 1(A), the conductors 734 may be provided so as to extend in an x-axis direction. Furthermore, the conductor 736a functioning as a source line SL may be provided so as to extend in the x-axis direction. Furthermore, the conductor 736b functioning as a bit line BL may be provided so as to extend in the x-axis direction.

The oxide 704 is formed inside the opening formed so as to penetrate the stack where the conductors 701, the conductor 702, and the insulators 722 are alternately stacked, and is provided so as to extend in the z-axis direction. Furthermore, the insulators 703 are provided so as to surround a periphery of the side of the columnar oxide 704. In addition, the conductors 730 are formed in a columnar shape and provided so as to extend in the z-axis direction.

The columnar oxide 704 is electrically connected to the conductor 706 at the lower end in the z-axis direction and electrically connected to the conductors 707 at the upper end. As illustrated in FIG. 1(B), the conductor 706 is electrically connected to the lower ends of two oxides 704 which are adjacent to each other in the y-axis direction, and the upper ends of the two oxides 704 are electrically connected to the electrically separated conductors 707a and 707b.

Here, a region where the conductor 701 intersect with the insulator 703a, the insulator 703b, the insulator 703c, and the oxide 704 and the vicinity thereof function as a memory cell 114. In the memory cell 114, the oxide 704 functions as a region where a channel is formed (also referred to as a channel formation region), the conductor 701 functions as a gate electrode, the insulator 703a functions as a gate insulating film, the insulator 703b functions as a charge accumulation layer, and the insulator 703c functions as a tunnel insulating layer. Note that the conductor 701_1 to the conductor 701_m each intersect with two columnar oxides 704. In other words, the memory cell 114 includes two memory cells (a memory cell 114a and a memory cell 114b) which share any one of the conductors 701_1 to 701_m. Here, the memory cell positioned under the conductor 744a is denoted by the memory cell 114a, and the memory cell positioned under the conductor 744b is denoted by the memory cell 114b.

Note that the top-view shape of the opening formed in the stack, where the memory cell 114 is provided, is but not limited to, circular as illustrated in FIG. 1(A); the top-view shape can alternatively be, for example, elliptical or polygonal, e.g., a triangle or a quadrangle. In the case where a polygonal shape is employed, corners thereof may be rounded. The top-view shapes of the insulators 703 and the oxide 704 may change depending on the top-view shape of the opening. The opening may have a shape where a lower cross-sectional area (on the conductor 706 side) of the opening is smaller than an upper cross-sectional area (on the conductor 707 side of the opening).

Furthermore, a region where the conductor 702 intersects with the insulator 703a, the insulator 703c, the oxide 704, the insulator 740, and the conductor 742 and the vicinity thereof function as a selection transistor 116a and a selection transistor 116b. Here, the selection transistor positioned under the conductor 744a is denoted by the selection transistor 116a, and the selection transistor positioned under the conductor 744b is denoted by the selection transistor 116b. In the selection transistor 116a and the selection transistor 116b, the oxide 704 functions as a channel formation region, the conductor 702 functions as a first gate electrode, the insulator 703a and the insulator 703c function as first gate insulating films, the insulator 740 functions as a second gate (also referred to as a backgate) insulating film, and the conductor 742 functions as a second gate electrode.

By changing the potential of the second gate electrode independently of that of the gate electrode, the threshold voltage of the transistor can be changed. For example, by applying a negative potential to the second gate electrode, the threshold voltages of the selection transistor 116a and the selection transistor 116b can be made larger than 0 V; accordingly, the off-state current can be reduced and a drain current at a gate voltage of 0 V can be made extremely low.

The channel length direction of the memory cell 114a, the memory cell 114b, the selection transistor 116a, and the selection transistor 116b is parallel to the z-axis. Furthermore, the memory cell 114a, the memory cell 114b, the selection transistor 116a, and the selection transistor 116b are electrically connected in series and form the memory string 112.

Although the memory cell 114a and the memory cell 114b are electrically connected to each other through the conductor 706, the embodiment is not limited to this. For example, a transistor may be provided between the memory cell 114a and the memory cell 114b, which allows different data to be stored in the memory cell 114a and the memory cell 114b. Note that the transistor is preferably provided over a substrate.

Note that the structure of the semiconductor device described in this embodiment is an example, and the present invention is not limited to the number, the position, and the like of the circuit element, the wiring, and the like illustrated in the drawings and the like according to this embodiment.

The number, the position, and the like of the circuit element, the wiring, and the like included in the semiconductor device in this embodiment can be set as appropriate in accordance with the circuit configuration and the driving method.

The base 720 provided with the memory string 112 preferably has an insulating surface. As a substrate having an insulating surface, a semiconductor substrate provided with an insulating film on its surface, an insulator substrate, a conductor substrate provided with an insulator on its surface, or the like can be used. As the semiconductor substrate, a semiconductor substrate of silicon, germanium, or the like or a semiconductor substrate of silicon carbide, silicon germanium, gallium arsenide, indium phosphide, zinc oxide, gallium oxide, or the like can be used, for example. Furthermore, as the insulator substrate, a glass substrate, a quartz substrate, a sapphire substrate, a stabilized zirconia substrate (e.g., an yttria-stabilized zirconia substrate), a resin substrate, or the like can be used, for example. Furthermore, a semiconductor substrate in which an insulator region is included in the above semiconductor substrate, for example, an SOI (Silicon On Insulator) substrate or the like can be used. As the conductor substrate, a graphite substrate, a metal substrate, an alloy substrate, a conductive resin substrate, or the like can be used. Note that as the base 720, a substrate in which an interlayer insulating film is provided on a surface of a semiconductor substrate provided with a transistor forming a driver circuit may be used.

The conductor 701 functions as the gate of the memory cell 114 and is electrically connected to a word line WL. That is, the conductors 701, the conductors 730, and the conductors 734 also function as part of word lines WL. Here, as illustrated in FIG. 1(B), the conductors 701 are preferably provided in a step-like shape where the conductor 701 in a lower layer extends more to the A1 side than the conductor 701 in an upper layer does. By providing the conductors 701 in a step-like shape, part of a top surface of the conductor 701 in a lower layer does not overlap with the conductor 701 in an upper layer; thus, the non-overlapping regions of the conductor 701_1 to the conductor 701_m can be connected to the conductor 730_1 to the conductor 730_m, respectively.

For the conductors 701, a conductive material such as silicon or metal can be used. When silicon is used for the conductors 701, amorphous silicon or polysilicon can be used. Furthermore, a p-type impurity or an n-type impurity may be added to give a conducting property to silicon. As a conductive material containing silicon, silicide containing titanium, cobalt, or nickel can be used for the conductors 701. When a metal material is used for the conductors 701, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a conductive material containing the above-described metal element and nitrogen may be used. For example, a conductive material containing nitrogen, such as titanium nitride or tantalum nitride, may be used.

For the conductors 730 and the conductors 734, a material similar to that of the conductors 701 can be used.

The conductor 702 is provided over the conductors 701. The conductor 702 functions as the gates of the selection transistor 116b and the selection transistor 116a. For the conductor 702, a material similar to that of the conductors 701 can be used. As the conductor 702, a material that is the same as or different from that of the conductors 701 may be used. The conductors 701 and the conductor 702 are determined depending on the usage in consideration of their work functions and the like.

An insulating oxide, an insulating nitride, an insulating oxynitride, an insulating nitride oxide, an insulating metal oxide, an insulating metal oxynitride, an insulating metal nitride oxide, or the like can be used as the insulators 722. Because of having a low dielectric constant, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin is suitably used as the insulators 722.

The insulators 703 includes the insulator 703a, the insulator 703b, and the insulator 703c. The insulator 703a is provided on the conductor 701 side, the insulator 703c is provided on the oxide 704 side, and the insulator 703b is provided between the insulator 703a and the insulator 703c.

Note that it is not necessary to provide a charge accumulation layer in the selection transistor 116a and the selection transistor 116b. As illustrated in FIG. 1, the structure in which the insulator 703a and the insulator 703c are provided as the first gate insulating films of the selection transistor 116a and the selection transistor 116b may be employed. As the first gate insulating film, a structure in which only the insulator 703a is provided may also be employed.

For the insulator 703a, silicon oxide or silicon oxynitride is preferably used. Aluminum oxide, hafnium oxide, or an oxide containing aluminum and hafnium may be used. Alternatively, a stack of any of these materials may be used for the insulator 703a.

For the insulator 703b, a material that serves as a charge accumulation layer of the memory cell 114 is preferably used; silicon nitride or silicon nitride oxide is preferably used. Aluminum oxide, hafnium oxide, or an oxide containing aluminum and hafnium may be used.

For the insulator 703c, silicon oxide or silicon oxynitride is preferably used. Aluminum oxide, hafnium oxide, or an oxide containing aluminum and hafnium may be used. Alternatively, a stack of any of these materials may be used for the insulator 703c. Furthermore, the insulator 703c is preferably thinner than the insulator 703a. Although details are described later, in writing or erasing data to/from the memory cell 114, electrons are transferred between the oxide 704 and the insulator 703b through the insulator 703c. That is, the insulator 703c functions as a tunnel insulating layer of the memory cell 114.

The insulator 703a, the insulator 703b, and the insulator 703c can be formed by an atomic layer deposition (ALD) method or a chemical vapor deposition (CVD) method. In order to prevent the contamination of the interface between the insulator 703a, the insulator 703b, and the insulator 703c, it is preferable to successively deposit the insulator 703a, the insulator 703b, and the insulator 703c in one chamber or with the use of a multi-chamber deposition apparatus having a plurality of chambers without exposing surfaces on which the insulator 703a, the insulator 703b, and the insulator 703c are to be deposited to an air atmosphere.

In the case where the insulators 703 are formed inside the opening provided in the stack including the conductors 701, the conductor 702, and the insulators 722, the insulators 703 formed on a bottom portion of the opening needs to be removed by anisotropic etching using dry etching or the like.

As the oxide 704, a metal oxide functioning as an oxide semiconductor (hereinafter also referred to as an oxide semiconductor) is preferably used. The oxide semiconductor is preferable because a transistor including the oxide semiconductor can have more favorable switching characteristics and extremely lower off-state current than a transistor including a semiconductor made of silicon or the like.

For example, as the oxide 704, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) can be used. Furthermore, as the oxide 704, an In—Ga oxide or an In—Zn oxide may be used. The oxide 704 has a single-layer structure; however, this embodiment is not limited thereto. The oxide 704 may have a stacked-layer structure of two or more layers.

Note that the details of the metal oxide that can be used as the oxide 704 are described later.

For the insulator 705, a material similar to the materials described as the insulator 703a or the insulator 703c can be used.

Furthermore, the insulator 705 may be a material capable of supplying oxygen to the oxide 704 or a material capable of supplying impurities such as hydrogen or nitrogen to the oxide 704. When an oxide that contains hydrogen and nitrogen as little as possible is used as the insulator 705, oxygen can be supplied to the oxide 704 in some cases. By supplying oxygen to the oxide 704, impurities such as hydrogen and water contained in the oxide 704 can be removed and the oxide 704 is highly purified. When an oxide in which impurities are reduced as much as possible is used as the oxide 704, the transistors, the memory cell, and the semiconductor device including the transistors and the memory cell can have high reliability.

When an oxide containing hydrogen and nitrogen is used as the insulator 705, hydrogen and nitrogen can be supplied to the oxide 704 in some cases. When hydrogen and nitrogen are supplied to the oxide 704, the resistance of the oxide 704 might be decreased. The resistance of the oxide 704 is decreased such that it does not hinder the circuit operation, whereby the transistors and the memory cell can operate with lower driving voltage. Furthermore, high current drive capability in the on state of the transistors and the memory cell, i.e., high on-state current and high field-effect mobility can be obtained.

For the insulator 708, a material similar to that of the insulator 703a or the insulator 703c can be used. It is preferable to use different materials for the insulator 708 and the insulator 705. For example, aluminum oxide, silicon nitride, or hafnium oxide is preferably used for the insulator 705, and silicon oxide or silicon oxynitride is preferably used for the insulator 708. With this structure, when processing for forming an opening where the insulator 740 and the conductor 742 are to be formed is performed on the insulator 708 by a dry etching method, a difference in etching rate (selectivity ratio) between the insulator 705 and the insulator 708 is utilized, which enables formation of the opening in a self-aligned manner.

The oxide 704, the insulators 703, and the conductor 701 (any one of the conductor 701_1 to the conductor 701_$m$) form the memory cell 114. FIG. 1 illustrates an example of stacking m (m is a natural number greater than or equal to 2) layers of memory cells 114.

The conductors 707 are electrically connected to the oxide 704 and function as part of the source line SL or part of the bit line BL. As the conductors 707, a conductive material containing a metal element is preferably used. A metal compound layer containing the metal element contained in the conductors 707 and the component of the oxide 704 is preferably formed at the interface between the conductors 707 and the oxide 704. Formation of the metal compound is preferable because the contact resistance between the conductors 707 and the oxide 704 can be reduced. Alternatively, oxygen contained in the oxide 704 is absorbed by the conductors 707 and the resistance of the oxide 704 in the vicinity of the interface between the conductors 707 and the oxide 704 is reduced, whereby the contact resistance between the conductors 707 and the oxide 704 can be reduced.

It is preferable to use a conductive material containing one or more metal elements selected from aluminum, ruthenium, titanium, tantalum, chromium, tungsten, and copper as the conductors 707. Alternatively, a conductive material containing the above-described metal element and nitrogen may be used.

As illustrated in FIG. 1(B), the conductor 706 electrically connects the oxide 704 electrically connected to the conductor 707b which serves as part of the bit line BL to the oxide 704 electrically connected to the conductor 707a which serves as part of the source line SL, so that the memory string 112 is formed.

For the conductor 706, a material similar to that of the conductors 707 can be used. As the conductor 706, a material that is the same as or different from that of the conductors 707 may be used.

A metal compound layer containing the metal element contained in the conductor 706 and the component of the oxide 704 is preferably formed at the interface between the conductor 706 and the oxide 704. Formation of the metal compound is preferable because the contact resistance between the conductor 706 and the oxide 704 can be reduced. Alternatively, oxygen contained in the oxide 704 is absorbed by the conductor 706 and the resistance of the oxide 704 in the vicinity of the interface between the conductor 706 and the oxide 704 is reduced, whereby the contact resistance between the conductor 706 and the oxide 704 can be reduced.

For the insulating film 721, the insulating film 724, the insulating film 726, the insulating film 728, and the insulating film 729 functioning as interlayer films, a material having a low dielectric constant is preferably used. When a material having a low dielectric constant is used for an interlayer film, the parasitic capacitance generated between wirings can be reduced.

For example, as the insulating film 721, the insulating film 724, the insulating film 726, the insulating film 728, and the insulating film 729, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), $(Ba,Sr)TiO_3$ (BST), or the like can be used. In addition, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. A layer of silicon oxide, silicon oxynitride, or silicon nitride may be stacked over the insulators.

The conductor 742 functions as the second gate electrodes of the selection transistor 116a and the selection transistor 116b. For the conductor 742, a material similar to that of the conductors 701 can be used. Other than the single-layer conductive film, a stacked-layer structure formed of two or more layers may also be used. For example, as the conductive film to be the conductor 742, after a titanium nitride film is formed by an ALD method, a tungsten film may be formed by a CVD method.

The insulator 740 functions as the second gate insulating film of the selection transistor 116a and the selection transistor 116b. For the insulator 740, a material similar to that of the insulator 708 can be used.

The second gate electrode provided in the selection transistor 116a and the selection transistor 116b can improve the controllability of the threshold voltage of the transistors. Accordingly, the controllability of the on state or the off state of the memory string 112 can be improved; thus, the transistors and the semiconductor device including the transistors can have high reliability.

<<Metal Oxide>>

A metal oxide that can be used for the oxide 704 of the present invention will be described below.

The metal oxide preferably contains at least indium or zinc. In particular, indium and zinc are preferably contained. Aluminum, gallium, yttrium, tin, or the like is preferably contained in addition to them. One kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide, which contains indium, an element M, and zinc, is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M in some cases.

Note that in this specification and the like, a metal oxide containing nitrogen is also collectively referred to as a metal oxide in some cases. A metal oxide containing nitrogen may be referred to as a metal oxynitride.

[Composition of Metal Oxide]

The composition of a CAC (Cloud-Aligned Composite)-OS that can be used in the transistor disclosed in one embodiment of the present invention will be described below.

In this specification and the like, CAAC (c-axis aligned crystal) and CAC is sometimes stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize both of the functions.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm, are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as a grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and highly reliable.

In the nc-OS, a microscopic region (for example, a region greater than or equal to 1 nm and less than or equal to 10 nm, in particular, a region greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more kinds selected from the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the metal oxide is used in a channel formation region of a transistor will be described.

When the metal oxide is used in a channel formation region of a transistor, the transistor having high field-effect mobility can be achieved. In addition, the transistor having high reliability can be achieved.

Furthermore, a metal oxide with a low carrier density is preferably used in the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}/\text{cm}^3$, preferably lower than $1 \times 10^{11}/\text{cm}^3$, and further preferably lower than $1 \times 10^{10}/\text{cm}^3$, and higher than or equal to $1 \times 10^{-9}/\text{cm}^3$.

Moreover, a highly purified intrinsic or substantially highly purified intrinsic metal oxide film has a low density of defect states and accordingly may have a low density of trap states.

Charge trapped by the trap states in the metal oxide takes a long time to be released and behaves like fixed charge in some cases. Thus, a transistor having a metal oxide with high density of trap states in a channel formation region has unstable electrical characteristics in some cases.

Thus, it is effective to reduce the concentration of impurities in the metal oxide to make the electrical characteristics of the transistor stable. In addition, in order to reduce the concentration of impurities in the metal oxide, the concentration of impurities in an adjacent film is also preferably reduced. As an impurity, hydrogen, nitrogen, an alkali metal, an alkaline earth metal, iron, nickel, silicon, and the like can be given.

[Impurity]

Here, the influence of each impurity in the metal oxide will be described.

When silicon or carbon that is one of the Group 14 elements is contained in the metal oxide, defect states are formed in the metal oxide. Thus, the concentration of silicon or carbon in the metal oxide and the concentration of silicon or carbon around an interface with the metal oxide (the concentration measured by secondary ion mass spectrometry (SIMS)) are set to be lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor using, in a channel formation region, a metal oxide containing an alkali metal or alkaline earth metal is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide measured by SIMS is set to be lower than or equal to $1\times10^{18}$ atoms/cm$^3$, preferably lower than or equal to $2\times10^{16}$ atoms/cm$^3$.

Furthermore, when the metal oxide contains nitrogen, the metal oxide easily becomes n-type because of generation of electrons serving as carriers and an increase in carrier density. As a result, a transistor in which a metal oxide containing nitrogen is used in a channel formation region is likely to have normally-on characteristics. Thus, nitrogen in the channel formation region in the metal oxide is preferably reduced as much as possible. For example, the concentration of nitrogen in the metal oxide, which is measured by SIMS, is set to be lower than $5\times10^{19}$ atoms/cm$^3$, preferably lower than or equal to $5\times10^{18}$ atoms/cm$^3$, further preferably lower than or equal to $1\times10^{18}$ atom/cm$^3$, still further preferably lower than or equal to $5\times10^{17}$ atoms/cm$^3$.

Furthermore, hydrogen contained in a metal oxide reacts with oxygen bonded to a metal atom to become water, and thus forms an oxygen vacancy, in some cases. Entry of hydrogen into the oxygen vacancy generates an electron serving as a carrier in some cases. Furthermore, in some cases, part of hydrogen is bonded to oxygen which is bonded to a metal atom, whereby an electron serving as a carrier is generated. Thus, a transistor using, in a channel formation region, a metal oxide containing hydrogen is likely to have normally-on characteristics. Therefore, hydrogen in the metal oxide is preferably reduced as much as possible. Specifically, the hydrogen concentration of the metal oxide, which is measured by SIMS, is set to be lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide whose impurities are sufficiently reduced is used in a channel formation region of a transistor, the off-state current of the transistor can be reduced and stable electrical characteristics can be provided.

<Manufacturing Method of Semiconductor Device>

Next, an embodiment of a manufacturing method of a semiconductor device of one embodiment of the present invention will be described with reference to FIG. 2 to FIG. 24. Note that in each drawing of FIG. 2 to FIG. 24, (A) is a top view seen from the z-axis direction. In addition, (B) is a cross-sectional view of a portion indicated by a dashed-dotted line A1-A2 in (A). Furthermore, (C) is a cross-sectional view of a portion indicated by a dashed-dotted line A3-A4 in (A).

Figure 2A:
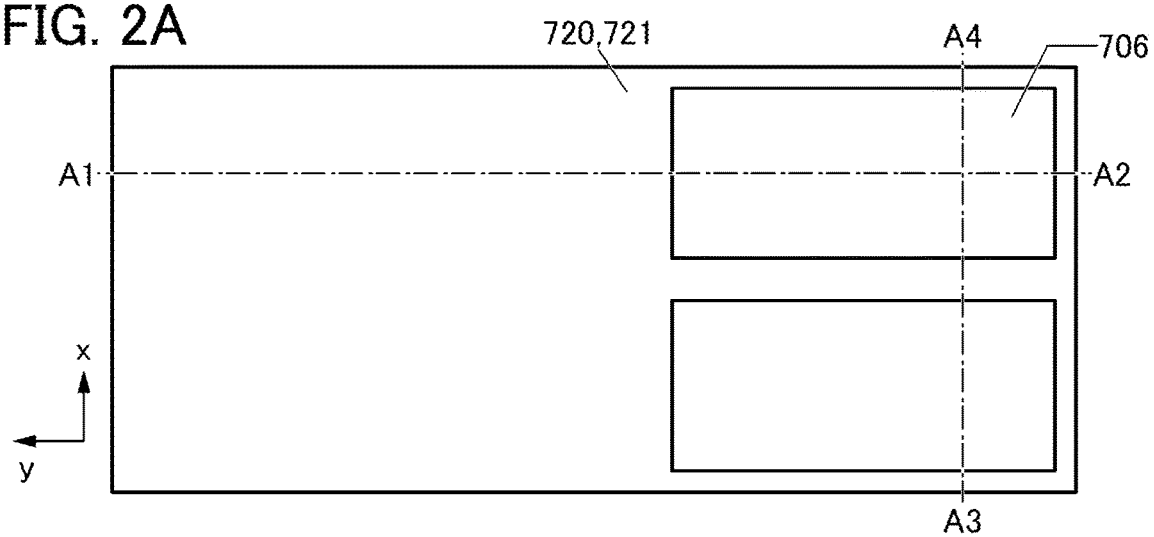
FIGS. 2A-2C Views illustrating a manufacturing method of a semiconductor device of one embodiment of the present invention.
Figure 2B:
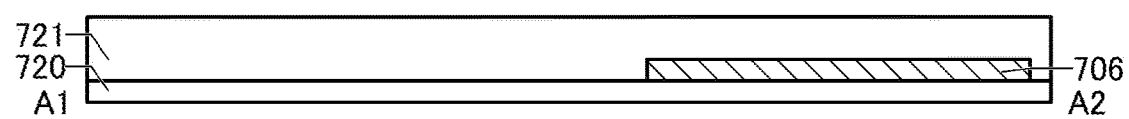
Figure 2C:
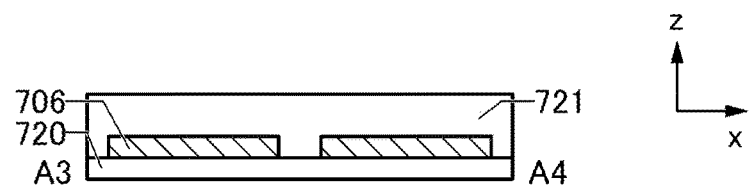
Figure 3A:
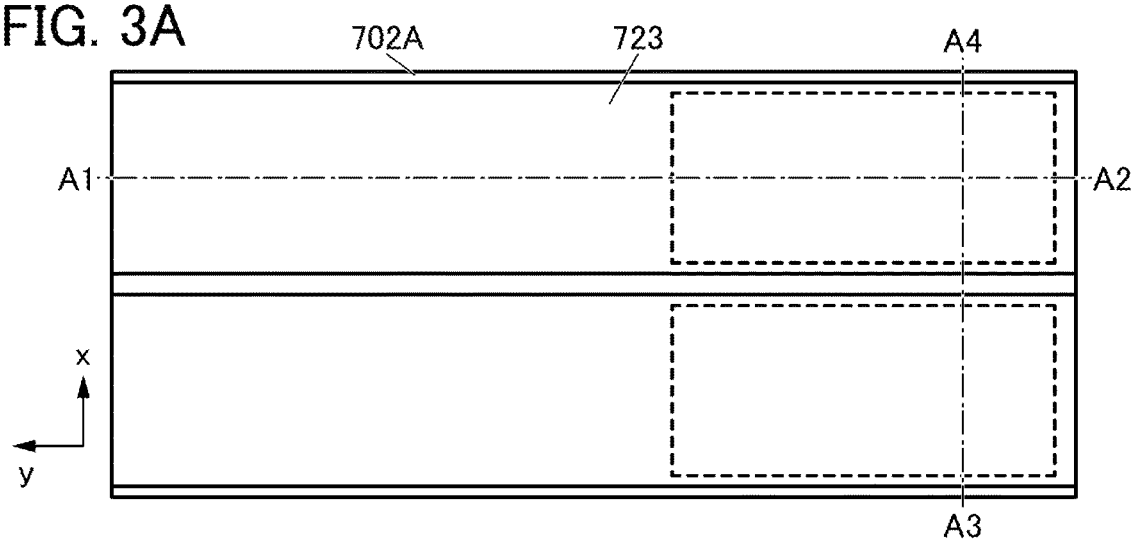
FIGS. 3A-3C Views illustrating a manufacturing method of a semiconductor device of one embodiment of the present invention.
Figure 3B:
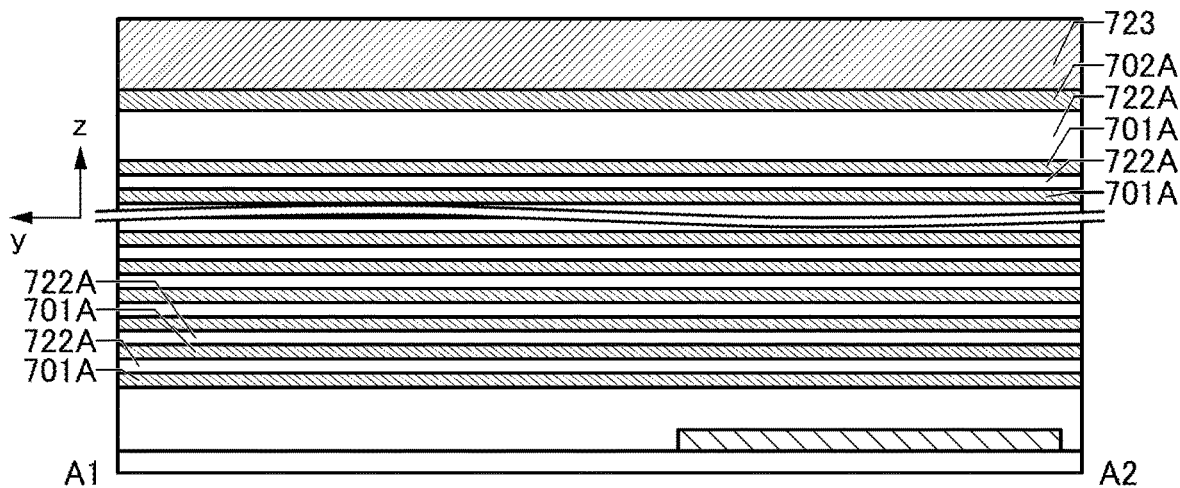
Figure 3C:
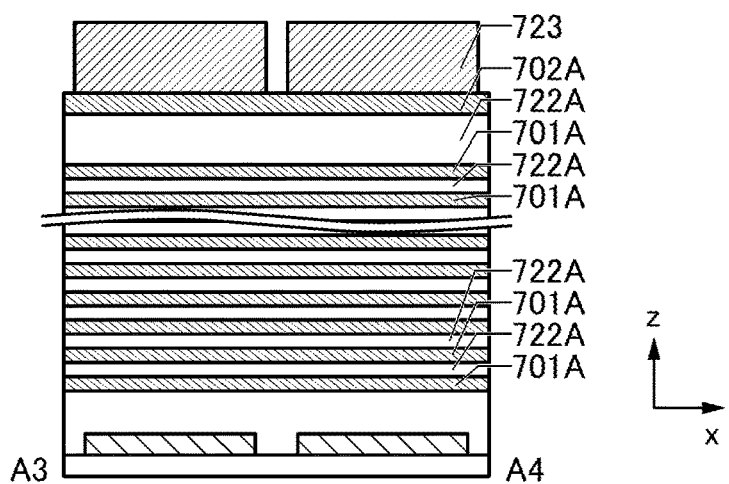
Figure 4A:
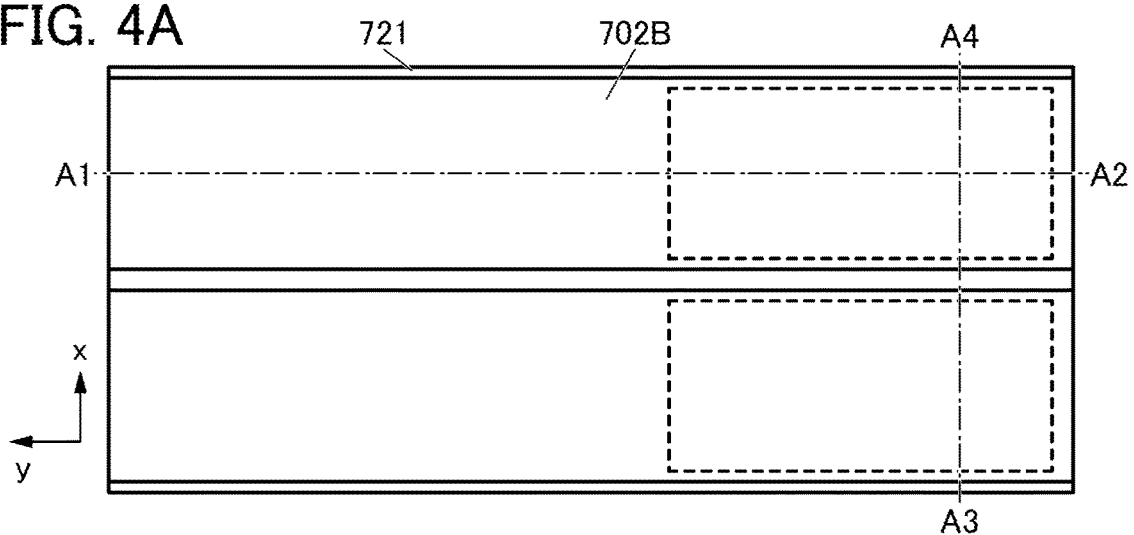
FIGS. 4A-4C Views illustrating a manufacturing method of a semiconductor device of one embodiment of the present invention.
Figure 4B:
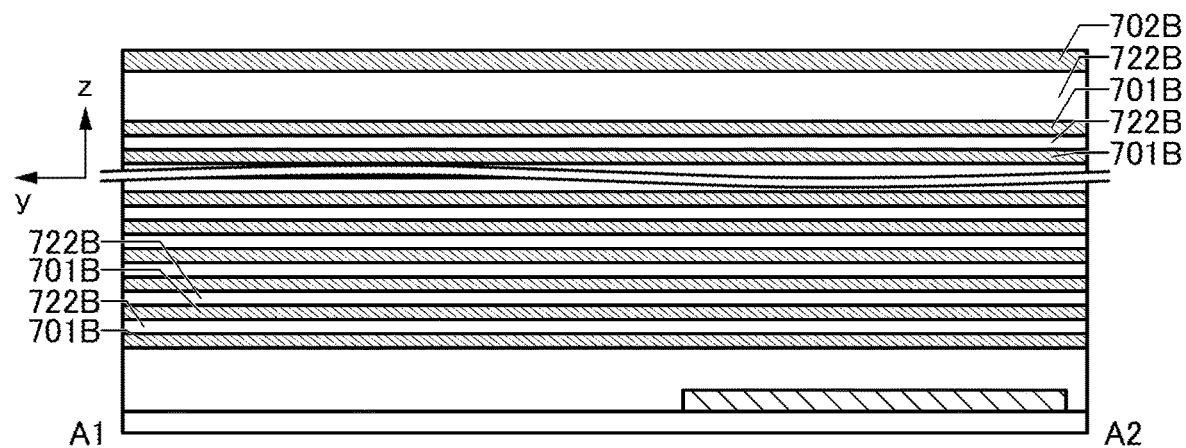
Figure 4C:
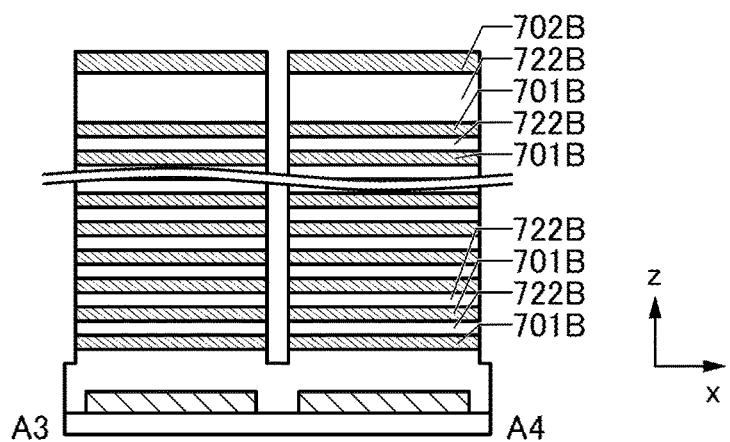

First, the conductor 706 is formed over the base 720 having an insulating surface, and the insulating film 721 is formed to cover the conductor 706 (see FIG. 2).

The conductor 706 can be formed in such a manner that a conductive film to be the conductor 706 is formed and processed by a lithography method. Note that the formation method of the conductor 706 and the insulating film 721 is not limited to this. The insulating film 721 may be formed over the base 720 and an unnecessary portion of the insulating film 721 may be removed to form a groove or an opening, and the conductor 706 may be formed to be embedded in the groove or the opening. Such a formation method of a conductor is referred to as a damascene method (a single damascene method or a dual damascene method) in some cases. When an insulating film is further formed over the conductor 706 formed by the damascene method and the insulating film 721, the structure illustrated in FIG. 2 can be obtained.

The conductor 706 and the insulating film 721 can be formed by a sputtering method, a CVD method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

A plasma CVD method is a film formation method which can provide a high-quality film at a relatively low temperature. Furthermore, a thermal CVD method is a film formation method that does not use plasma and thus enables less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, such plasma damage is not caused in the case of using a thermal CVD method that does not use plasma, and thus the yield of a semiconductor device can be increased. In addition, a thermal CVD method does not cause plasma damage during deposition, so that a film with few defects can be obtained.

An ALD method is also a film formation method which enables less plasma damage to an object. An ALD method also does not cause plasma damage during deposition, so that a film with few defects can be obtained.

Unlike in a deposition method in which particles ejected from a target or the like are deposited, a CVD method and an ALD method are deposition methods in which a film is formed by reaction at a surface of an object. Thus, a CVD method and an ALD method are deposition methods that are less likely to be influenced by the shape of an object and thus have favorable step coverage. In particular, an ALD method has excellent step coverage and excellent thickness uniformity, and thus is suitable for the case of covering a surface of an opening having a high aspect ratio, for example. On the other hand, an ALD method has a relatively low deposition rate, and thus is preferably used in combination with another deposition method with a high deposition rate such as a CVD method, in some cases.

A CVD method and an ALD method enable control of the composition of a film to be obtained with a flow rate ratio of source gases. For example, by a CVD method and an ALD method, a film with a desired composition can be deposited by adjusting the flow rate ratio of source gases. Moreover, by a CVD method and an ALD method, by changing the flow rate ratio of source gases during the deposition, a film whose composition is continuously changed can be deposited. In the case of depositing a film while changing the flow rate ratio of source gases, as compared with the case of depositing a film with the use of a plurality of deposition chambers, the time taken for the film deposition can be shortened because the time taken for transfer and pressure adjustment is omitted. Thus, productivity of semiconductor devices can be improved in some cases.

Note that in the lithography method, first, a resist is exposed to light through a photomask. Next, a region exposed to light is removed or left using a developing solution, so that a resist mask is formed. Then, etching treatment through the resist mask is performed, so that a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. Furthermore, an electron beam or an ion beam may be used instead of the above-described light. Note that a mask is not necessary in the case of using an electron beam or an ion beam. Note that the resist mask can be removed by a process of performing dry etching treatment such as ashing, performing wet etching treatment, performing wet etching treatment after dry etching treatment, or performing dry etching treatment after wet etching treatment, for example.

A hard mask formed of an insulator or a conductor may be used instead of the resist mask. In the case where a hard mask is used, a hard mask with a desired shape can be formed by forming an insulating film or a conductive film serving as the hard mask material over the film, forming a resist mask thereover, and then etching the hard mask material.

For the processing, a dry etching method or a wet etching method can be employed. The processing by a dry etching method is suitable for microfabrication.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency powers with the same frequency are applied to the parallel plate type electrodes. Alternatively, a structure may be employed in which high-frequency powers with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

In the case where a hard mask is used for etching of the film, the etching treatment may be performed after the resist mask used for formation of the hard mask is removed or with the resist mask left. In the latter case, the resist mask disappears during the etching in some cases. The hard mask may be removed by etching after the etching of the film. The hard mask does not need to be removed in the case where the hard mask material does not affect the following process or can be utilized in the following process.

As the conductive film to be the conductor 706, a conductive film containing a metal element is preferably formed by a sputtering method. Alternatively, the conductive film can be formed by a CVD method.

A surface of the insulating film 721 is preferably subjected to planarization treatment as needed. As the planarization treatment, a chemical mechanical polishing (CMP) method or a reflow method can be employed.

Conductive films 701A and conductive films 722A are alternately stacked over the insulating film 721. Note that in this embodiment, an example in which m (m is a natural number greater than or equal to 2) layers of conductive films 701A and 722A are formed is described. Furthermore, an example in which the conductive films 701A are formed over the insulating film 721 and the conductive films 722A are formed over the conductive films 701A is illustrated in this embodiment; however, the film formation order is not limited thereto. The conductive films 722A may be formed over the insulating film 721, and the conductive films 701A may be formed over the conductive films 722A. For the formation of the conductive films 701A and the conductive films 722A, a CVD method can be used. Alternatively, a sputtering method may be used.

A conductive film 702A is formed over the uppermost conductive film 722A. A mask 723 is formed over the conductive film 702A (see FIG. 3). The conductive film 702A can be formed using the same method and material as those of the conductive films 701A. Note that the conductive film 702A may be formed by the same method as or a method different from that of the conductive films 701A. As the conductive film 702A, a material that is the same as or different from that of the conductive films 701A may be used.

Next, the conductive film 702A, the conductive films 722A, the conductive films 701A, and the insulating film 721 are processed using the mask 723, so that conductive films 702B, insulating films 722B, and conductive films 701B are formed. By the processing, the conductive film 702A can be divided into a plurality of conductive films 702B, and each of the conductive films 701A can be divided into a plurality of conductive films 701B. Then, the mask 723 is removed (see FIG. 4).

Next, the insulating film 724 is formed so as to fill a portion removed by the processing of the conductive film 702A, the conductive films 722A, the conductive films 701A, and the insulating film 721. The insulating film 724 can be formed by a CVD method or an ALD method. It is particularly preferable to employ an ALD method because it can form a film with a uniform thickness even in a groove or an opening having a high aspect ratio. Alternatively, the insulating film 724 may be formed by a combination of an ALD method and a CVD method. The insulating film 724 is preferably subjected to planarization treatment by a CMP method or a reflow method. In the case where the planarization treatment is performed by a CMP method, the insulating film 724 may be polished so that a surface of the conductive film 702B is exposed.

Figure 5A:
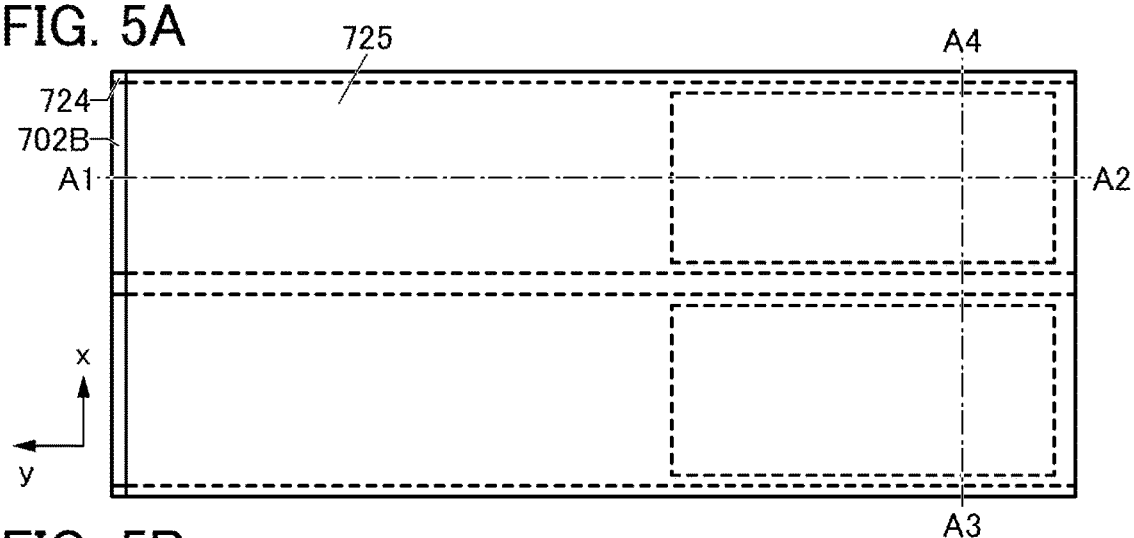
FIGS. 5A-5C Views illustrating a manufacturing method of a semiconductor device of one embodiment of the present invention.
Figure 5B:
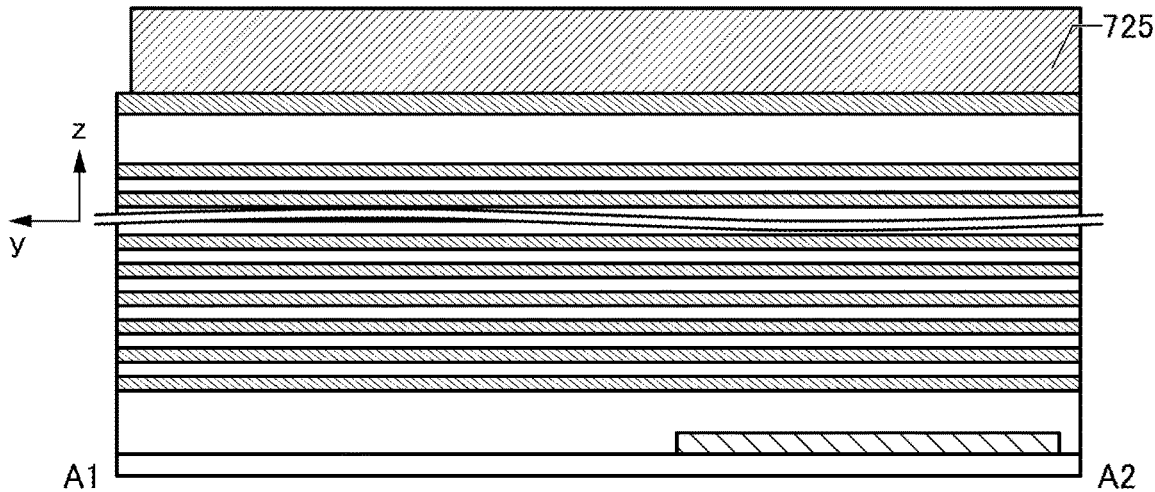
Figure 5C:
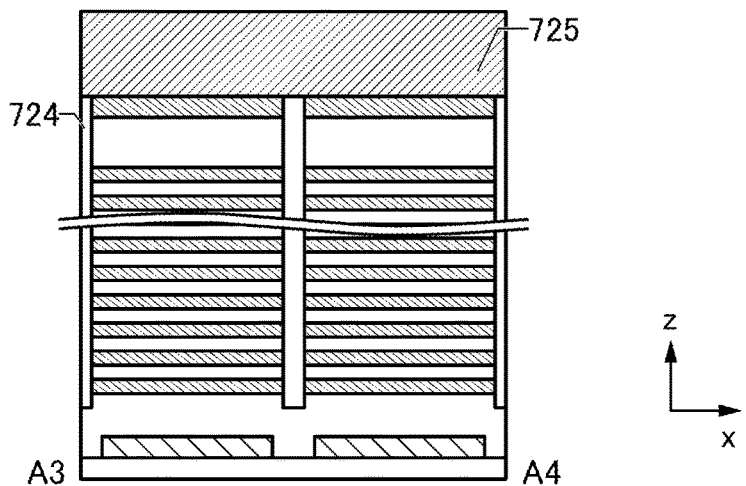

Next, a mask 725 is formed over the conductive films 702B and the insulating film 724 (see FIG. 5).

Figure 6A:
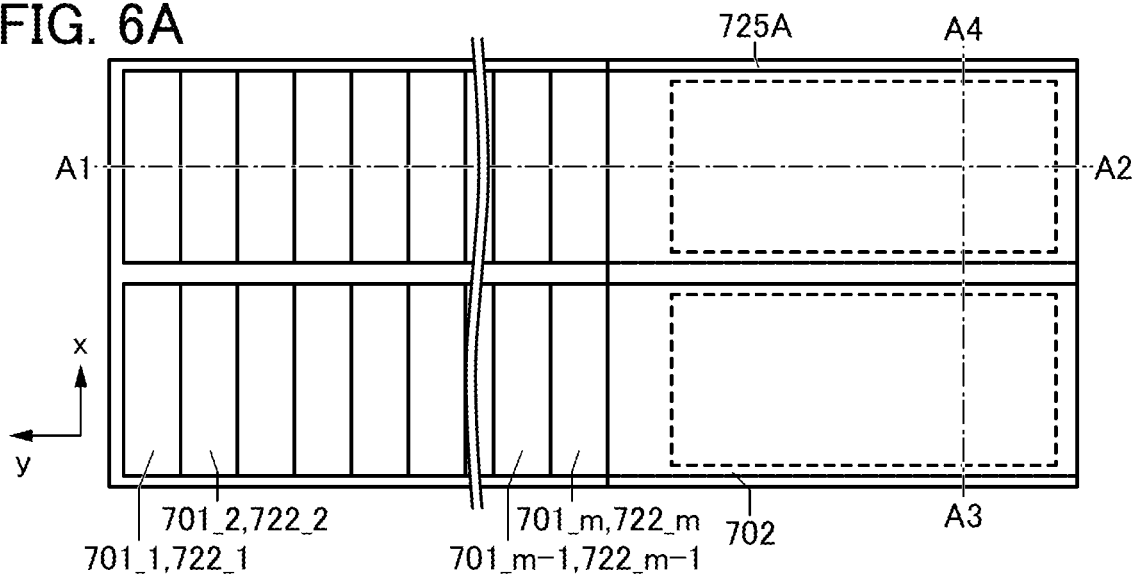
FIGS. 6A-6C Views illustrating a manufacturing method of a semiconductor device of one embodiment of the present invention.
Figure 6B:
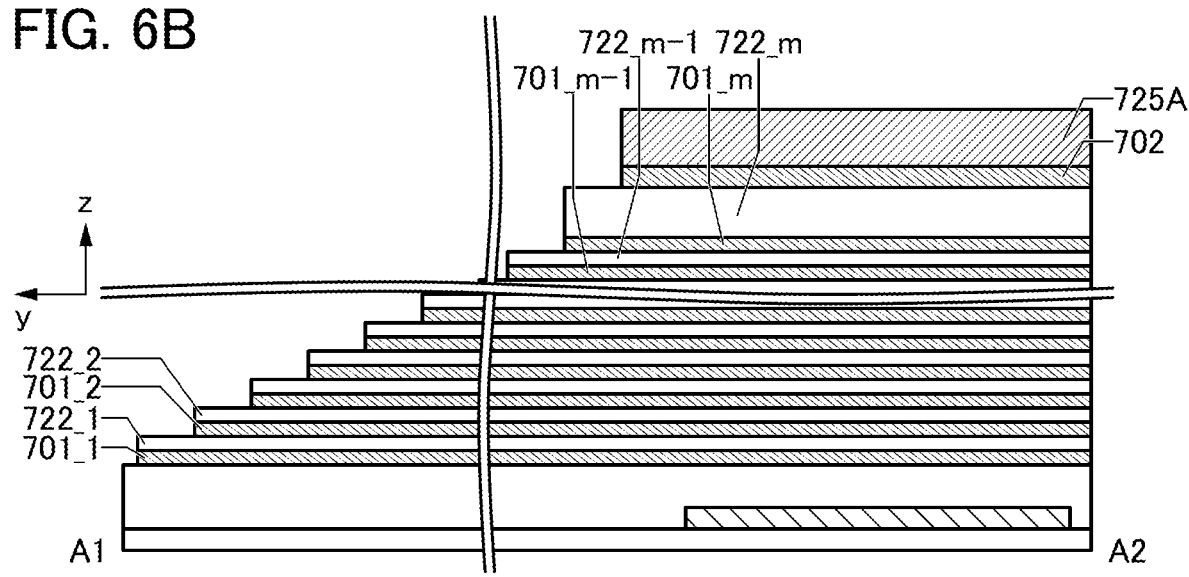
Figure 6C:
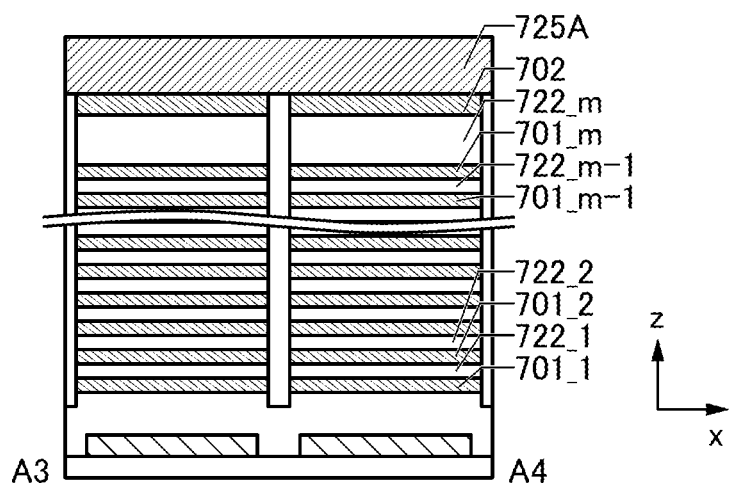

Next, the conductive films 702B, the insulating films 722B, the conductive films 701B, and the insulating film 724 are processed to form the conductors 701 (the conductor 701_1 to the conductor 701_*m*), the insulators 722 (the insulator 722_1 to the insulator 722_*m*), and the conductor 702 which have a step-like shape as illustrated in FIG. 6(B). In processing the conductive films 701B, the insulating films 722B, and the conductive films 702B, etching of the conductive films 701B, the insulating films 722B, and the conductive films 702B and slimming of the mask 725 are alternately conducted to form the conductors 701, the insulators 722, and the conductor 702 having a step-like shape. By the processing of the conductive films 701B, the insulating films 722B, and the conductive films 702B, the mask 725 is reduced in width and thickness to become a mask 725A (see FIG. 6).

Note that the formation method of the conductors 701, the insulators 722, and the conductor 702 having a step-like shape is not limited thereto. The conductors 701, the insulators 722, and the conductor 702 having a step-like shape may be formed using a tapered mask. Alternatively, patterning by a plurality of lithography steps may be employed to form the conductors 701, the insulators 722, and the conductor 702 having a step-like shape.

In this embodiment, an example in which the conductors 701, the insulators 722, and the conductor 702 having a step-like shape are formed so that side surfaces of the conductors 701 and side surfaces of the insulators 722 over the conductors 701 are substantially aligned is described; however, the formation method is not limited thereto. The conductors 701, the insulators 722, and the conductor 702 having a step-like shape may be formed so that the side surfaces of the insulators 722 and the side surfaces of the conductors 701 over the insulators 722 are substantially aligned.

Next, the mask 725A is removed, and the insulating film 726 is formed. The insulating film 726 can be formed by a CVD method. The insulating film 726 is preferably subjected to planarization treatment by a CMP method or a reflow method.

Figure 7A:
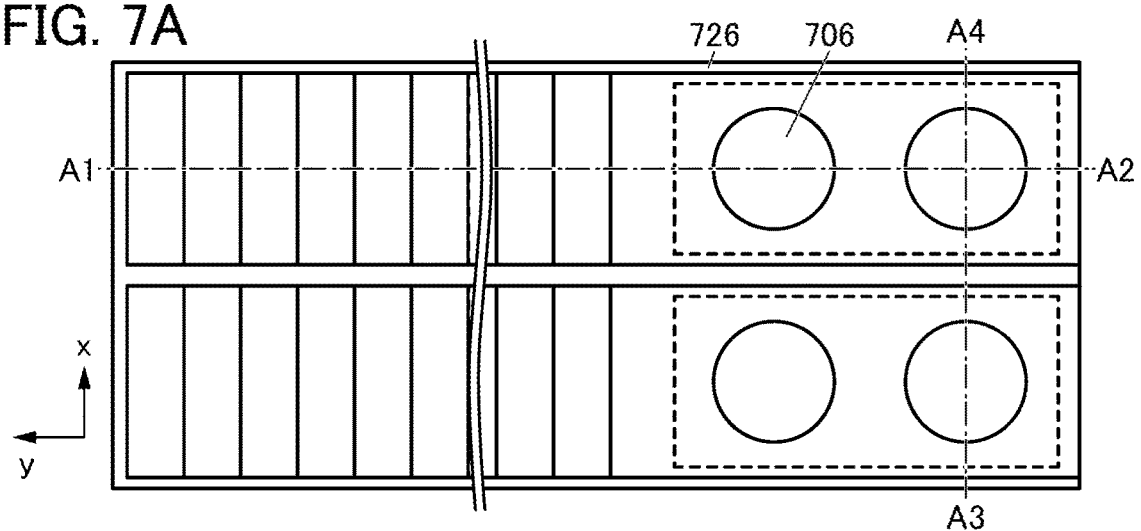
FIGS. 7A-7C Views illustrating a manufacturing method of a semiconductor device of one embodiment of the present invention.
Figure 7B:
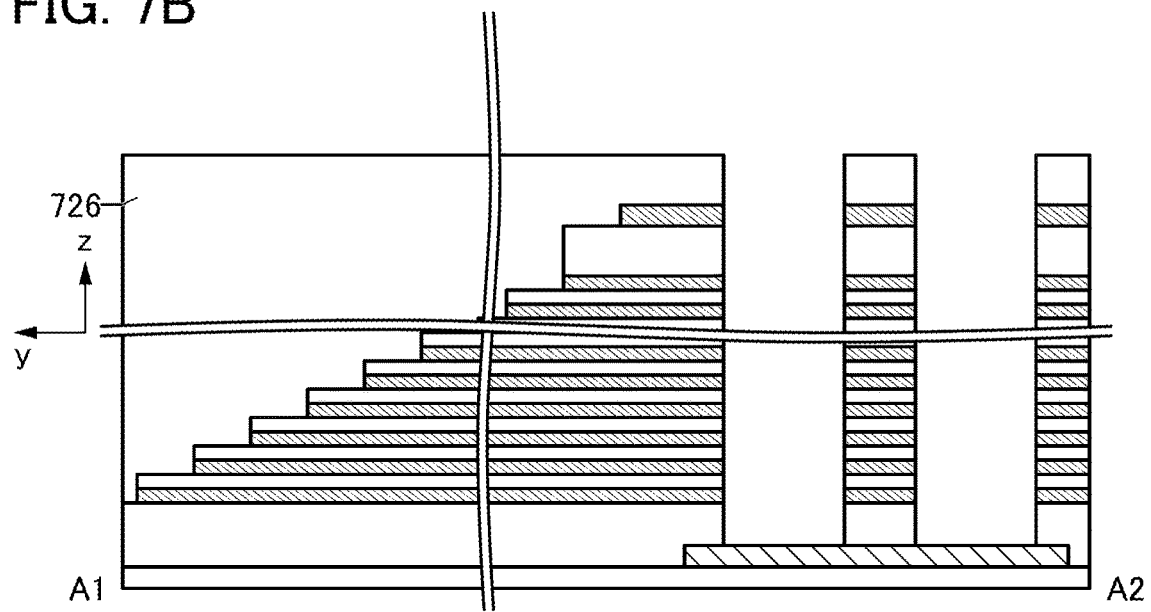
Figure 7C:
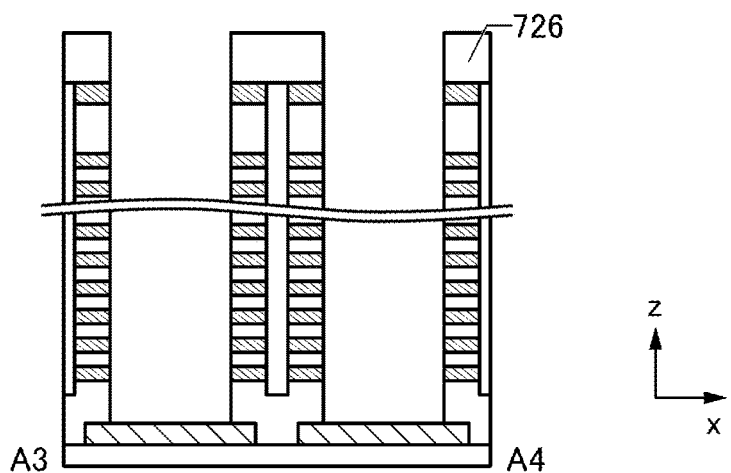

Next, the insulating film 726, the conductor 702, the insulators 722, the conductors 701, and the insulating film 721 are processed by a lithography method to form a first opening exposing the conductor 706 (see FIG. 7).

Figure 8A:
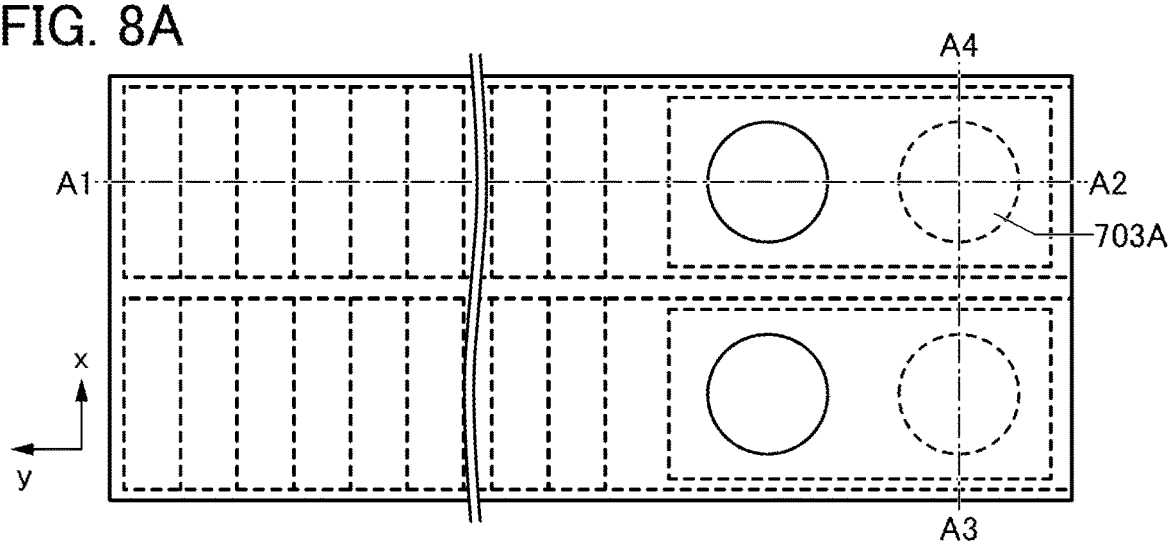
FIGS. 8A-8C Views illustrating a manufacturing method of a semiconductor device of one embodiment of the present invention.
Figure 8B:
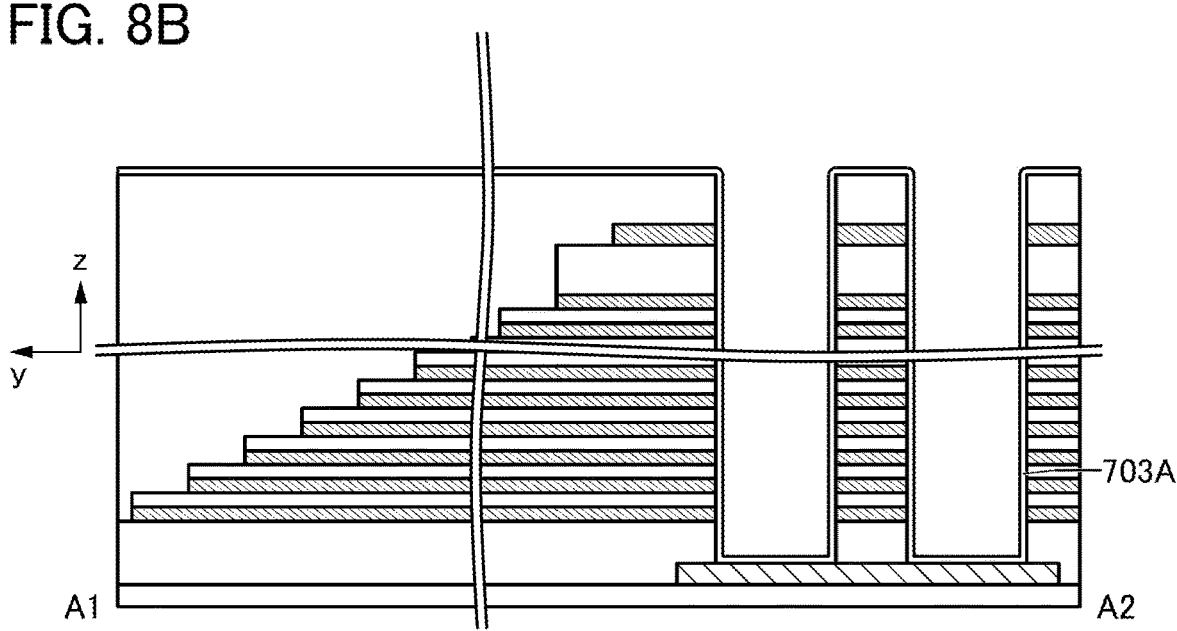
Figure 8C:
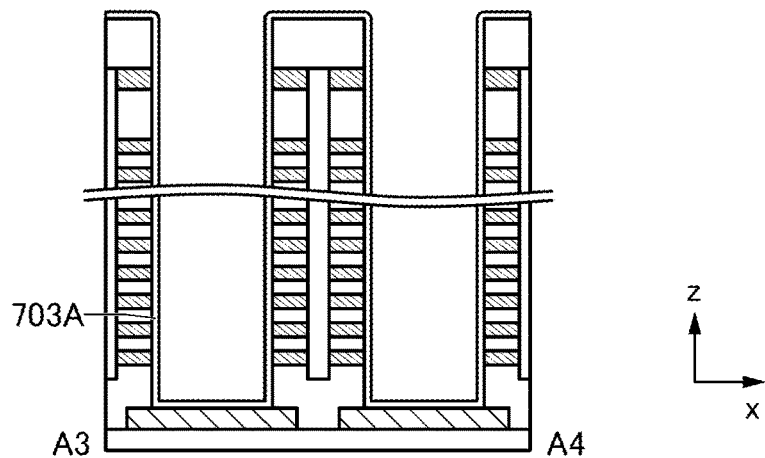
Figure 9A:
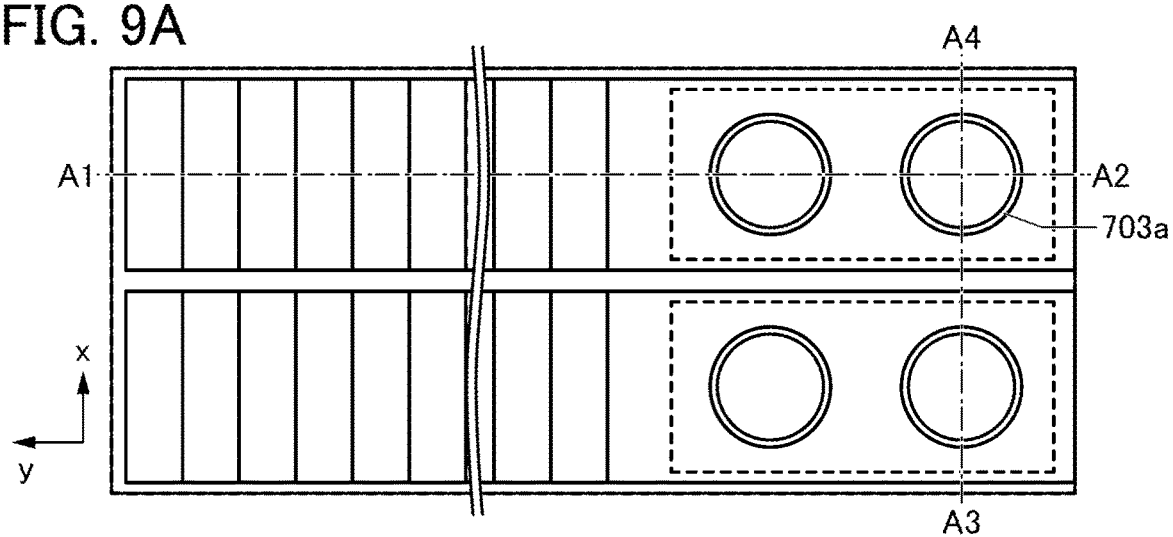
FIGS. 9A-9C Views illustrating a manufacturing method of a semiconductor device of one embodiment of the present invention.
Figure 9B:
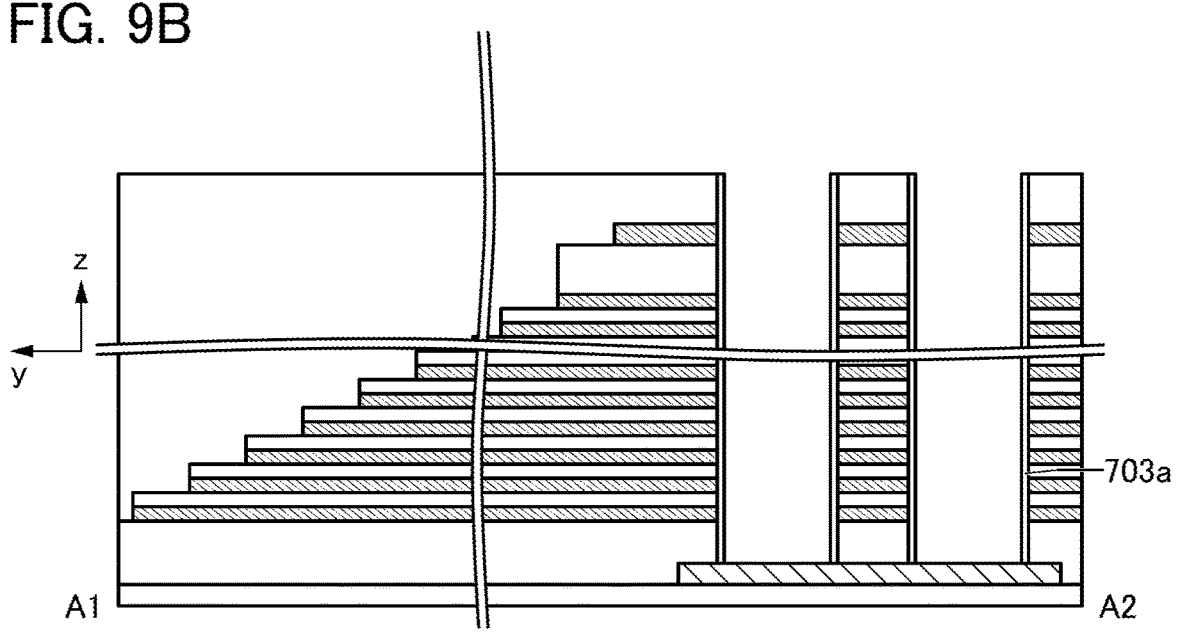
Figure 9C:
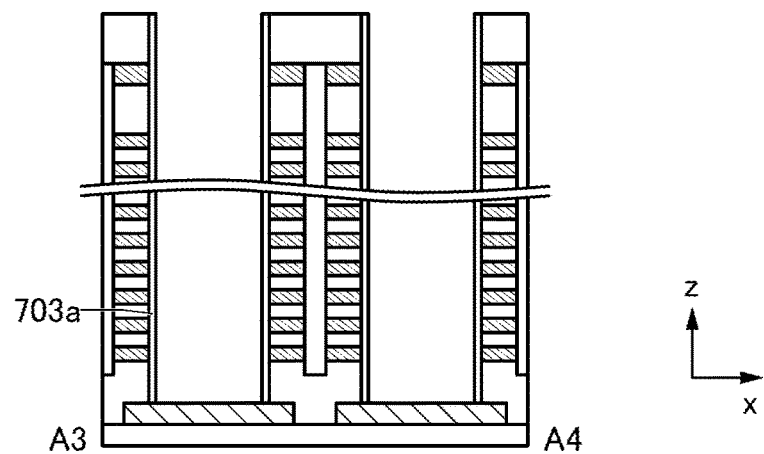

Next, an insulating film 703A to be the insulator 703*a* is formed over the insulating film 726 and inside the first opening (see FIG. 8). The insulating film 703A can be formed by a CVD method or an ALD method. It is particularly preferable to employ an ALD method because it can form a film with a uniform thickness even in a groove or an opening having a high aspect ratio. Alternatively, the insulating film 703A may be formed by a combination of an ALD method and a CVD method.

Then, the insulating film 703A formed on a bottom portion of the first opening is removed, so that the insulator 703*a* is formed. Anisotropic etching is preferably used to remove the insulating film 703A. Here, the insulating film 703A over the insulating film 726 is also removed; thus, the insulator 703*a* is provided only on a side wall of the first opening (see FIG. 9). The conductor 706 is exposed by removing the insulating film 703A on the bottom portion of the first opening. In addition, a top surface of the insulator 703*a* can be substantially level with a top surface of the insulating film 726.

Figure 10A:
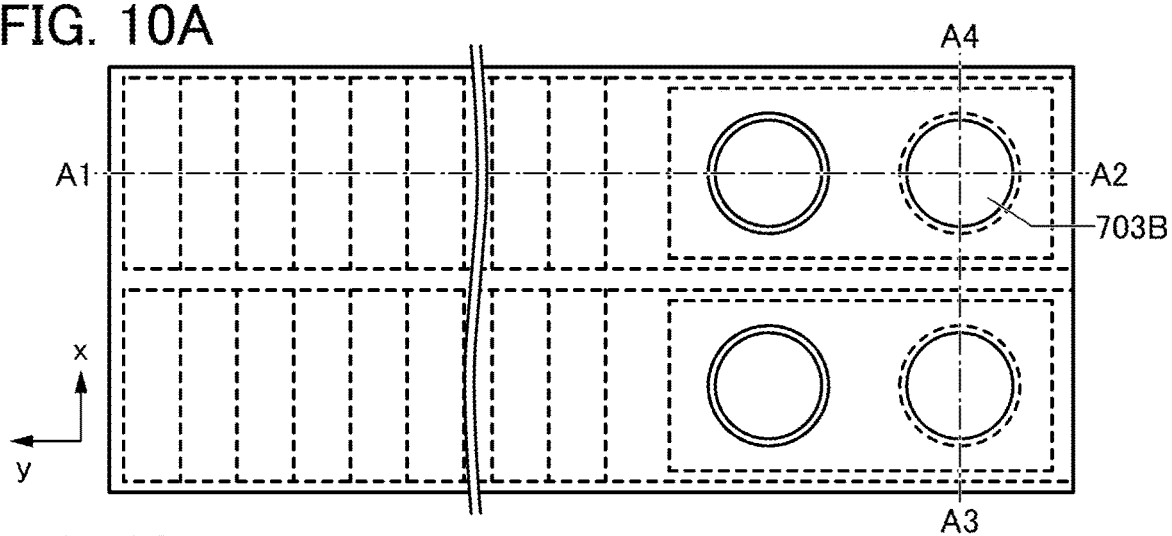
FIGS. 10A-10C Views illustrating a manufacturing method of a semiconductor device of one embodiment of the present invention.
Figure 10B:
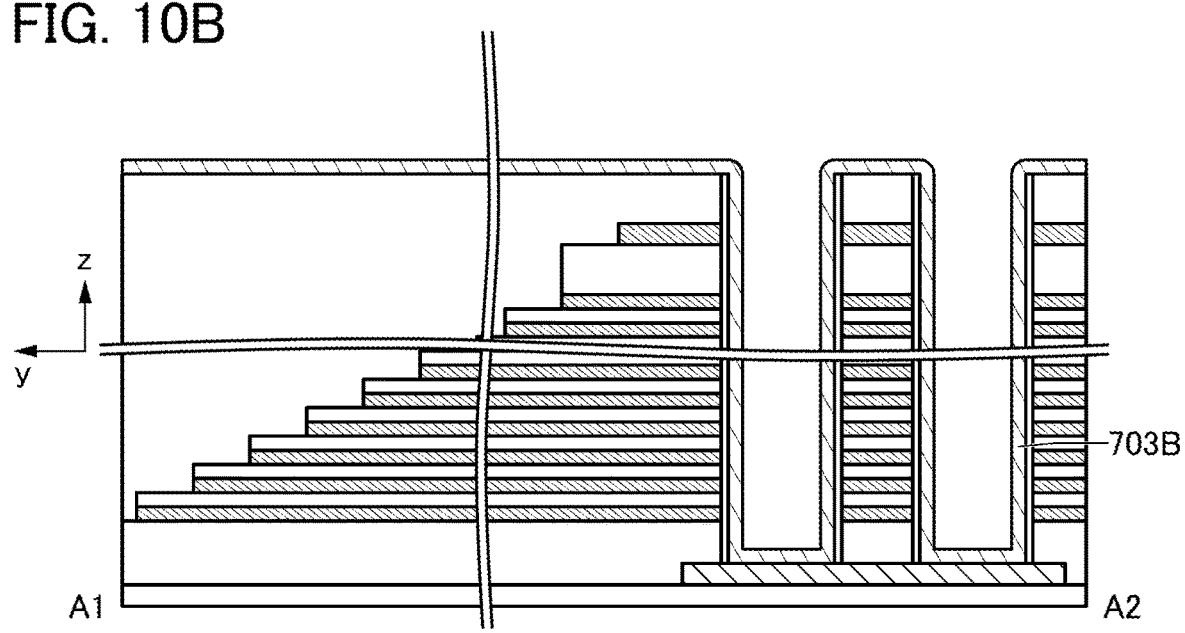
Figure 10C:
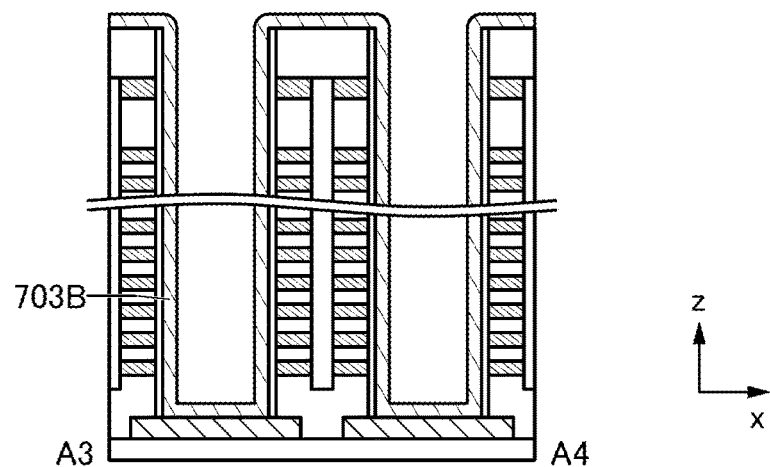

Next, an insulating film 703B to be the insulator 703*b* is formed over the insulating film 726 and inside the first opening (see FIG. 10). The insulating film 703B can be formed by a CVD method or an ALD method. It is particularly preferable to employ an ALD method because it can form a film with a uniform thickness even in a groove or an opening having a high aspect ratio. Alternatively, the insulating film 703B may be formed by a combination of an ALD method and a CVD method.

Then, the insulating film 703B formed on the bottom portion of the first opening is removed, so that the insulator 703*b* is formed. Anisotropic etching is preferably used to remove the insulating film 703B. Here, the insulating film 703B over the insulating film 726 is also removed; thus, the insulator 703*b* is provided only on the side wall of the first opening. The conductor 706 is exposed again by removing the insulating film 703B on the bottom portion of the first opening.

Figure 11A:
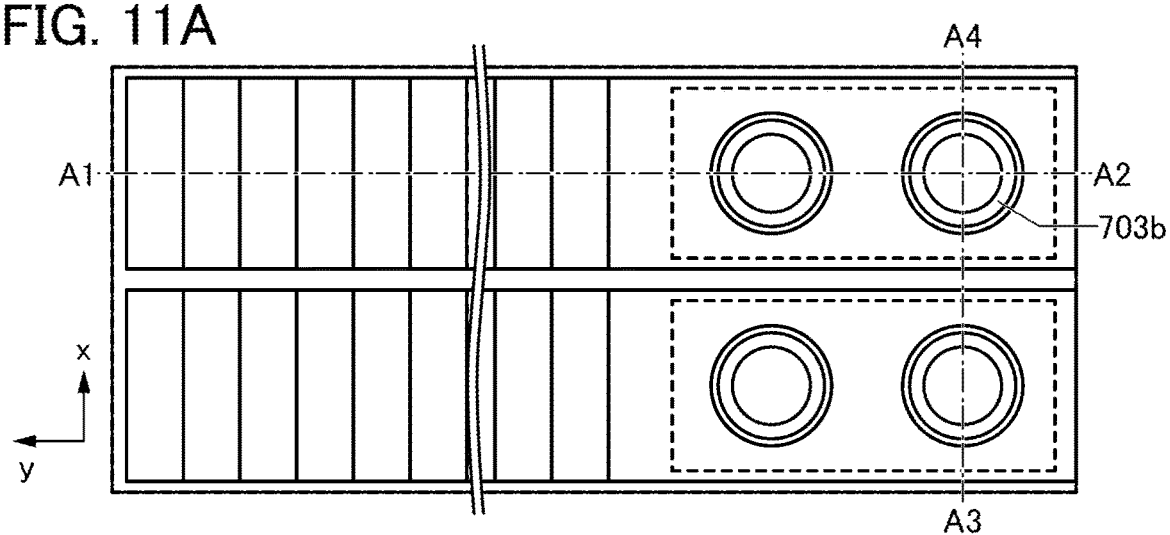
FIGS. 11A-11C Views illustrating a manufacturing method of a semiconductor device of one embodiment of the present invention.
Figure 11B:
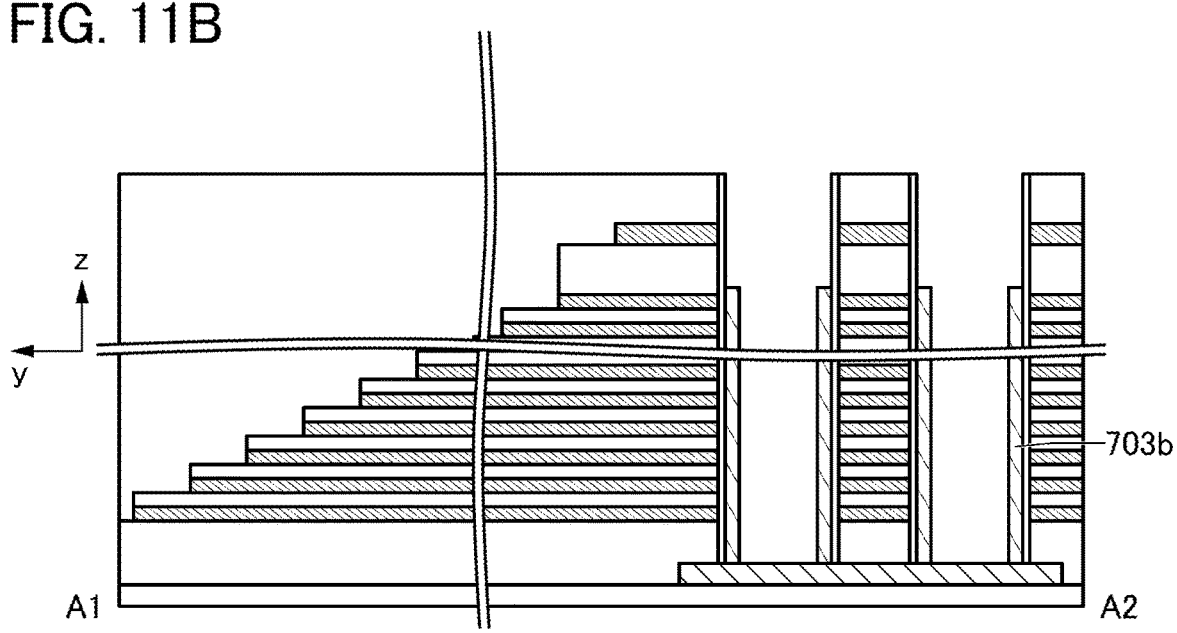
Figure 11C:
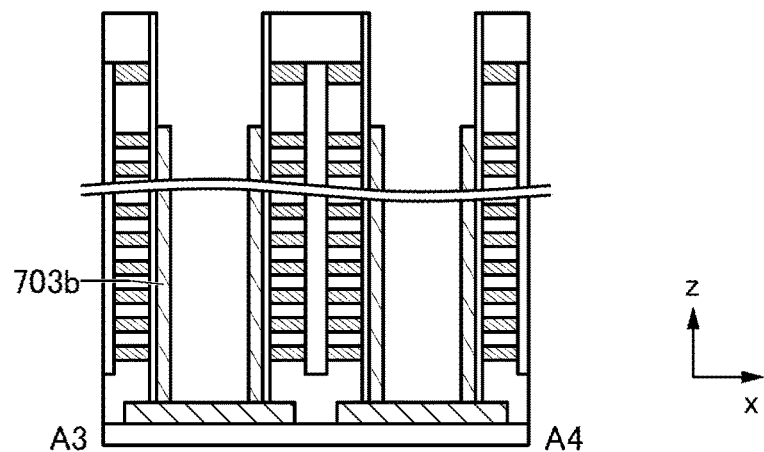

Next, the insulator 703*b* positioned in an upper portion of the first opening is removed (see FIG. 11). The insulator 703*b* is removed to a desired depth inside the first opening by, for example, anisotropic etching having a selectivity ratio to the insulating film 726, the insulator 703*a*, and the conductor 706. Furthermore, although not shown, after a material serving as a sacrificial layer that can be easily removed in a later process is embedded in the first opening and the sacrificial layer is removed to a desired depth inside the first opening, the insulator 703*b* may be removed by etching or the like using the sacrificial layer as a mask. Note that after the insulator 703*b* is removed, the material to be the sacrificial layer is removed. For example, the insulator 703*b* positioned in the upper portion of the first opening may be removed so that the height of the top surface of the insulator 703*b* is located at a height between the top surface of the conductor 701_*m* and the bottom surface of the conductor 702.

By the removal of part of the insulator 703*b* through the above steps, an insulator that is positioned in the horizontal direction (x-y direction) of the conductor 702 can be the insulator 703*a* and the insulator 703*c* which is formed in the later process. In this case, the gate insulating films of the selection transistors are formed of the insulator 703*a* and the insulator 703*c* which is formed in the later process. The insulator 703*b* functioning as the charge accumulation layer is not provided as the gate insulating films of the selection transistors; accordingly, a highly reliable memory cell array with reduced variations in electric characteristics of the selection transistors can be provided.

Note that without performing the above-described step of removing the insulator 703*b* positioned in the upper portion of the first opening, the top surface of the insulator 703*b* may be substantially level with the top surface of the insulating film 726. In this case, the insulator positioned in the horizontal direction (x-y direction) of the conductor 702 is the insulator 703*a*, the insulator 703*b*, and the insulator 703*c* which is formed in the later process. In this case, the gate insulating films of the selection transistors are formed of the insulator 703*a*, the insulator 703*b*, and the insulator 703*c* which is formed in the later process.

Figure 12A:
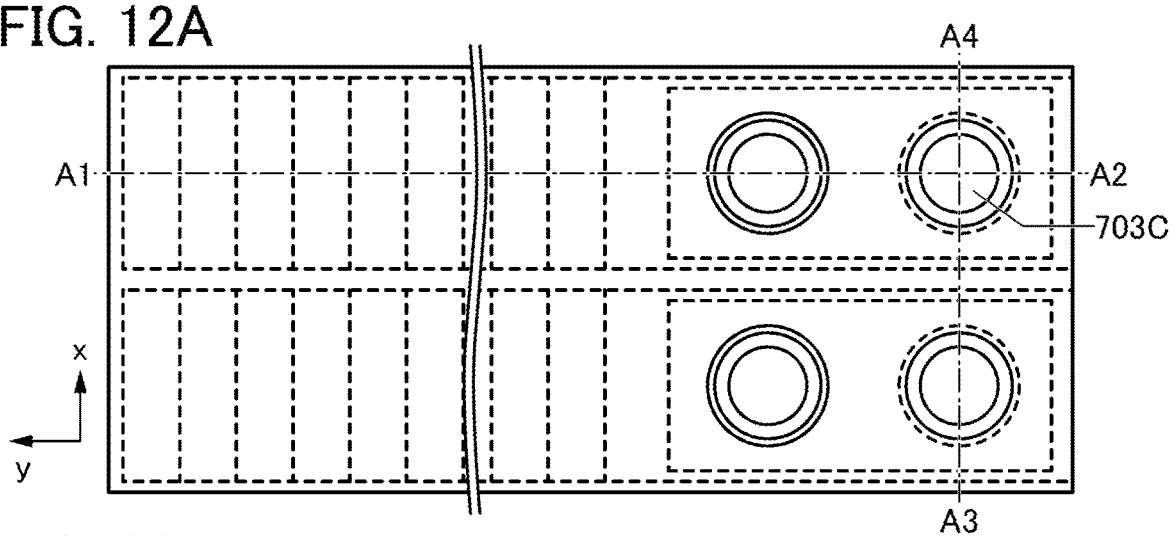
FIGS. 12A-12C Views illustrating a manufacturing method of a semiconductor device of one embodiment of the present invention.
Figure 12B:
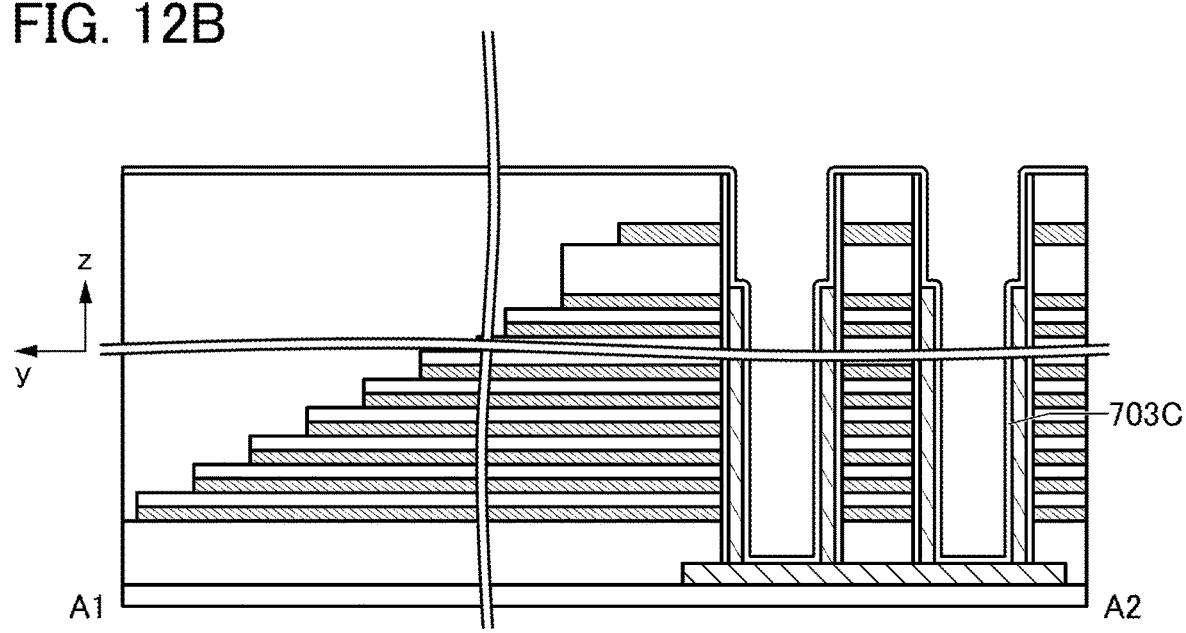
Figure 12C:
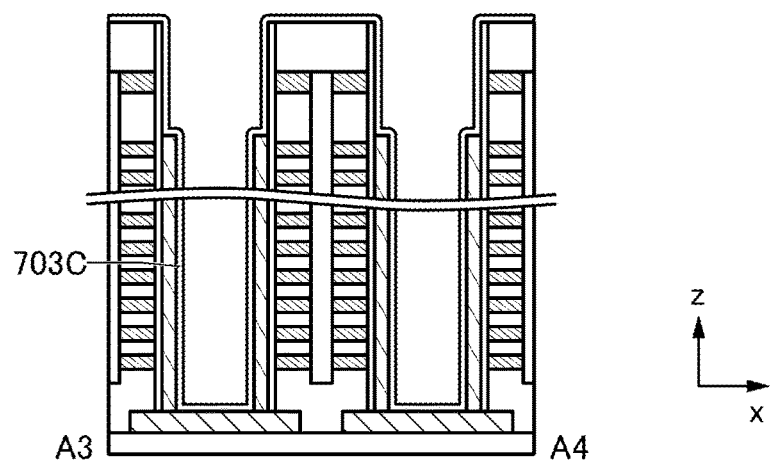
Figure 13A:
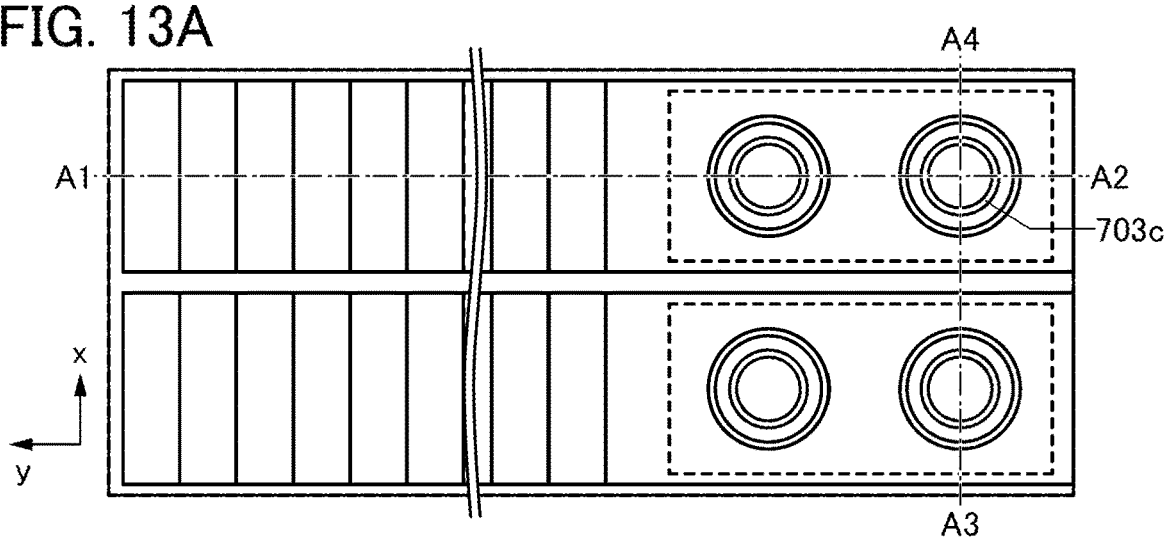
FIGS. 13A-13C Views illustrating a manufacturing method of a semiconductor device of one embodiment of the present invention.
Figure 13B:
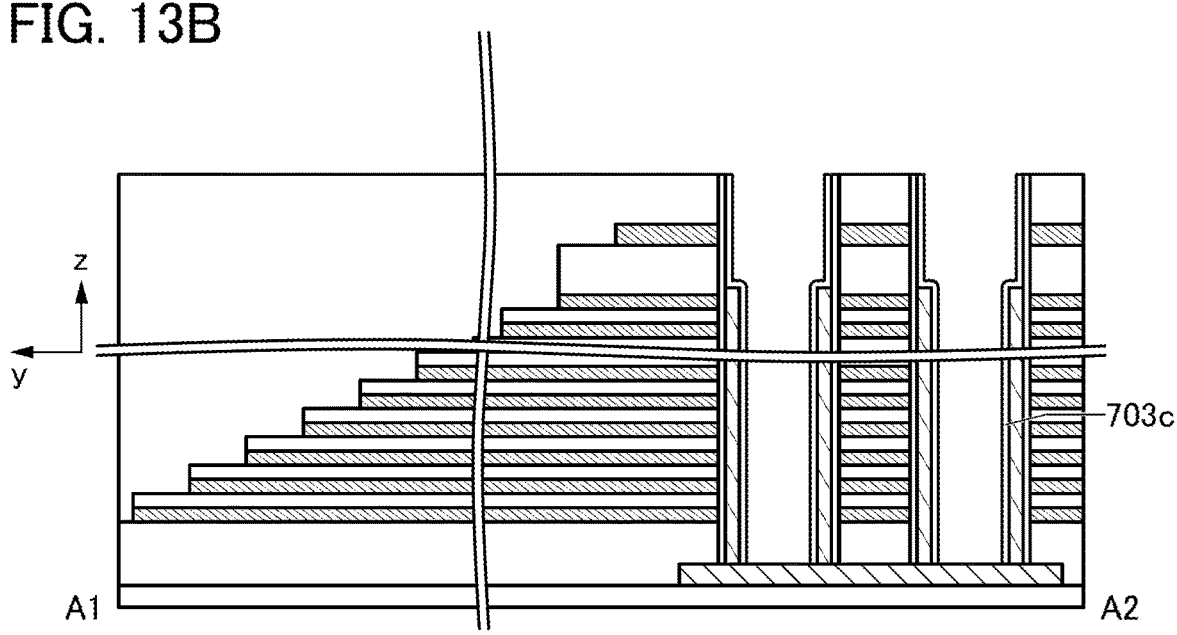
Figure 13C:
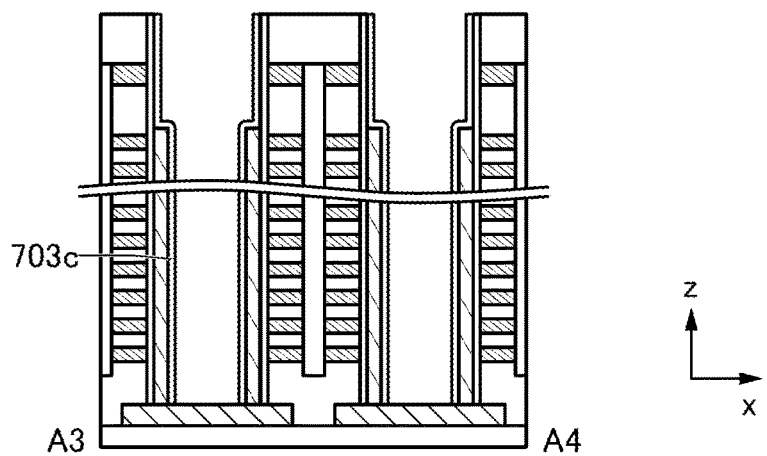

Next, an insulating film 703C to be the insulator 703*c* is formed over the insulating film 726 and inside the first opening (see FIG. 12). The insulating film 703C can be formed by a CVD method or an ALD method. It is particularly preferable to employ an ALD method because it can form a film with a uniform thickness even in a groove or an opening having a high aspect ratio. Alternatively, the insulating film 703C may be formed by a combination of an ALD method and a CVD method.

Then, the insulating film 703C formed on the bottom portion of the first opening is removed, so that the insulator 703*c* is formed. Anisotropic etching is preferably used to remove the insulating film 703C. Here, the insulating film 703C over the insulating film 726 is also removed; thus, the insulator 703c is provided only on the side wall of the first opening (see FIG. 13). The conductor 706 is exposed again by removing the insulating film 703C on the bottom portion of the first opening. In addition, the top surface of the insulator 703c can be substantially level with the top surface of the insulating film 726.

The insulating film 703A, the insulating film 703B, and the insulating film 703C may be formed with the same film formation apparatus or different film formation apparatuses. Note that the insulating film 703C is preferably formed thinner than the insulating film 703A.

Figure 14A:
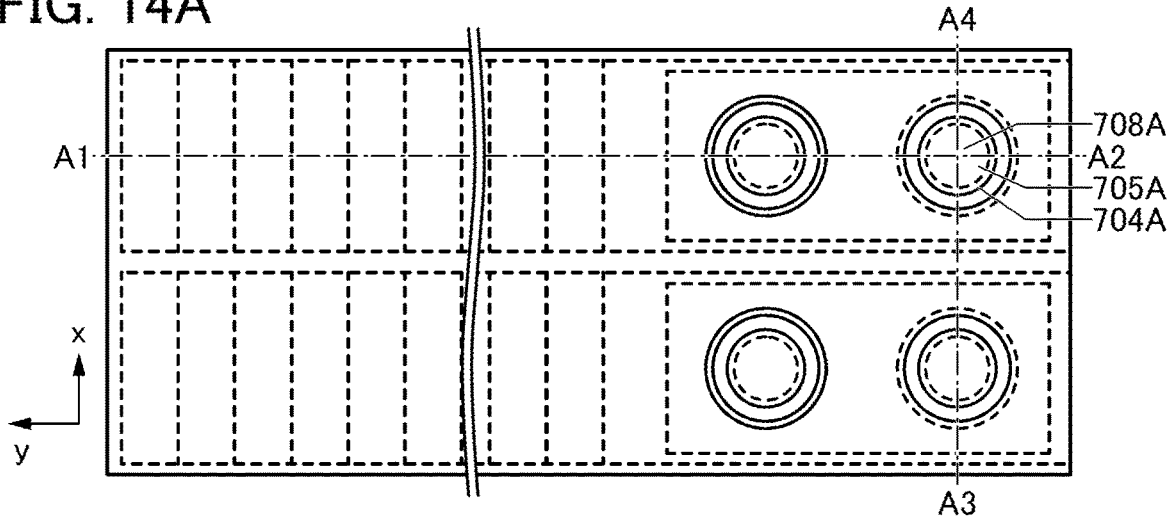
FIGS. 14A-14C Views illustrating a manufacturing method of a semiconductor device of one embodiment of the present invention.
Figure 14B:
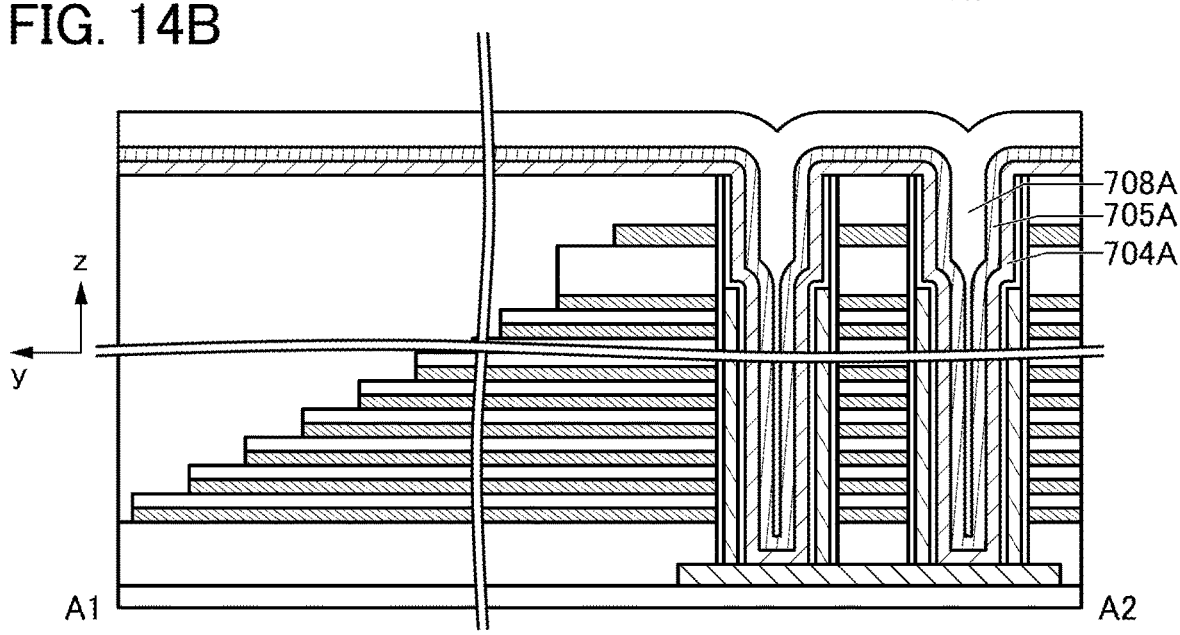
Figure 14C:
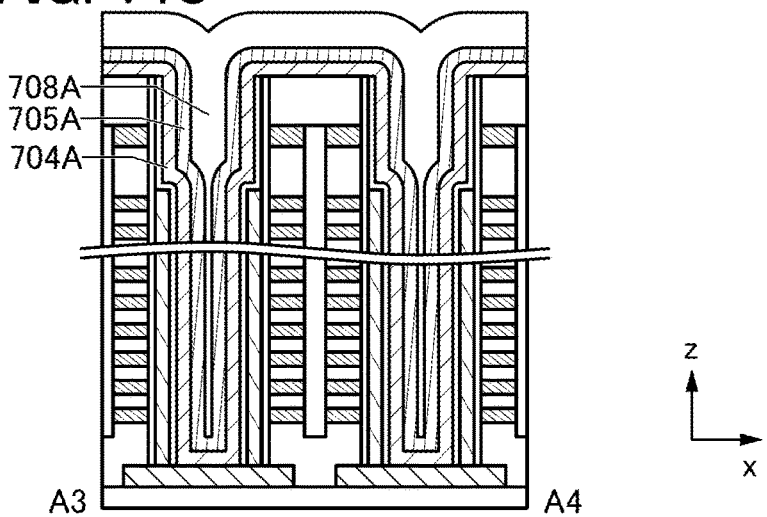
Figure 15A:
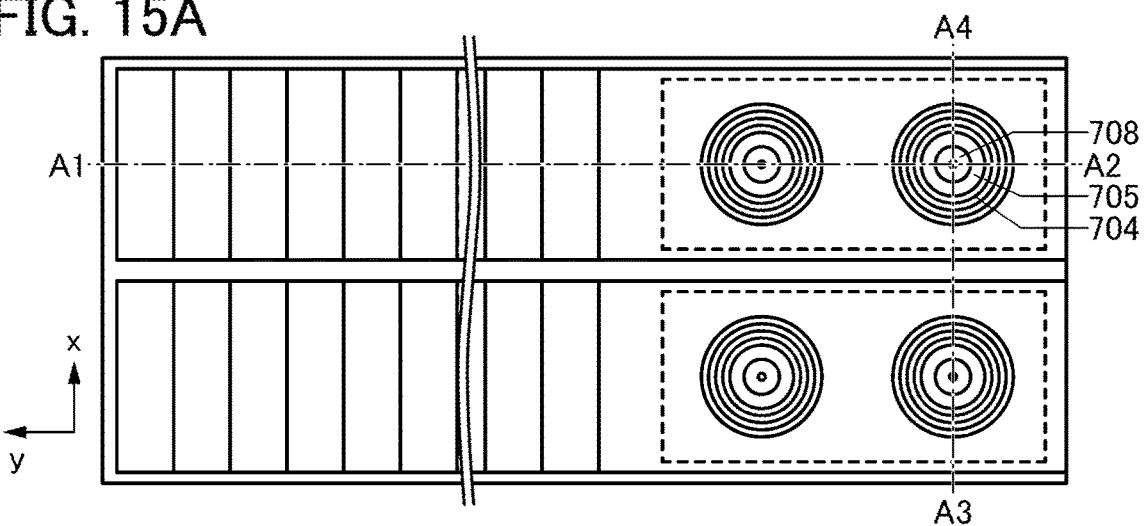
FIGS. 15A-15C Views illustrating a manufacturing method of a semiconductor device of one embodiment of the present invention.
Figure 15B:
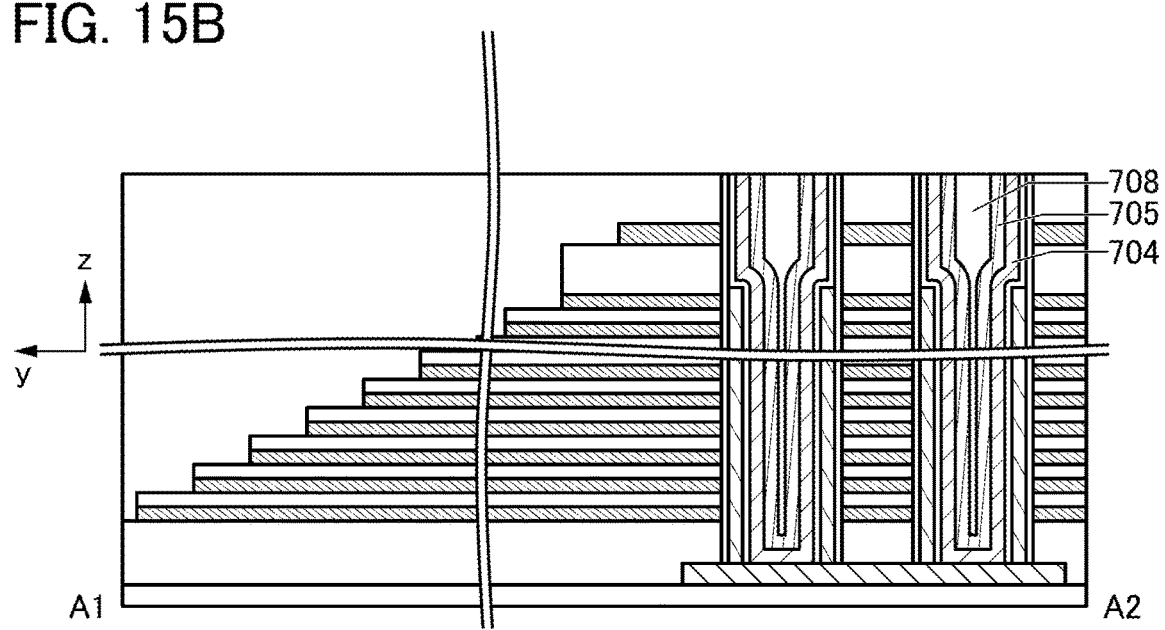
Figure 15C:
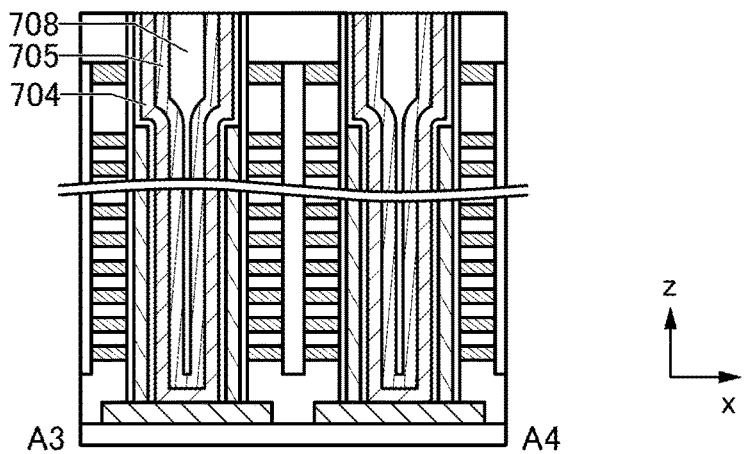

Next, an oxide film 704A to be the oxide 704, an insulating film 705A to be the insulator 705, and an insulating film 708A to be the insulator 708 are sequentially formed inside the first opening (see FIG. 14). The oxide film 704A, the insulating film 705A, and the insulating film 708A can be performed using a sputtering method, a CVD method, an MBE method, a PLD method, an ALD method, or the like.

For example, in the case where the oxide film 704A is formed by a sputtering method, oxygen or a mixed gas of oxygen and a rare gas is used as a sputtering gas. By increasing the proportion of oxygen contained in the sputtering gas, excess oxygen in the deposited oxide film can be increased. In the case where the above oxide film is formed by a sputtering method, the above-described In-M-Zn oxide target can be used.

After formation of the oxide film 704A, heat treatment may be performed. Through the heat treatment, impurities such as water and hydrogen contained in the oxide film 704A can be removed, for example. In this embodiment, treatment is performed at a temperature of 400° C. in a nitrogen atmosphere for one hour, and successively another treatment is performed at a temperature of 400° C. in an oxygen atmosphere for one hour.

Next, CMP treatment is performed to remove part of the oxide film 704A, part of the insulating film 705A, and part of the insulating film 708A, so that the insulating film 726 is exposed. As a result, the oxide 704, the insulator 705, and the insulator 708 can be formed (see FIG. 15).

Figure 16A:
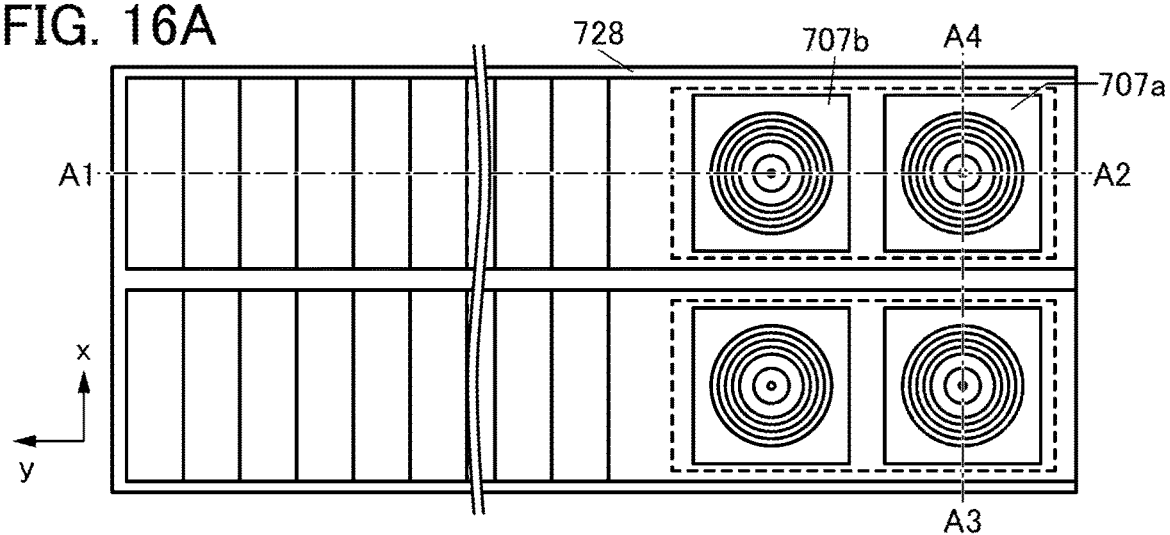
FIGS. 16A-16C Views illustrating a manufacturing method of a semiconductor device of one embodiment of the present invention.
Figure 16B:
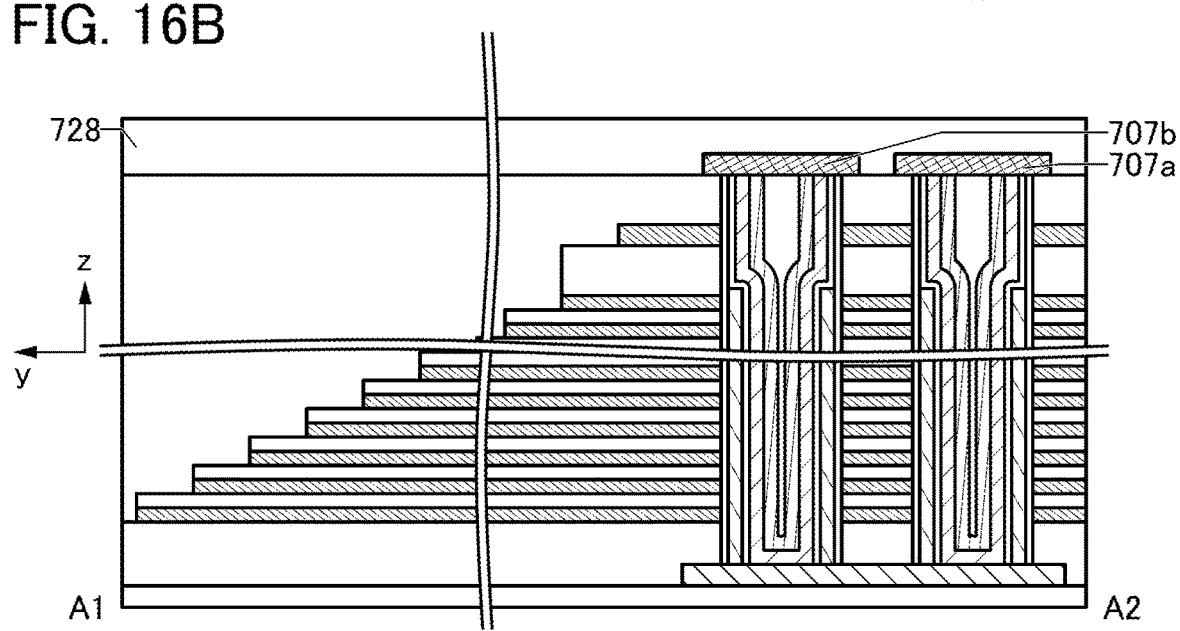
Figure 16C:
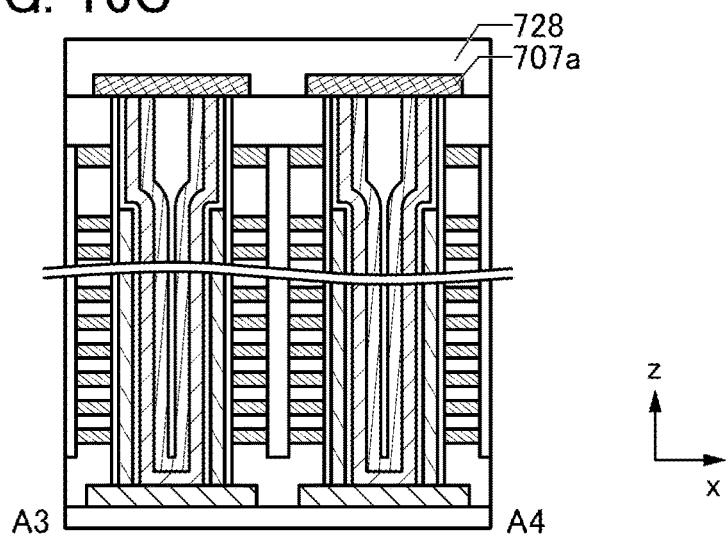

Then, the conductors 707 (the conductor 707a and the conductor 707b) are formed over the insulating film 726, the insulator 703a, the insulator 703c, the oxide 704, the insulator 705, and the insulator 708, and the insulating film 728 is formed so as to cover the conductors 707 (see FIG. 16).

A surface of the insulating film 728 is preferably subjected to planarization treatment as needed. As the planarization treatment, a CMP method or a reflow method can be used.

Figure 17A:
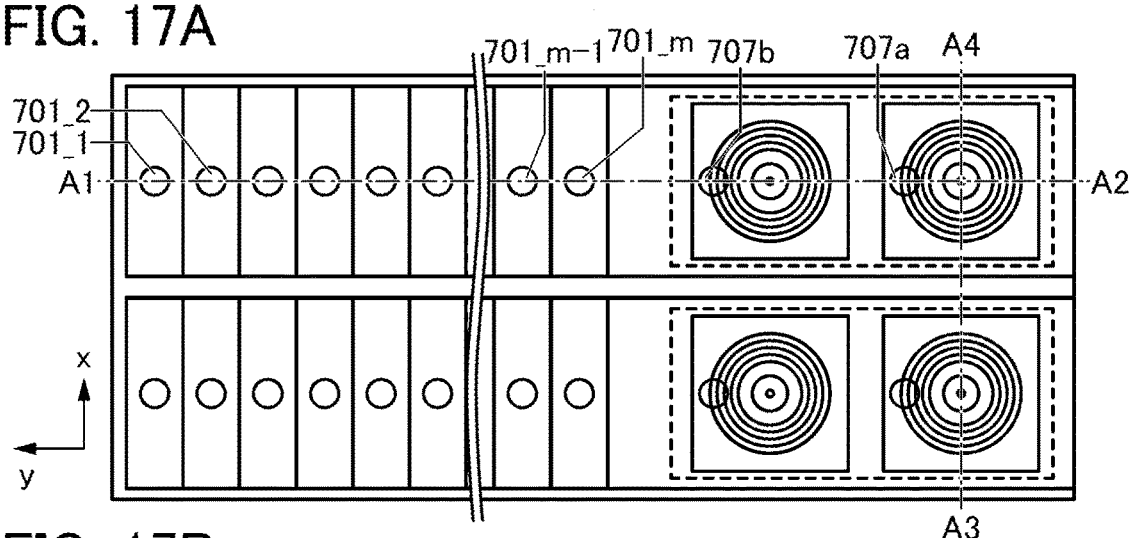
FIGS. 17A-17C Views illustrating a manufacturing method of a semiconductor device of one embodiment of the present invention.
Figure 17B:
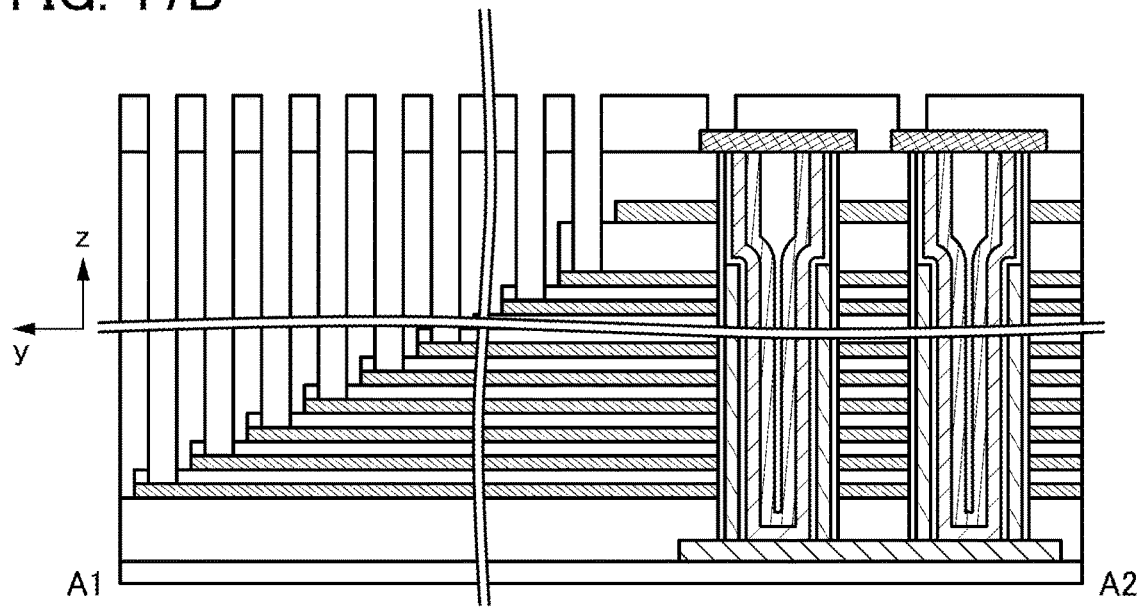
Figure 17C:
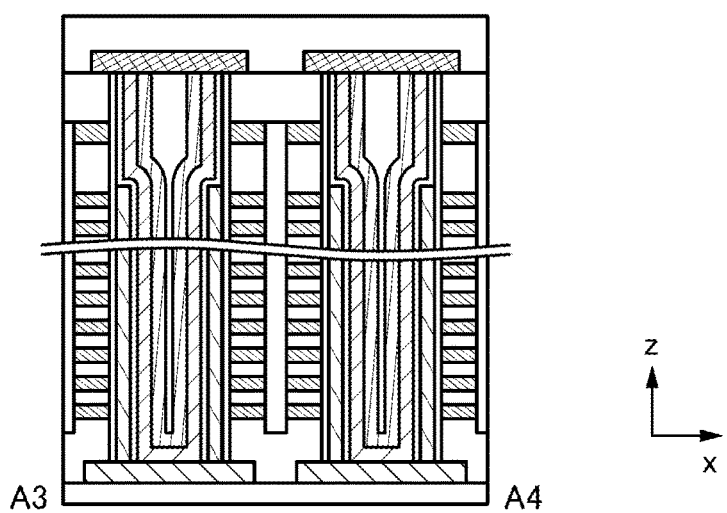

Next, the insulating film 728, the insulating film 726, and the insulators 722 are processed by a lithography method to form second openings that reach the conductors 701 and third openings that reach the conductors 707 (see FIG. 17). The second openings are formed for each of the conductors 701 formed in a step-like shape. Furthermore, the third openings are formed for each of the conductors 707. Note that the second openings that reach the conductors 701 and the third openings that reach the conductors 707 may be formed at the same time or in different steps.

Figure 18A:
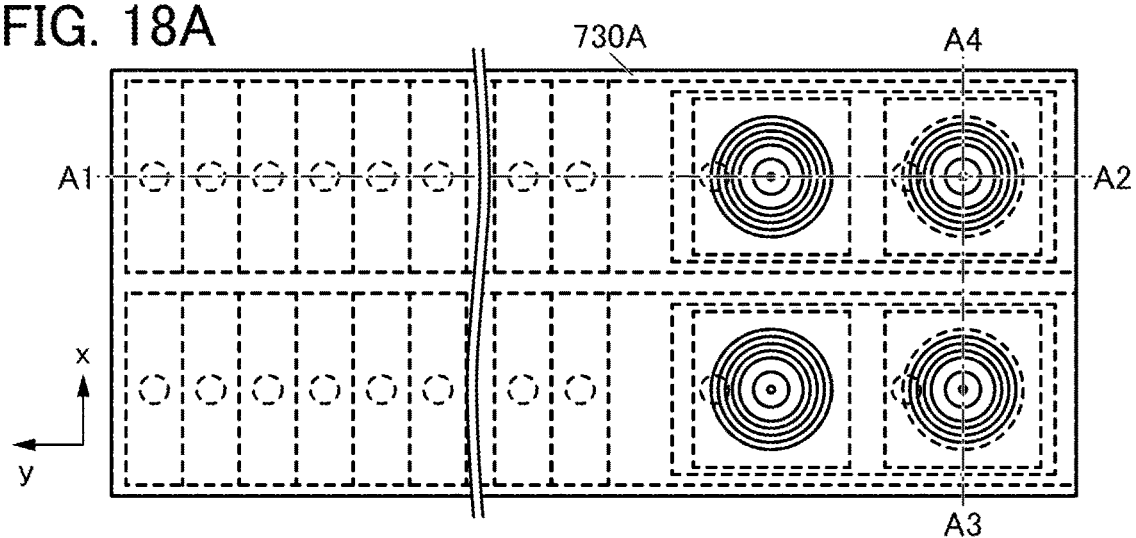
FIGS. 18A-18C Views illustrating a manufacturing method of a semiconductor device of one embodiment of the present invention.
Figure 18B:
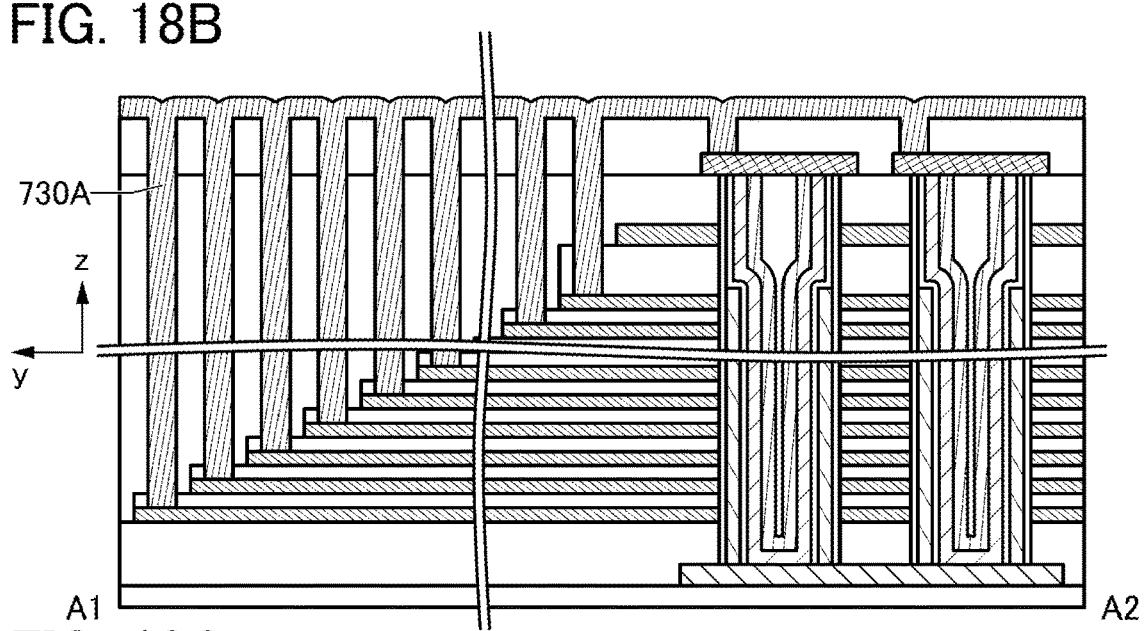
Figure 18C:
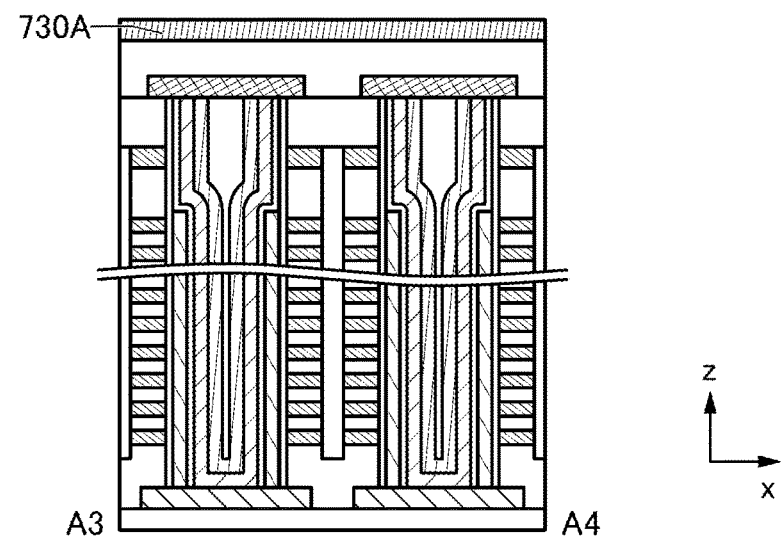
Figure 19A:
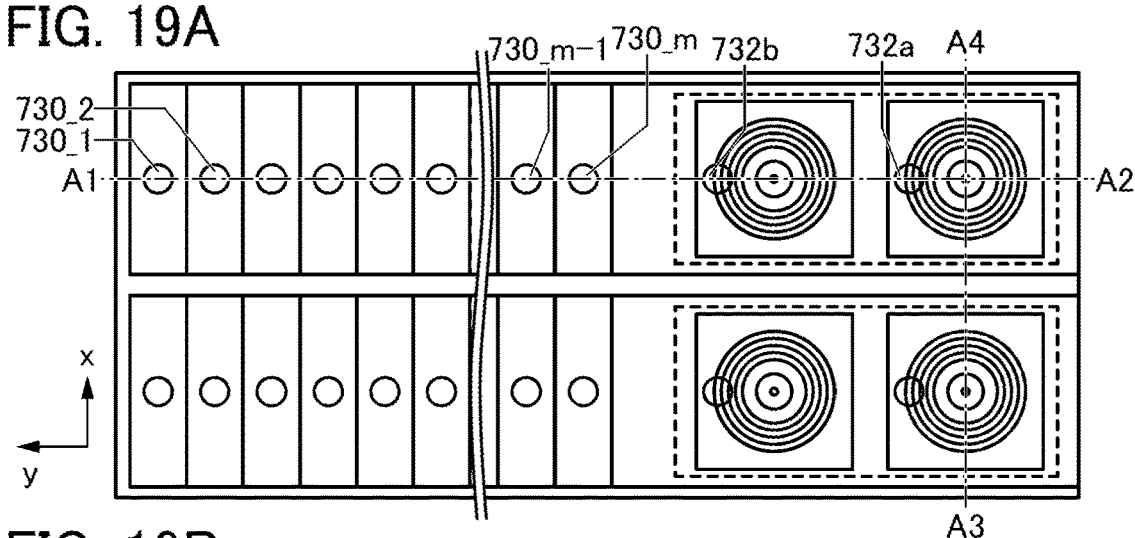
FIGS. 19A-19C Views illustrating a manufacturing method of a semiconductor device of one embodiment of the present invention.
Figure 19B:
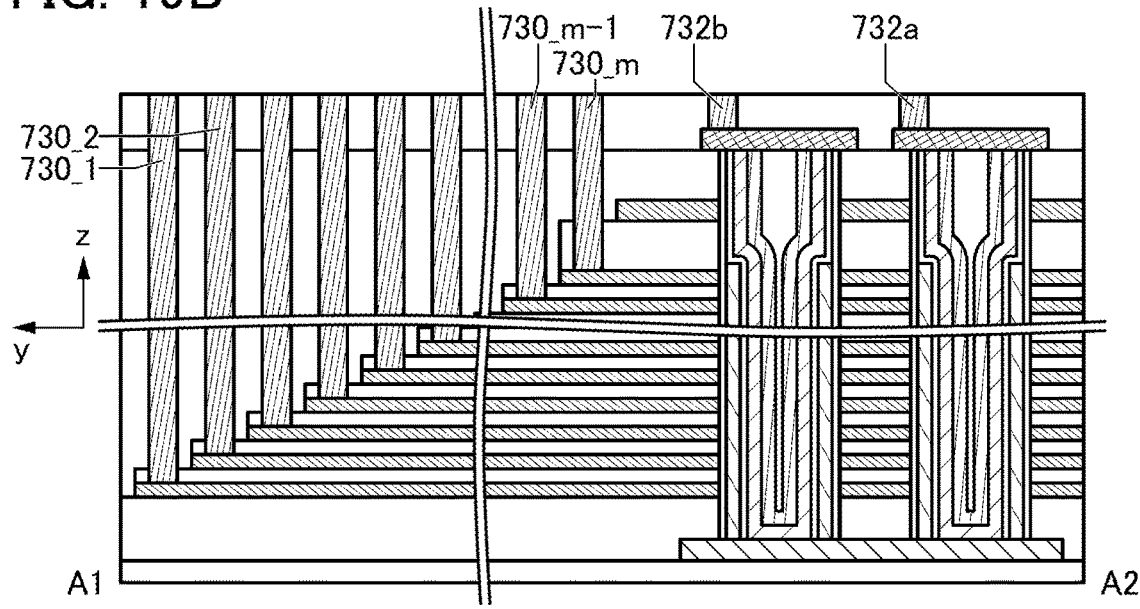
Figure 19C:
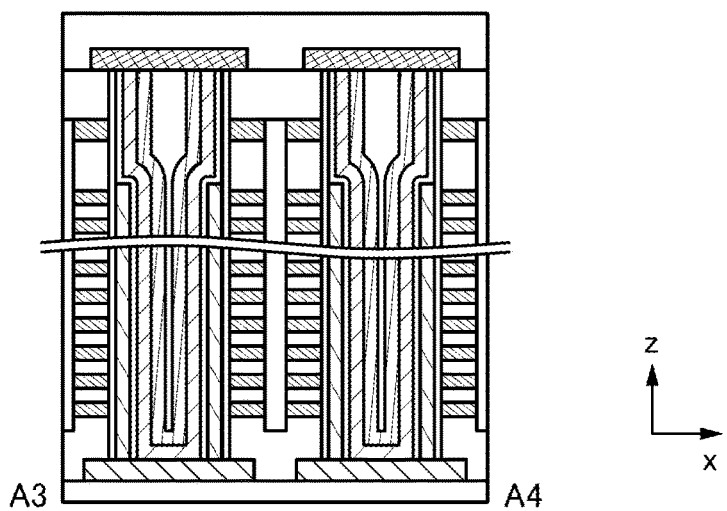

Next, a conductive film 730A is formed so as to fill the second openings and the third openings (see FIG. 18). The conductive film 730A can be formed by a CVD method or an ALD method. It is particularly preferable to employ an ALD method because it can form a film with a uniform thickness even in a groove or an opening having a high aspect ratio. Alternatively, the conductive film 730A may be formed by a combination of an ALD method and a CVD method. The conductive film 730A may have a stacked-layer structure of a plurality of layers. For example, as the conductive film 730A, after a titanium nitride film is formed by an ALD method, a tungsten film may be further formed by a CVD method.

Next, CMP treatment is performed to remove part of the conductive film 730A, so that the insulating film 728 is exposed. As a result, the conductors 730 (the conductor 730_1 to the conductor 730_m), the conductor 732a, and the conductor 732b can be formed (see FIG. 19).

Figure 20A:
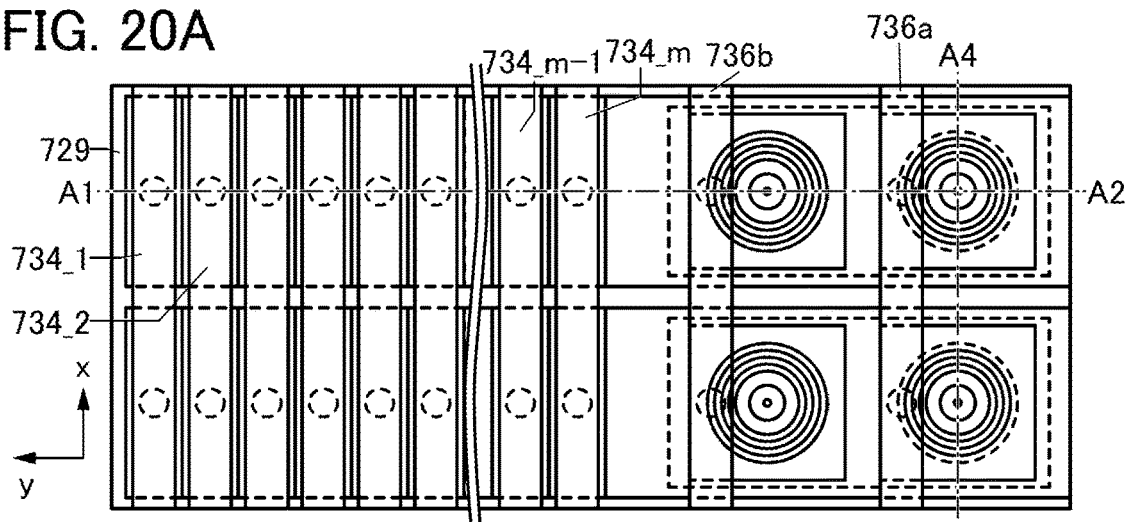
FIGS. 20A-20C Views illustrating a manufacturing method of a semiconductor device of one embodiment of the present invention.
Figure 20B:
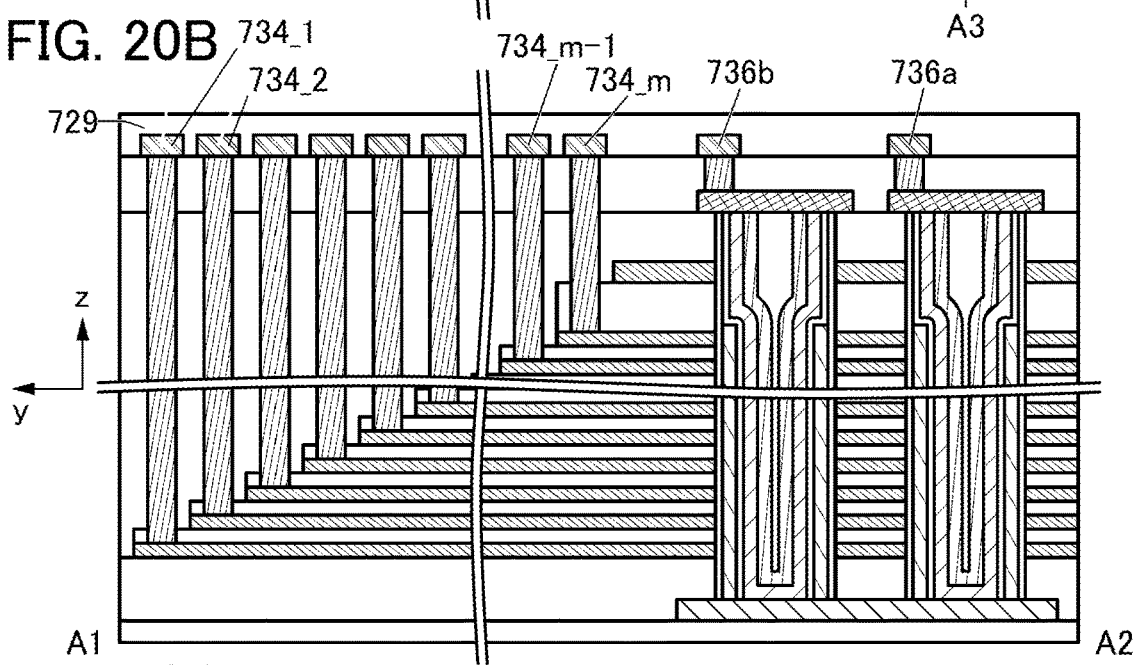
Figure 20C:
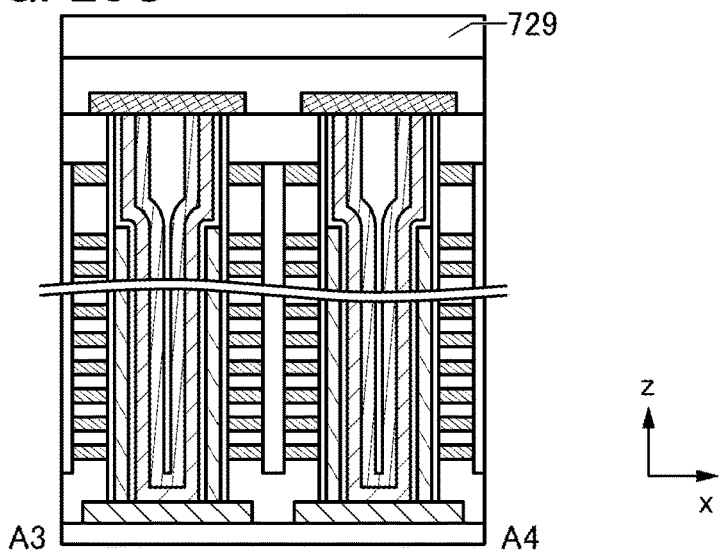
Figure 21A:
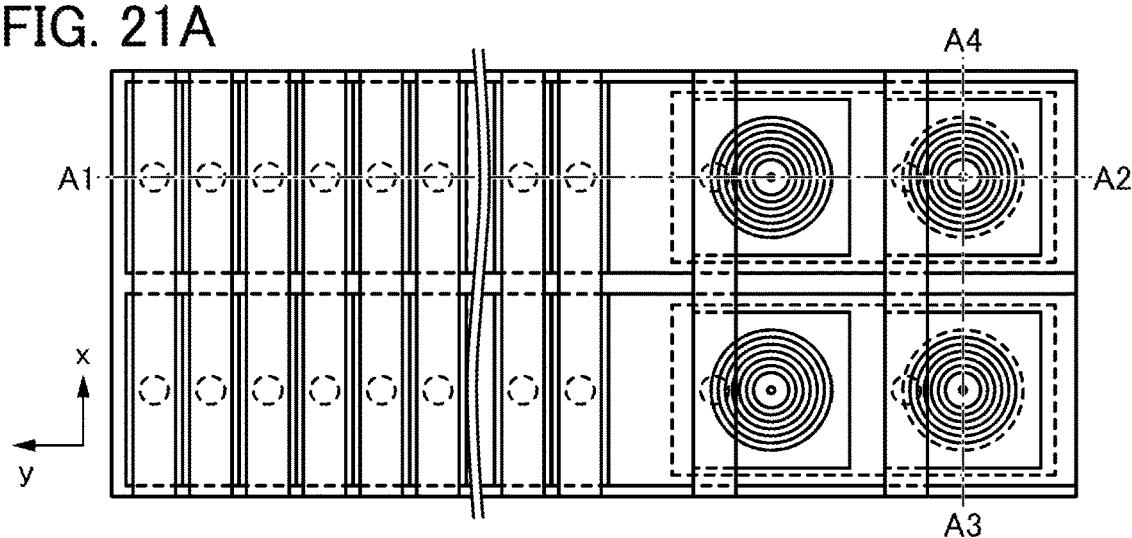
FIGS. 21A-21C Views illustrating a manufacturing method of a semiconductor device of one embodiment of the present invention.
Figure 21B:
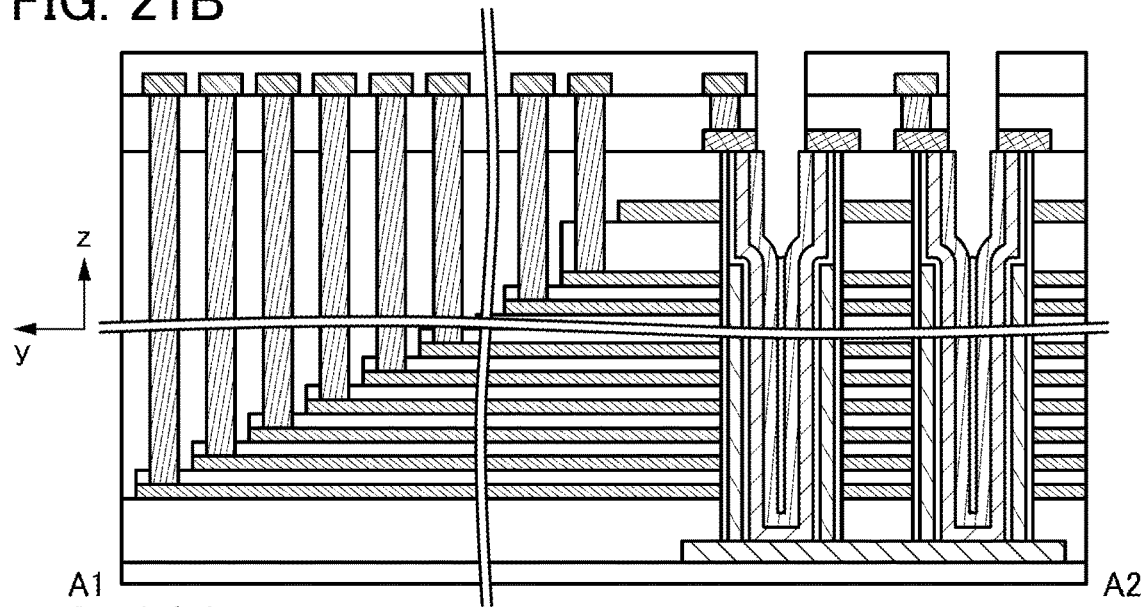
Figure 21C:
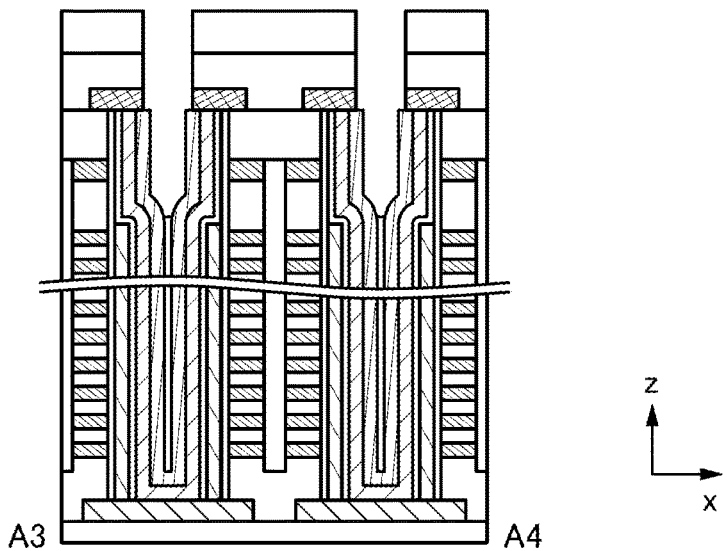

Then, the conductors 734 (the conductor 734_1 to the conductor 734_m) and the conductors 736 (the conductor 736b and the conductor 736a) are formed over the insulating film 728, the conductors 730, the conductor 732a, and the conductor 732b, and the insulating film 729 is formed so as to cover the conductors 734 and the conductors 736 (see FIG. 20).

A surface of the insulating film 729 is preferably subjected to planarization treatment as needed. As the planarization treatment, a CMP method or a reflow method can be employed.

Then, the insulating film 729, the insulating film 728, the conductors 707, and the insulator 708 positioned in an upper portion of the first opening are partly processed by a lithography method to form a fourth opening. Here, the height of the top surface of the insulator 708 is preferably set to a height between a top surface and a bottom surface of the insulator 722_m (see FIG. 21).

For the removal of the insulating film 729, the insulating film 728, the conductors 707, and the insulator 708, anisotropic etching is preferably used. For the removal of the insulator 708 by the etching, the etching time may be set in advance. Furthermore, a dummy pattern where the light emission intensity changes within desired depths in an etching apparatus may be prepared in a region (not illustrated) and a change in light emission intensity may be measured for the control.

Figure 22A:
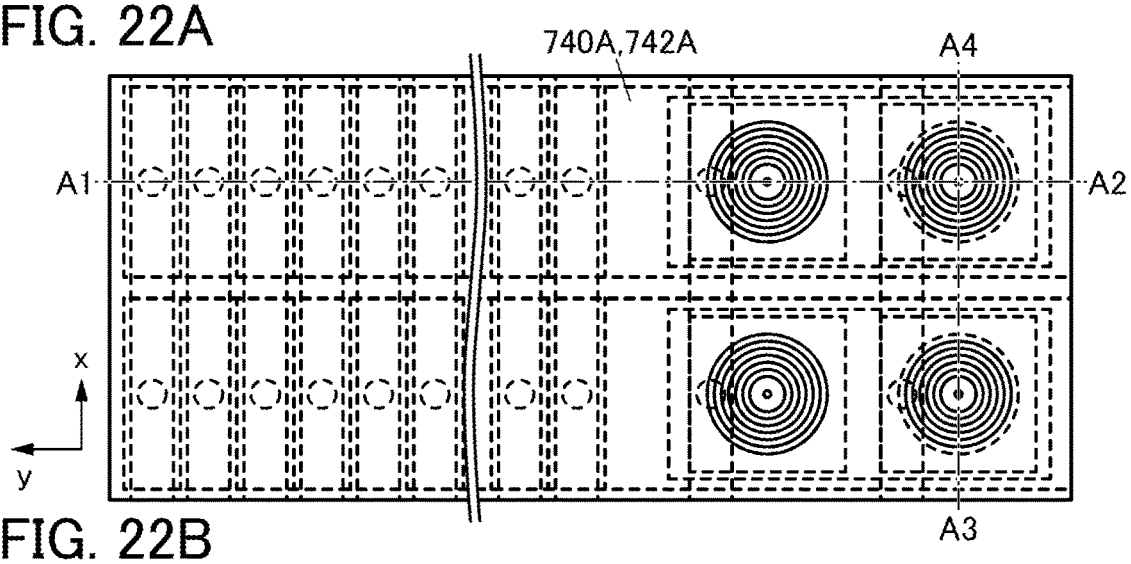
FIGS. 22A-22C Views illustrating a manufacturing method of a semiconductor device of one embodiment of the present invention.
Figure 22B:
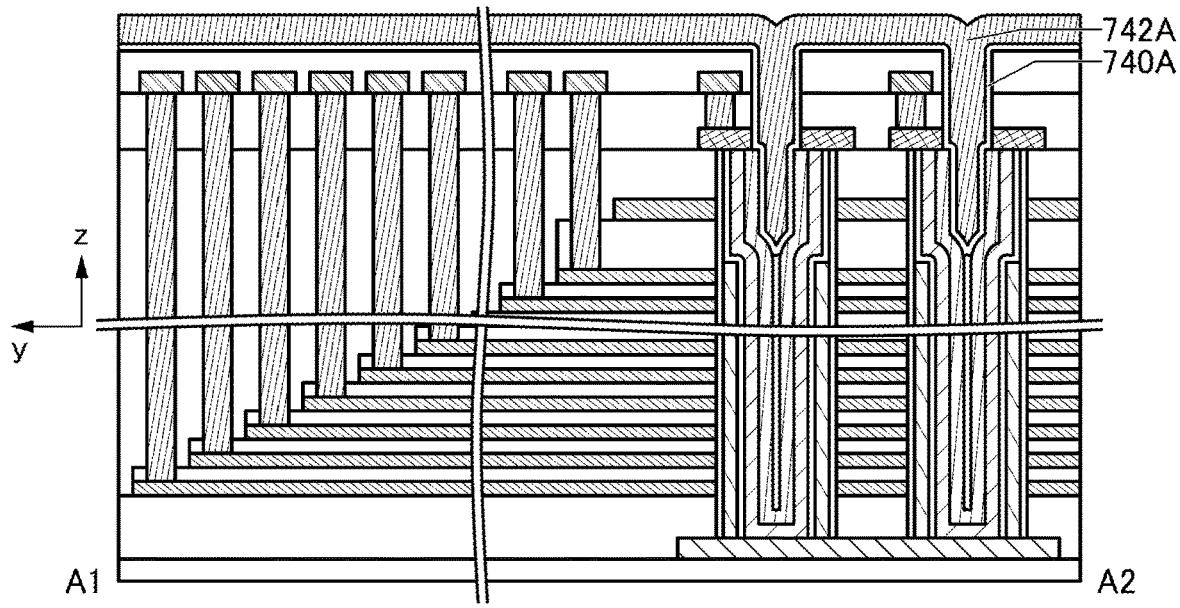
Figure 22C:
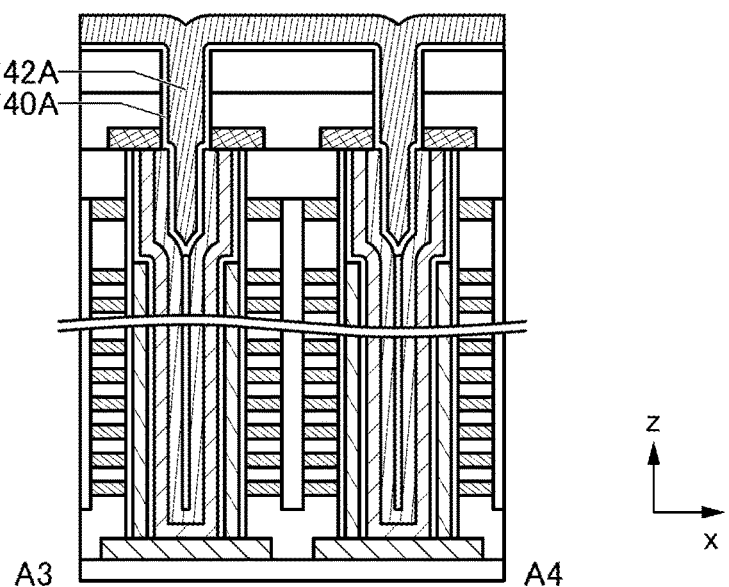
Figure 23A:
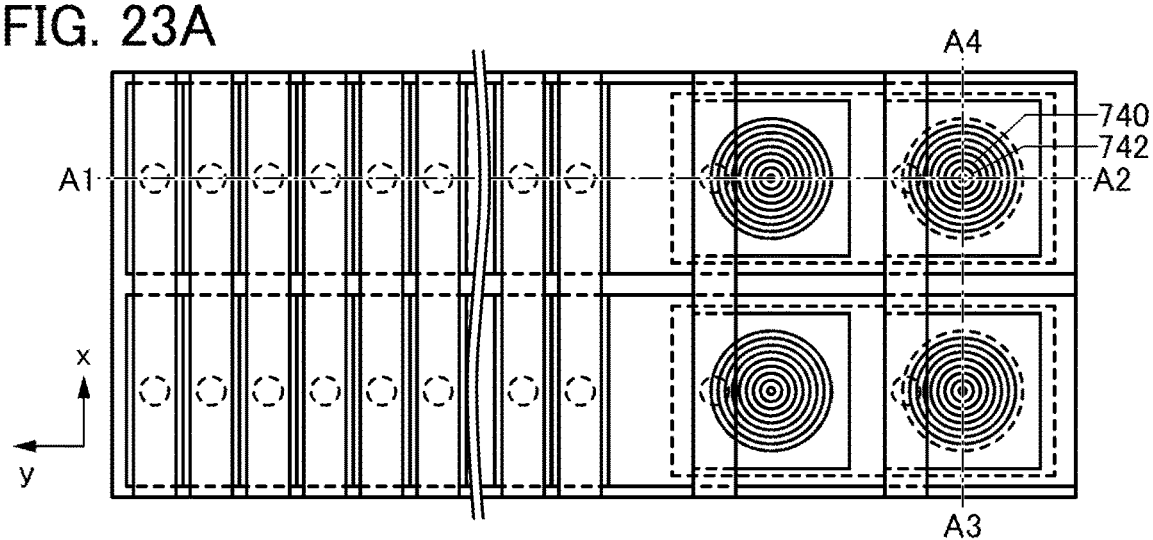
FIGS. 23A-23C Views illustrating a manufacturing method of a semiconductor device of one embodiment of the present invention.
Figure 23B:
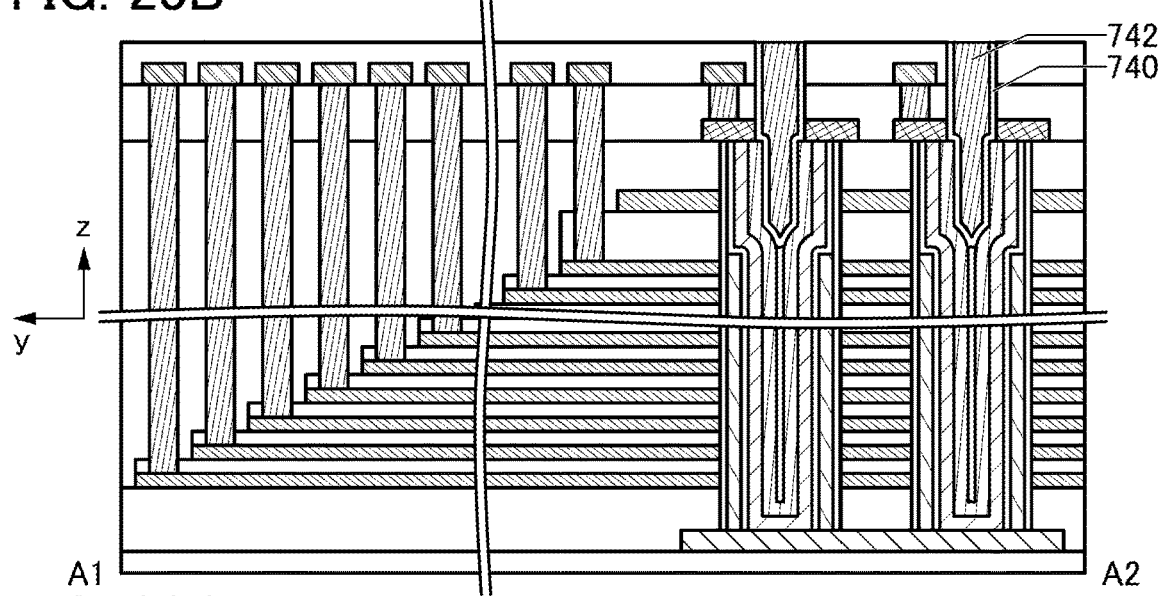
Figure 23C:
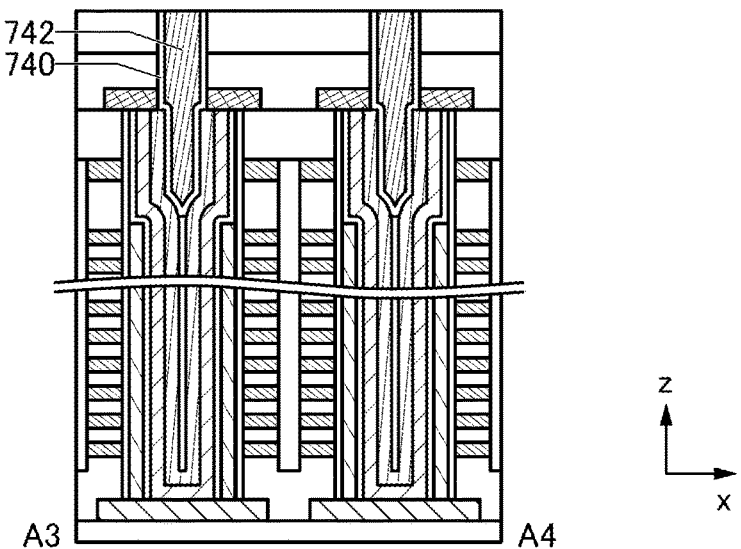

Next, an insulating film 740A to be the insulator 740 and a conductive film 742A to be the conductor 742 are sequentially formed inside the fourth opening (see FIG. 22). Then, CMP treatment is performed to remove part of the insulating film 740A and part of the conductive film 742A, so that the insulating film 729 is exposed. As a result, the insulator 740 and the conductor 742 can be formed (see FIG. 23).

Figure 24A:
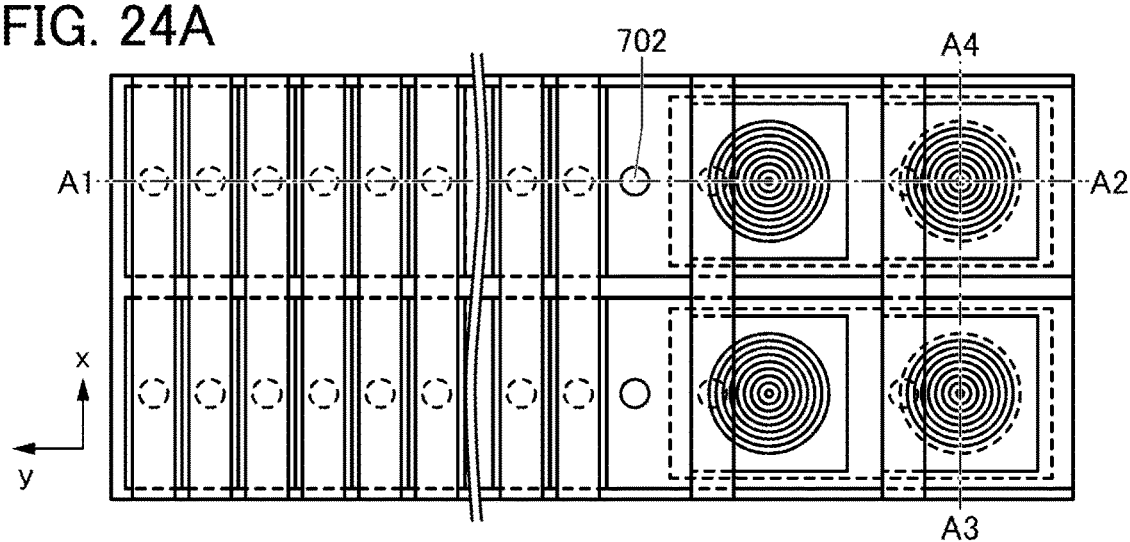
FIGS. 24A-24C Views illustrating a manufacturing method of a semiconductor device of one embodiment of the present invention.
Figure 24B:
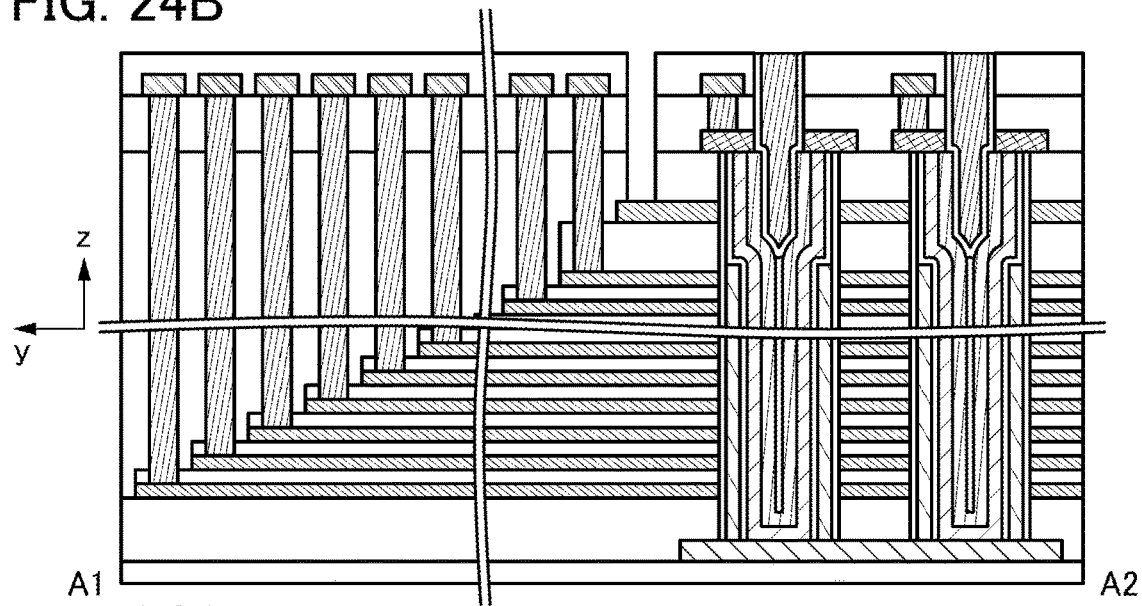
Figure 24C:
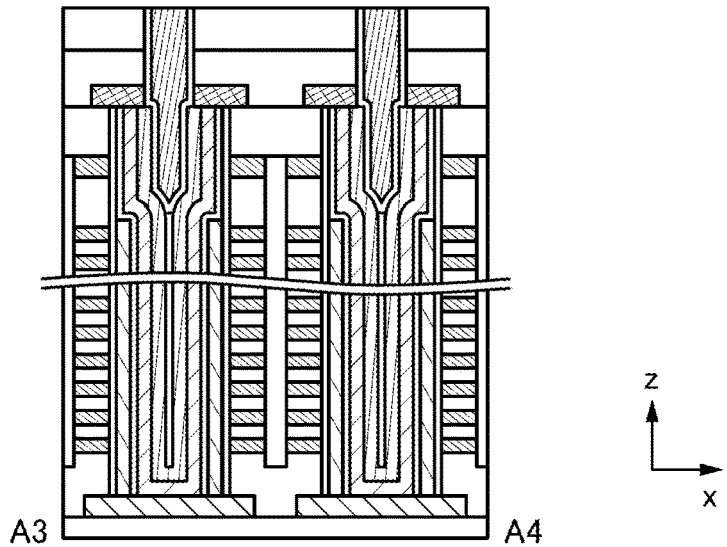

Next, the insulating film 729, the insulating film 728, and the insulating film 726 are processed by a lithography method to form a fifth opening exposing the conductor 702 (see FIG. 24).

Next, the conductor 746 is formed so as to fill the fifth opening. The conductor 746 can be formed by a CVD method or an ALD method. It is particularly preferable to employ an ALD method because it can form a film with a uniform thickness even in a groove or an opening having a high aspect ratio. Alternatively, the conductor 746 may be formed by a combination of an ALD method and a CVD method. The conductor 746 may have a stacked-layer structure of a plurality of layers. For example, as a conductive film to be the conductor 746, after a titanium nitride film is formed by an ALD method, a tungsten film may be further formed by a CVD method. The conductor 746 can be formed by forming a conductive film to be the conductor 746 over the insulating film 729 and inside the fifth opening and removing unnecessary part of the conductive film by CMP or the like.

Next, the conductors 744 (the conductor 744a and the conductor 744b) and the conductor 748 are formed over the insulating film 729 and the conductor 746.

Through the above steps, a semiconductor device can be manufactured. Note that in the above manufacturing method, a heat treatment step may be appropriately performed for activation, crystallization, or the like. Furthermore, a protective film of aluminum oxide or the like may be provided in the interlayer films.

The semiconductor device is manufactured in the above-described manner. As a result, the memory cells in the plurality of layers can be manufactured at a time without formation of a memory-cell-manufacturing pattern in each of the layers. Furthermore, in the case where a semiconductor device is manufactured by the above method, the number of steps for the memory cell pattern formation and etching treatment is not increased even when the number of layers of the memory cell is increased. In this manner, the semiconductor device manufacturing steps can be shortened; thus, a highly integrated semiconductor device with high productivity can be provided.

The structures, methods, and the like described above in this embodiment can be used in an appropriate combination with the structures, methods, and the like described in the other embodiments.

Embodiment 2

In this embodiment, a circuit configuration and operation of a memory device according to one embodiment of the disclosed invention will be described with reference to FIG. 25 to FIG. 28.

(Configuration Example of 3D NAND)

Figure 25A:
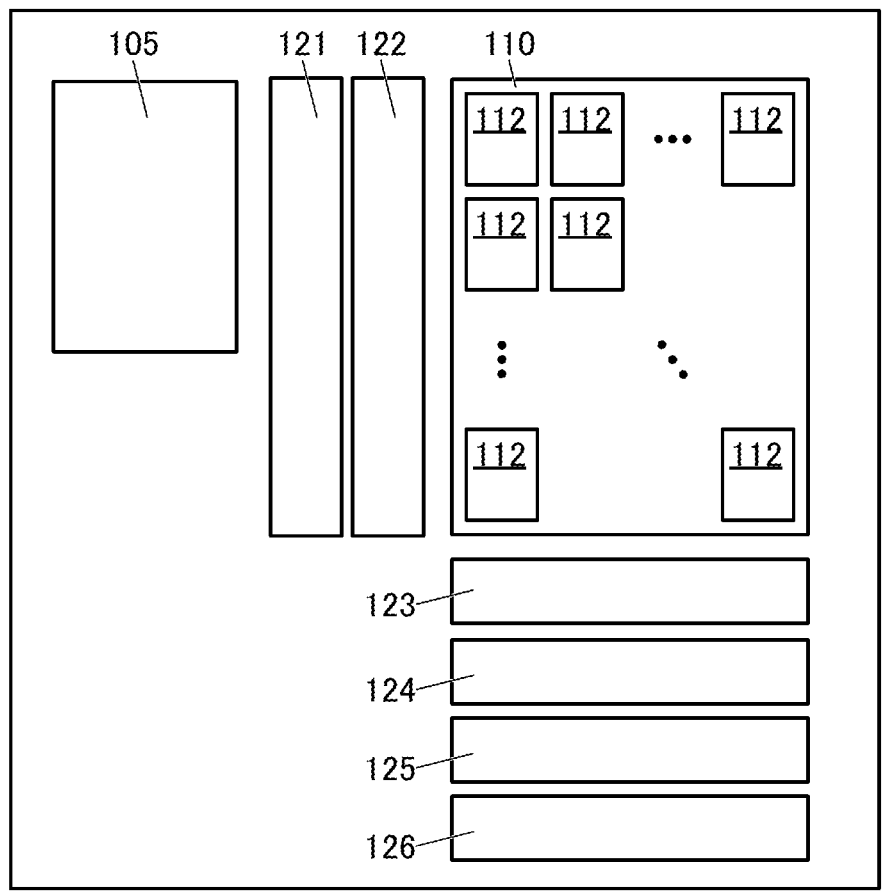
FIGS. 25A and 25B A functional block diagram illustrating a configuration example of a memory device of one embodiment of the present invention and a circuit diagram illustrating a configuration example of a memory string.

FIG. 25(A) illustrates a configuration example of a NAND-type nonvolatile memory device having a three-dimensional structure (3D NAND). A memory device 100 illustrated in FIG. 25(A) includes a control circuit 105, a memory cell array 110, and peripheral circuits.

The control circuit 105 controls the whole memory device 100 collectively and performs data writing and data reading. The control circuit 105 processes a command signal from the outside and generates a control signal for the peripheral circuits. As the peripheral circuits, a row decoder 121, a row driver 122, a sense amplifier 123, a source line driver 124, an input/output circuit 125, and a column driver 126 are provided.

The input/output circuit 125 temporarily holds data written to the memory cell array 110 and temporarily holds data read from the memory cell array 110, for example.

The source line driver 124 drives the source line SL.

The bit line BL is electrically connected to the sense amplifier 123. The sense amplifier 123 detects voltage that is read from the memory string 112 to the bit line BL at the time of data reading and amplifies it. In addition, the sense amplifier 123 inputs voltage corresponding to the writing data to the bit line BL at the time of data writing.

The row decoder 121 decodes address data input from the outside and selects a row to be accessed. The row driver 122 inputs voltage needed for writing, reading, and erasing data to the word lines WL in accordance with the decoded results by the row decoder 121.

The column driver 126 inputs voltage needed for writing, reading, and erasing data to a string selection line SSL in accordance with the decoded results by the decoder.

Figure 26:
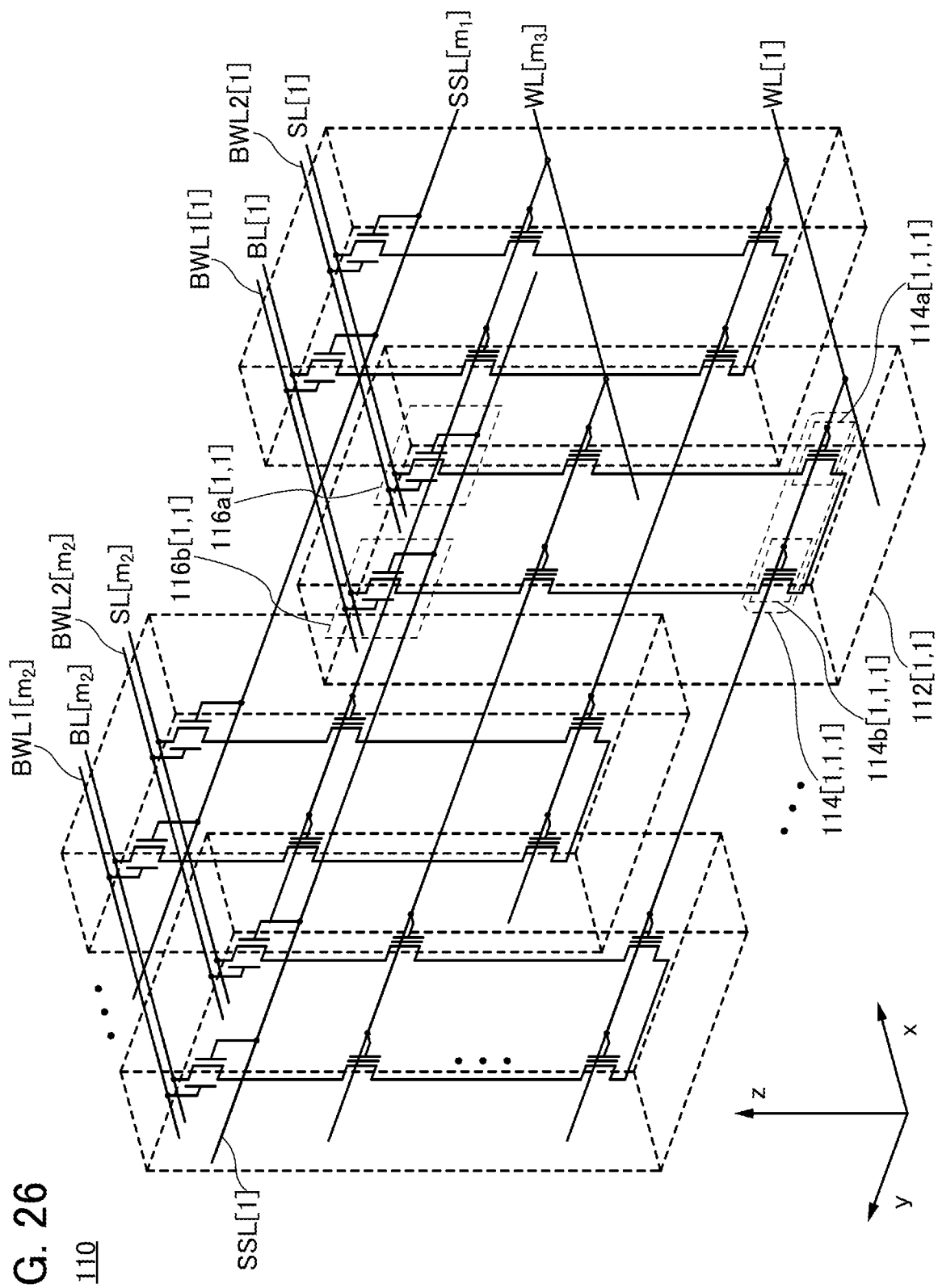
FIG. 26 A view illustrating a configuration example of a three-dimensional structure of a memory cell array of one embodiment of the present invention.

FIG. 26 illustrates an example of a three-dimensional structure of the memory cell array 110. FIG. 26 is a view schematically illustrating the example of the three-dimensional structure of the memory cell array 110 in the form of a circuit diagram. Note that in the following description, rectangular coordinates using an x-axis, a y-axis, and a z-axis are set as illustrated in FIG. 26 for the sake of convenience.

As illustrated in FIG. 26, the memory cell array 110 includes $m_1 \times m_2$ ($m_1$ and $m_2$ are natural numbers greater than or equal to 2) memory strings 112, where $m_1$ memory strings 112 and $m_2$ memory strings 112 are arranged in the x-axis direction and the y-axis direction, respectively, in a matrix. Furthermore, each of the memory strings 112 includes $m_3$ ($m_3$ is a natural number greater than or equal to 2) memory cells 114, where the $m_3$ memory cells 114 are arranged in the z-axis direction. In other words, the memory cell array 110 includes $m_1 \times m_2 \times m_3$ memory cells 114, where $m_1$ memory cells 114, $m_2$ memory cells 114, and $m_3$ memory cells 114 are arranged in the x-axis direction, the y-axis direction, and the z-axis direction, respectively, to have a rectangular solid shape. Hereinafter, using the coordinates, the memory cells 114 may be represented as the memory cell 114[1,1,1] to the memory cell 114[$m_1, m_2, m_3$].

As illustrated in FIG. 26, the memory cell 114 includes a pair of memory cells (the memory cell 114a and the memory cell 114b) which share the word line WL, the bit line BL, and the source line SL. Since the pair of memory cells share the word line WL, the same data is stored in the memory cell 114a and the memory cell 114b. As a result, the redundancy of the storage data is increased and the reliability such as memory retention characteristics can be improved. Hereinafter, using the coordinates, the memory cell 114a and the memory cell 114b may be represented as the memory cell 114a[1,1,1] to the memory cell 114a[$m_1, m_2, m_3$] and the memory cell 114b[1,1,1] to the memory cell 114b[$m_1, m_2, m_3$].

Furthermore, as illustrated in FIG. 26, the memory cell array 110 includes $m_1$ string selection lines SSL provided to extend in the y-axis direction; $m_2$ bit lines BL, $m_2$ source lines SL, $m_2$ wirings BWL1, and $m_2$ wirings BWL2 provided to extend in the x-axis direction; and $m_3$ word lines WL provided to extend in the x-axis direction. Hereinafter, using the coordinate of the x-axis direction, the string selection lines SSL may be represented as the string selection line SSL[1] to the string selection line SSL[$m_1$] as illustrated in FIG. 26. Moreover, as illustrated in FIG. 26, using the coordinate of the y-axis direction, the bit lines BL, the source lines SL, the wirings BWL1, and the wirings BWL2 may be represented as the bit line BL[1] to the bit line BL[$m_2$], the source line SL[1] to the source line SL[$m_2$], the wiring BWL1[1] to the wiring BWL1[$m_2$], and the wiring BWL2[1] to the wiring BWL2[$m_2$]. In addition, using the z-axis direction coordinate as illustrated in FIG. 26, the word lines WL may be represented as the word line WL[1] to the word line WL[$m_3$].

As illustrated in FIG. 26, the memory cell array 110 includes $m_1 \times m_2$ memory strings 112 arranged in a matrix in the x-axis direction and the y-axis direction. Hereinafter, using the coordinates of the x-axis direction and the y-axis direction, the memory strings 112 may be represented as the memory string 112[1,1] to the memory string 112[$m_1, m_2$]. Each of the memory strings 112 includes $m_3$ memory cells 114 arranged in the z-axis direction, the selection transistor 116a, and the selection transistor 116b. Hereinafter, using the coordinates of the x-axis direction and the y-axis direction, the selection transistor 116a and the selection transistor 116b may be represented as the selection transistor 116a[1,1] to the selection transistor 116a[$m_1, m_2$] and the selection transistor 116b[1,1] to the selection transistor 116b[$m_1, m_2$].

The selection transistor 116a, the selection transistor 116b, the memory cell 114a, and the memory cell 114b are each a transistor whose channel is formed of a metal oxide as mentioned above. The memory cell 114a and the memory cell 114b include a charge accumulation layer and form nonvolatile memory cells.

Figure 25B:
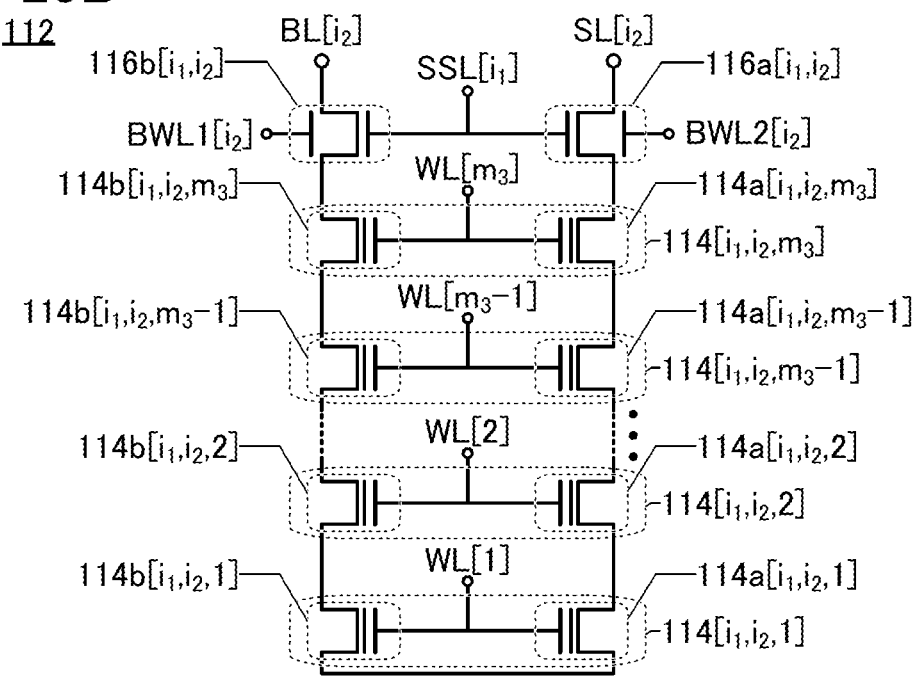

FIG. 25(B) illustrates a circuit configuration example of a memory string 112[$i_1,i_2$] ($i_1$ is a natural number greater than or equal to 1 and less than or equal to $m_1$ and $i_2$ is a natural number greater than or equal to 1 and less than or equal to $m_2$). In the memory string 112[$i_1,i_2$], the selection transistor 116a[$i_1,i_2$], the memory cell 114a[$i_1,i_2$,1] to the memory cell 114a[$i_1,i_2,m_3$], the memory cell 114b[$i_1,i_2$,1] to the memory cell 114b[$i_1,i_2,m_3$], and the selection transistor 116b[$i_1,i_2$] are electrically connected in series between the bit line BL[$i_2$] and the source line SL[$i_2$].

Gates of the selection transistor 116a[$i_1,i_2$] and the selection transistor 116b[$i_1,i_2$] are electrically connected to the string selection line SSL[$i_1$]. Furthermore, a second gate electrode of the selection transistor 116a[$i_1,i_2$] and a second gate electrode of the selection transistor 116b[$i_1,i_2$] are electrically connected to the wiring BWL2[$i_2$] and the wiring BWL1[$i_2$], respectively. One of a source and a drain of the selection transistor 116a[$i_1,i_2$] is electrically connected to the source line SL[$i_2$], and one of a source and a drain of the selection transistor 116b[$i_1,i_2$] is electrically connected to the bit line BL[$i_2$]. A gate of the memory cell 114[$i_1,i_2,i_3$] ($i_3$ is a natural number greater than or equal to 1 and less than or equal to $m_3$) is electrically connected to the word line WL[$i_3$].

As illustrated in FIG. 25(B), the memory cell 114[$i_1,i_2$,1] to the memory cell 114[$i_1,i_2,m_3$] which form the memory string 112[$i_1,i_2$] are serially connected in the z-axis direction. Accordingly, only the memory cell 114[$i_1,i_2,m_3$] is connected to the selection transistor 116a[$i_1,i_2$] and the selection transistor 116b[$i_1,i_2$] without any other memory cells 114 in between. The other memory cell(s) 114 is electrically connected to the selection transistor 116a[$i_1,i_2$] and the selection transistor 116b[$i_1,i_2$] through the other memory cell(s) 114 of the same memory string 112[$i_1,i_2$].

Thus, the memory string 112 includes the plurality of memory cells 114, and stacking can be performed so that the memory cells 114a are serially connected and the memory cells 114b are serially connected. The memory string 112 can increase storage capacity of the memory string 112 in accordance with the number of stacked memory cells 114. As a result, the memory cell array 110 formed of the plurality of memory strings 112 can increase storage capacity per unit area in accordance with the number of stacked memory cells 114.

(Description of Circuit Operation of Memory Device)

Next, data writing and reading operations of the memory cell 114 will be described with reference to FIG. 27 and FIG. 28.

FIG. 27 shows examples of Ids-Vgs characteristics of the selection transistor 116a, the selection transistor 116b, and the memory cells 114a and 114b, which are included in the memory cell 114, illustrated in FIG. 1.

Figure 27A:
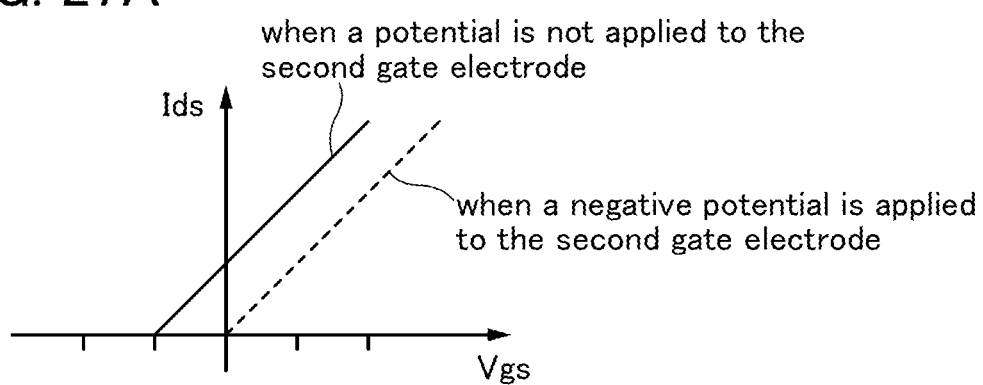
FIGS. 27A and 27B Graphs illustrating examples of Ids-Vgs characteristics of transistors.

FIG. 27(A) shows Ids-Vgs characteristics of the selection transistor 116a and the selection transistor 116b. A solid line in FIG. 27(A) shows Ids-Vgs characteristics of the case where a potential is not applied to the second gate electrodes of the selection transistor 116a and the selection transistor 116b. A broken line in FIG. 27(A) shows Ids-Vgs characteristics of the case where a negative potential is applied to the second gate electrodes of the selection transistor 116a and the selection transistor 116b. In the case where a potential is not applied to the second gate electrodes of the selection transistor 116a and the selection transistor 116b, the selection transistor 116a and the selection transistor 116b have normally-on characteristics. With the second gate electrodes, the threshold voltage is controlled and the selection transistor 116a and the selection transistor 116b can have normally-off characteristics.

Figure 27B:
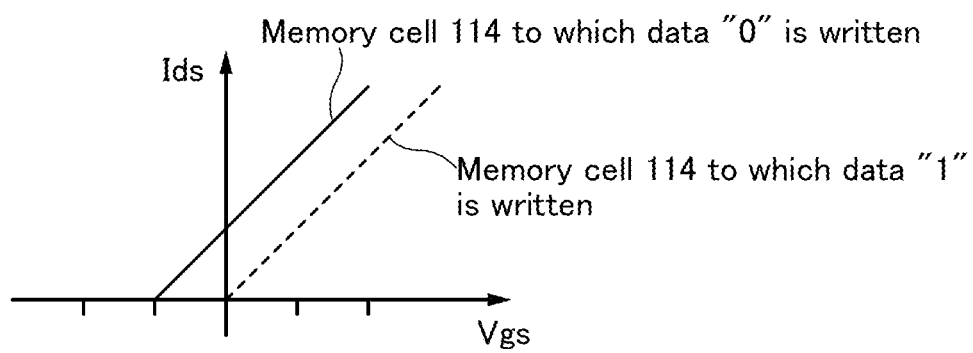

FIG. 27(B) shows Ids-Vgs characteristics of the memory cell 114a and the memory cell 114b in the state where electrons are injected into the charge accumulation layers and the state where electrons are not injected into the charge accumulation layers. Here, the memory cell 114a and the memory cell 114b in the state where electrons are injected into the charge accumulation layers can be translated into the memory cell 114a and the memory cell 114b to which data "1" is written. Furthermore, the memory cell 114a and the memory cell 114b in the state where electrons are not injected into the charge accumulation layers can be translated into the memory cell 114a and the memory cell 114b to which data "0" is written. As indicated by a solid line in FIG. 27(B), the memory cell 114a and the memory cell 114b in the state where electrons are not injected into the charge accumulation layers have normally-on characteristics. In contrast, as indicated by a broken line in FIG. 27(B), the memory cell 114a and the memory cell 114b in the state where electrons are injected into the charge accumulation layers have normally-off characteristics.

In the memory cell array 110 formed of the transistors having the Ids-Vgs characteristics shown in FIG. 27, a memory rewriting and reading method for the memory cell 114[1,1,1] will be described with reference to FIG. 28.

Figure 28:
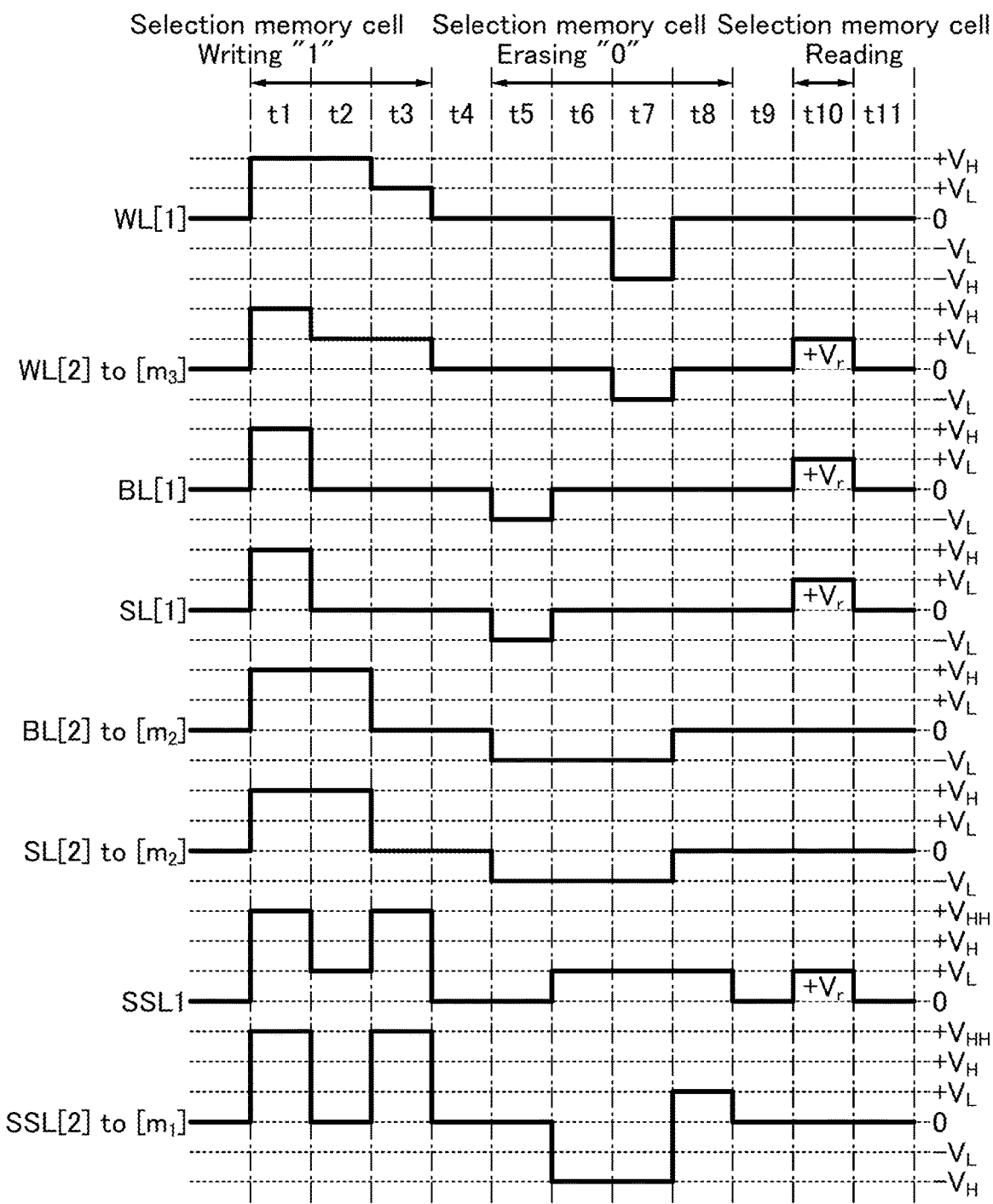
FIG. 28 A timing chart illustrating a driving method of a memory device of one embodiment of the present invention.

FIG. 28 shows an example of potential application for reading, writing, and erasing in the memory cell array 110 illustrated in FIG. 26. A potential $V_r$, a potential $V_L$, a potential $V_H$, a potential $V_{HH}$, and a potential $V_w$ shown in FIG. 28 represent arbitrary potentials. The potential $V_r$ is a potential for reading, and the potential $V_w$ is a potential for writing. As potentials for memory rewriting, the potential $V_L$, the potential $V_H$, and the potential $V_{HH}$, which are positive or negative potentials, are used. Here, absolute values of the potential $V_L$, the potential $V_H$, and the potential $V_{HH}$ used for memory rewriting have a relation, $0<|V_w|\leq|V_L|<|V_H|<|V_{HH}|$.

Note that although an example of single-level-cell (SLC) is shown in this embodiment, a multilevel memory cell may be formed.

Furthermore, for example, potentials for controlling the threshold voltage of the selection transistors are applied to the wiring BWL1 and the wiring BWL2 which are connected to the second gate electrodes of the selection transistor 116b and the selection transistor 116a, respectively, or the wiring BWL1 and the wiring BWL2 are brought into a floating state so as to hold charges.

Note that since the gates of the memory cell 114a and the memory cell 114b share the word line WL in the memory string 112, the memory cell 114a and the memory cell 114b store the same data. As a result, the redundancy of the storage data is increased and the reliability such as memory retention characteristics can be improved.

An example of a timing chart of the case where data "1" or data "0" is written to the memory cell 114[1,1,1] and the case where reading is performed is shown in FIG. 28. The timing chart shown in FIG. 28 shows a relation between potentials of the wirings in writing, erasing, and reading in the memory cell 114[1,1,1]. Writing in the memory cell 114[1,1,1] is an operation of writing data "1" to the memory cell 114[1,1,1]. Erasing in the memory cell 114[1,1,1] is an operation of writing data "0" to the memory cell 114[1,1,1].

Reading in the memory cell 114[1,1,1] is an operation of reading data written to the memory cell 114[1,1,1].

Note that the memory cell 114[1,1,1] which conducts writing, erasing, and reading may be referred to as the selected memory cell 114[1,1,1]. The memory cells 114 except the selected memory cell 114[1,1,1] may be referred to as the non-selected memory cells 114. The gates of the memory cell 114a and the memory cell 114b included in the memory cell 114 may be referred to as the gate of the memory cell 114. Active layers of the memory cell 114a and the memory cell 114b included in the memory cell 114 may be referred to as an active layer of the memory cell 114. The memory string 112[1,1] including the selected memory cell 114[1,1,1] may be referred to as the selected memory string 112[1,1]. The memory strings 112 except the selected memory string 112[1,1] may be referred to as the non-selected memory strings 112.

(Writing Operation)

In a period from the start of a period t1 to the end of a period t4 in FIG. 28, data "1" is written to the selected memory cell 114[1,1,1]. The period t1 is a period for preventing an error in rewriting in the non-selected memory cells 114. A period t2 is a period for writing data "1" to the selected memory cell 114[1,1,1]. A period t3 is a period for returning the precharge potential in the period t1. The period t4 is a period for returning the potential of each wiring to 0.

The potentials applied to the wirings in the period t1 for preventing an error in rewriting in the non-selected memory cells 114 will be described.

First, a potential $+V_{HH}$ is applied to the string selection line SSL[1] to the string selection line SSL[$m_1$] to turn on all the selection transistors 116a and all the selection transistors 116b. Then, a potential $+V_H$ is applied to the bit line BL[1] to the bit line BL[$m_2$] and the source line SL[1] to the source line SL[$m_2$] to precharge the active layers of the non-selected memory cells 114 with the potential $+V_H$. At this time, a potential $+V_H$ is applied to the word line WL[1] to the word line WL[$m_3$] which are electrically connected to the gates of the memory cells 114 to turn on all the memory cells 114. In the above-described manner, the occurrence of a large difference in potential between the potential applied to the gates of the non-selected memory cells 114 and the potential applied to the active layers of the non-selected memory cells 114 can be prevented in the period t2; thus, an error in rewriting can be prevented.

Next, the potentials applied to the wirings in the period t2 for writing data "1" to the selected memory cell 114[1,1,1] and preventing an error in rewriting in the non-selected memory cells 114 will be described.

As shown in FIG. 28, in the period t2, a potential $+V_L$ is applied to the string selection line SSL[1], and a potential 0 is applied to the string selection line SSL[2] to the string selection line SSL[$m_1$]. In addition, a potential 0 is applied to the bit line BL[1] and the source line SL[1], and a potential $+V_H$ is applied to the bit line BL[2] to the bit line BL[$m_2$] and the source line SL[2] to the source line SL[$m_2$]. Furthermore, a potential $+V_H$ is applied to the word line WL[1], and a potential $+V_L$ is applied to the word line WL[2] to the word line WL[$m_3$].

First, an operation of the selected memory cell 114[1,1,1] will be described. The application of the above-described potentials to the wirings turns on the selection transistor 116a[1,1] and the selection transistor 116b[1,1]. Furthermore, a potential $+V_H$ is applied to the gate of the selected memory cell 114[1,1,1], and a potential 0 is applied to the active layer of the selected memory cell 114[1,1,1]. The application of a high voltage of positive polarity between the gate and the active layer causes injection of electrons to the charge accumulation layer through the tunnel insulating film and thus can write data "1" to the selected memory cell 114[1,1,1].

Next, an operation of the non-selected memory cell 114 [1,1,2] to the non-selected memory cell 114[1,1,$m_3$] will be described. The application of the above-described potentials to the wirings turns on the selection transistor 116a[1,1] and the selection transistor 116b[1,1]. Furthermore, a potential $+V_L$ is applied to the gates of the non-selected memory cell 114[1,1,2] to the non-selected memory cell 114[1,1,$m_3$], and a potential 0 is applied to the active layers of the non-selected memory cell 114[1,1,2] to the non-selected memory cell 114[1,1,$m_3$]. Thus, in each of the non-selected memory cell 114[1,1,2] to the non-selected memory cell 114[1,1,$m_3$], the generation of a positive large potential difference between the gate and the active layer can be prevented; thus, an error in writing can be prevented.

Next, an operation of the non-selected memory cell 114 [1,2,1] to the non-selected memory cell 114[1,$m_2$,1] will be described. The application of the above-described potentials to the wirings turns off the selection transistor 116a[1,2] to the selection transistor 116a[1,$m_2$] and the selection transistor 116b[1,2] to the selection transistor 116b[1,$m_2$]. Thus, the precharge potential in the period t1 (approximately $+V_H$) is held in the active layers of the non-selected memory cell 114[1,2,1] to the non-selected memory cell 114[1,$m_2$,1] during the writing operation. A potential $+V_H$ is applied to the gates of the non-selected memory cell 114[1,2,1] to the non-selected memory cell 114[1,$m_2$,1]. Accordingly, in each of the non-selected memory cell 114[1,2,1] to the non-selected memory cell 114[1,$m_2$,1], the generation of a positive large potential difference between the gate and the active layer can be prevented; thus, an error in writing can be prevented.

Next, an operation of the non-selected memory cell 114 [1,2,2] to the non-selected memory cell 114[1,$m_2$,$m_3$] will be described. The application of the above-described potentials to the wirings turns off the selection transistor 116a[1,2] to the selection transistor 116a[1,$m_2$] and the selection transistor 116b[1,2] to the selection transistor 116b[1,$m_2$]. Thus, the precharge potential in the period t1 (approximately $+V_H$) is held in the active layers of the non-selected memory cell 114[1,2,2] to the non-selected memory cell 114[1,$m_2$,$m_3$] during the writing operation. A potential $+V_L$ is applied to the gates of the non-selected memory cell 114[1,2,2] to the non-selected memory cell 114[1,$m_2$,$m_3$]. Accordingly, in each of the non-selected memory cell 114[1,2,2] to the non-selected memory cell 114[1,$m_2$,$m_3$], the generation of a positive large potential difference between the gate and the active layer can be prevented; thus, an error in writing can be prevented.

Next, an operation of the non-selected memory cell 114 [2,1,1] to the non-selected memory cell 114[$m_1$,$m_2$,1] will be described. The application of the above-described potentials to the wirings turns off the selection transistor 116a[2,1] to the selection transistor 116a[$m_1$,$m_2$] and the selection transistor 116b[2,1] to the selection transistor 116b[$m_1$,$m_2$]. Thus, the precharge potential in the period t1 (approximately $+V_H$) is held in the active layers of the non-selected memory cell 114[2,1,1] to the non-selected memory cell 114[$m_1$,$m_2$, 1] during the writing operation. A potential $+V_H$ is applied to the gates of the non-selected memory cell 114[2,1,1] to the non-selected memory cell 114[$m_1$,$m_2$,1]. Accordingly, in each of the non-selected memory cell 114[2,1,1] to the non-selected memory cell 114[$m_1$,$m_2$,1], the generation of a positive large potential difference between the gate and the active layer can be prevented; thus, an error in writing can be prevented.

Next, an operation of the non-selected memory cell 114 [2,1,2] to the non-selected memory cell 114[$m_1,m_2,m_3$] will be described. The application of the above-described potentials to the wirings turns off the selection transistor 116*a*[2,1] to the selection transistor 116*a*[$m_1,m_2$] and the selection transistor 116*b*[2,1] to the selection transistor 116*b*[$m_1,m_2$]. Thus, the precharge potential in the period t1 (approximately +$V_H$) is held in the active layers of the non-selected memory cell 114[2,1,2] to the non-selected memory cell 114[$m_1,m_2,m_3$] during the writing operation. A potential +$V_L$ is applied to the gates of the non-selected memory cell 114[2,1,2] to the non-selected memory cell 114[$m_1,m_2,m_3$]. Accordingly, in each of the non-selected memory cell 114[2,1,2] to the non-selected memory cell 114[$m_1,m_2,m_3$], the generation of a positive large potential difference between the gate and the active layer can be prevented; thus, an error in writing can be prevented.

Next, the potentials applied to the wirings in the period t3 for returning the precharge potentials in the period t1 will be described.

As shown in FIG. 28, in the period t3, a potential +$V_{HH}$ is applied to the string selection line SSL[1] to the string selection line SSL[$m_1$], and a potential 0 is applied to the bit line BL[1] to the bit line BL[$m_2$] and the source line SL[1] to the source line SL[$m_2$]. Thus, the selection transistor 116*a*[1,1] to the selection transistor 116*a*[$m_1,m_2$] and the selection transistor 116*b*[1,1] to the selection transistor 116*b*[$m_1,m_2$] are turned on.

A potential +$V_L$ is applied to the word line WL[1] to the word line WL[$m_3$]. Thus, in each of the memory cell 114[1,1,1] to the memory cell 114[$m_1,m_2,m_3$], a large potential difference is not generated between the gate and the active layer. Accordingly, the potentials of the active layers of the memory cell 114[1,1,1] to the memory cell 114[$m_1,m_2,m_3$] are returned to 0 and an error in writing can be prevented.

Note that the time for which the precharge potential is held depends on the leakage current in the off state of the selection transistor 116*a* and the selection transistor 116*b*. If the time for which the precharge potential is held is substantially equal to the writing time, returning the precharge potential in the period t3 may be omitted.

(Erasing Operation)

In a period from the start of a period t5 to the end of a period t9 in FIG. 28, data "0" is written to the memory cell 114[1,1,1]. The period t5 is a period for preventing an error in rewriting in the non-selected memory cells 114. A period t6 is a period for returning the precharge potential in the period t5 to 0 in only the selected memory string 112[1,1]. A period t7 is a period for writing data "0" to the selected memory cell 114[1,1,1]. A period t8 is a period for returning the precharge potential in the period t5. The period t9 is a period for returning the potentials of the wirings to 0.

The potentials applied to the wirings in the period t5 for preventing an error in rewriting in the non-selected memory cell 114 will be described.

First, a potential 0 is applied to the string selection line SSL[1] to the string selection line SSL[$m_1$], and a potential −$V_L$ is applied to the bit line BL[1] to the bit line BL[$m_2$] and the source line SL[1] to the source line SL[$m_2$], whereby all the selection transistors 116*a* and all the selection transistors 116*b* are turned on and the active layers of the non-selected memory cells 114 are precharged with the potential −$V_L$. At this time, a potential 0 is applied to the word line WL[1] to the word line WL[$m_3$] which are electrically connected to the gates of the memory cells 114 to turn on all the memory cells 114. In the above-described manner, the occurrence of a large difference in potential between the potentials applied to the gates of the non-selected memory cells 114 and the potentials applied to the active layers of the non-selected memory cells 114 can be prevented in the period t7; thus, an error in rewriting can be prevented.

The potentials applied to the wirings in the period t6 for returning the potentials of the active layers of the memory cells 114 in the selected memory string 112[1,1] to 0 will be described.

A potential +$V_L$ is applied to the string selection line SSL[1], a potential 0 is applied to the bit line BL[1] and the source line SL[1], and a potential 0 is applied to the word line WL[1] to the word line WL[$m_3$]. Thus, the selection transistor 116*a*[1,1], the selection transistor 116*b*[1,1], and the memory cell 114[1,1,1] to the memory cell 114[1,1,$m_3$] are turned on, and the potentials of the active layers of the memory cell 114[1,1,1] to the memory cell 114[1,1,$m_3$] in the selected memory string 112[1,1] can be returned to 0.

Furthermore, a potential −$V_H$ is applied to the string selection line SSL[2] to the string selection line SSL[$m_1$], and a potential −$V_L$ is applied to the bit line BL[2] to the bit line BL[$m_2$] and the source line SL[2] to the source line SL[$m_2$]. Thus, the selection transistors 116*a* and the selection transistors 116*b* of the non-selected memory string 112[2,1] to the non-selected memory string 112[$m_1,m_2$] are turned off, so that a potential −$V_L$ with which the active layers of the non-selected memory cell 114[2,1,1] to the non-selected memory cell 114[$m_1,m_2,m_3$] are precharged in the period t5 is held. Moreover, although the selection transistors 116*a* and the selection transistors 116*b* of the non-selected memory string 112[1,2] to the non-selected memory string 112[1,$m_2$] are turned on, owing to no potential difference between the sources and the drains, a potential −$V_L$ with which the active layers of the non-selected memory cell 114[1,2,1] to the non-selected memory cell 114[1,$m_2,m_3$] are precharged in the period t5 is held.

Next, the potentials applied to the wirings in the period t7 for writing data "0" to the memory cell 114[1,1,1] and preventing an error in rewriting in the non-selected memory cells will be described.

As shown in FIG. 28, in the period t7, a potential +$V_L$ is applied to the string selection line SSL[1], and a potential −$V_H$ is applied to the string selection line SSL[2] to the string selection line SSL[$m_1$]. In addition, a potential 0 is applied to the bit line BL[1] and the source line SL[1], and a potential −$V_L$ is applied to the bit line BL[2] to the bit line BL[$m_2$] and the source line SL[2] to the source line SL[$m_2$]. Furthermore, a potential −$V_H$ is applied to the word line WL[1], and a potential −$V_L$ is applied to the word line WL[2] to the word line WL[$m_3$].

First, an operation of the selected memory cell 114[1,1,1] will be described. The application of the above-described potentials to the wirings turns on the selection transistor 116*a*[1,1] and the selection transistor 116*b*[1,1]. Furthermore, a potential −$V_H$ is applied to the gate of the selected memory cell 114[1,1,1], and a potential 0 is applied to the active layer of the selected memory cell 114[1,1,1]. The application of a high voltage of negative polarity between the gate and the active layer causes extraction of electrons trapped by the charge accumulation layer through the tunnel insulating film and thus can write data "0" to the selected memory cell 114[1,1,1].

Next, an operation of the non-selected memory cell 114 [1,1,2] to the non-selected memory cell 114[1,1,$m_3$] will be described. The application of the above-described potentials to the wirings turns on the selection transistor 116a[1,1] and the selection transistor 116b[1,1]. Furthermore, a potential $-V_L$ is applied to the gates of the non-selected memory cell 114[1,1,2] to the non-selected memory cell 114[1,1,$m_3$], and a potential 0 is applied to the active layers of the non-selected memory cell 114[1,1,2] to the non-selected memory cell 114[1,1,$m_3$]. Accordingly, in each of the non-selected memory cell 114[1,1,2] to the non-selected memory cell 114[1,1,$m_3$], the generation of a negative large potential difference between the gate and the active layer can be prevented; thus, an error in writing can be prevented.

Next, an operation of the non-selected memory cell 114[1,2,1] to the non-selected memory cell 114[1,$m_2$,1] will be described. The application of the above-described potentials to the wirings turns on the selection transistor 116a[1,2] to the selection transistor 116a[1,$m_2$] and the selection transistor 116b[1,2] to the selection transistor 116b[1,$m_2$]. A potential $-V_H$ is applied to the gates of the non-selected memory cell 114[1,2,1] to the non-selected memory cell 114[1,$m_2$,1], and a potential $-V_L$ is applied to the active layers of the non-selected memory cell 114[1,2,1] to the non-selected memory cell 114[1,$m_2$,1]. Accordingly, in each of the non-selected memory cell 114[1,2,1] to the non-selected memory cell 114[1,$m_2$,1], the generation of a negative large potential difference between the gate and the active layer can be prevented; thus, an error in writing can be prevented.

Next, an operation of the non-selected memory cell 114[1,2,2] to the non-selected memory cell 114[1,$m_2$,$m_3$] will be described. The application of the above-described potentials to the wirings turns on the selection transistor 116a[1,2] to the selection transistor 116a[1,$m_2$] and the selection transistor 116b[1,2] to the selection transistor 116b[1,$m_2$]. Furthermore, a potential $-V_L$ is applied to the gates of the non-selected memory cell 114[1,2,2] to the non-selected memory cell 114[1,$m_2$,$m_3$], and a potential $-V_L$ is applied to the active layers of the non-selected memory cell 114[1,2,2] to the non-selected memory cell 114[1,$m_2$,$m_3$]. Accordingly, in each of the non-selected memory cell 114[1,2,2] to the non-selected memory cell 114[1,$m_2$,$m_3$], the generation of a negative large potential difference between the gate and the active layer can be prevented; thus, an error in writing can be prevented.

Next, an operation of the non-selected memory cell 114[2,1,1] to the non-selected memory cell 114[$m_1$,$m_2$,1] will be described. The application of the above-described potentials to the wirings turns off the selection transistor 116a[2,1] to the selection transistor 116a[$m_1$,$m_2$] and the selection transistor 116b[2,1] to the selection transistor 116b[$m_1$,$m_2$]. Thus, the precharge potential in the period t5 (approximately $-V_L$) is held in the active layers of the non-selected memory cell 114[2,1,1] to the non-selected memory cell 114[$m_1$,$m_2$,1] during the writing operation. A potential $-V_H$ is applied to the gates of the non-selected memory cell 114[2,1,1] to the non-selected memory cell 114[$m_1$,$m_2$,1]. Accordingly, in each of the non-selected memory cell 114[2,1,1] to the non-selected memory cell 114[$m_1$,$m_2$,1], the generation of a negative large potential difference between the gate and the active layer can be prevented; thus, an error in writing can be prevented.

Next, an operation of the non-selected memory cell 114[2,1,2] to the non-selected memory cell 114[$m_1$,$m_2$,$m_3$] will be described. The application of the above-described potentials to the wirings turns off the selection transistor 116a[2,1] to the selection transistor 116a[$m_1$,$m_2$] and the selection transistor 116b[2,1] to the selection transistor 116b[$m_1$,$m_2$]. Thus, the precharge potential in the period t5 (approximately $-V_L$) is held in the active layers of the non-selected memory cell 114[2,1,2] to the non-selected memory cell 114[$m_1$,$m_2$,$m_3$] during the writing operation. A potential $-V_L$ is applied to the gates of the non-selected memory cell 114[2,1,2] to the non-selected memory cell 114[$m_1$,$m_2$,$m_3$]. Accordingly, in each of the non-selected memory cell 114[2,1,2] to the non-selected memory cell 114[$m_1$,$m_2$,$m_3$], the generation of a negative large potential difference between the gate and the active layer can be prevented; thus, an error in writing can be prevented.

Next, the potentials applied to the wirings in the period t8 for returning the precharge potentials in the period t5 will be described.

As shown in FIG. 28, in the period t8, a potential $+V_L$ is applied to the string selection line SSL[1] to the string selection line SSL[$m_1$], and a potential 0 is applied to the bit line BL[1] to the bit line BL[$m_2$] and the source line SL[1] to the source line SL[$m_2$]. Thus, the selection transistor 116a[1,1] to the selection transistor 116a[$m_1$,$m_2$] and the selection transistor 116b[1,1] to the selection transistor 116b[$m_1$,$m_2$] are turned on.

A potential 0 is applied to the word line WL[1] to the word line WL[$m_3$]. Thus, in each of the memory cell 114[1,1,1] to the memory cell 114[$m_1$,$m_2$,$m_3$], a large potential difference is not generated between the gate and the active layer, and the memory cells are turned on. Accordingly, the potentials of the active layers of the memory cells are returned to 0 and an error in writing can be prevented.

Note that the time for which the precharge potential is held depends on the leakage current in the off state of the selection transistor 116a and the selection transistor 116b. If the time for which the precharge potential is held is substantially the equal to the writing time, returning the precharge potential in the period t8 may be omitted.

(Reading Operation)

In a period from the start of a period t10 to the end of a period t11 in FIG. 28, data written to the selected memory cell 114[1,1,1] is read. The period t10 is a period for reading data written to the selected memory cell 114[1,1,1]. The period t11 is a period for returning the potential of each wiring to 0.

The potentials applied to the wirings in the period t10 for reading data written to the selected memory cell 114[1,1,1] will be described.

As illustrated in FIG. 28, in the period t10, a potential $+V_r$ is applied to the string selection line SSL[1] and the source line SL[1] to turn on the selection transistor 116a[1,1] and the selection transistor 116b[1,1]. Furthermore, a potential 0 is applied to the word line WL[1], and a potential $+V_r$ is applied to the word line WL[2] to the word line WL[$m_3$].

In the case where data "1" is written to the memory cell 114[1,1,1], the application of the above-described potentials to the wirings turns off the memory string 112[1,1] and brings the bit line BL[1] to a potential 0. Furthermore, in the case where data "0" is written to the memory cell 114[1,1,1], the application of the above-described potentials to the wirings turns on the memory string 112[1,1] and increases the potential of the bit line BL[1]. The sense amplifier 123 senses the potential of the bit line BL[1] and amplifies it. Through the above process, data of the memory cell 114[1,1,1] can be read.

The structures described in this embodiment can be used in an appropriate combination with the structures described in the other embodiments.

Embodiment 3

Although the memory cell 114a and the memory cell 114b are electrically connected to each other through the conductor 706 in the memory string 112 included in the semiconductor device illustrated in FIG. 1, the embodiment is not limited to this. For example, a transistor may be provided between the memory cell 114a and the memory cell 114b. In this embodiment, a structure, a circuit configuration, and an operation of the semiconductor device including the memory string 112 where a transistor is provided between the memory cell 114a and the memory cell 114b will be described with reference to FIG. 29 to FIG. 33.

(Memory Cell 114, Memory String 112)

The structure of the semiconductor device including the memory string 112 according to one embodiment of the present invention will be described with reference to FIG. 29. FIG. 29(A) is a top view of a semiconductor device including the memory string 112. FIG. 29(B) is a cross-sectional view of a portion indicated by a dashed-dotted line A1-A2 in FIG. 29(A). Furthermore, FIG. 29(C) is a cross-sectional view of a portion indicated by a dashed-dotted line A3-A4 in FIG. 29(A). Note that in the following description, a rectangular coordinate system using an x-axis, a y-axis, and a z-axis is set as illustrated in FIG. 29 for the sake of convenience. Here, the x-axis and the y-axis are parallel to the top surface of the base 720 provided with the memory string 112 and the z-axis is perpendicular to the top surface of the base 720.

Note that in the semiconductor device illustrated in FIG. 29, components having the same functions as the components in the semiconductor device described in the above embodiments are denoted by the same reference numerals.

The structure of the semiconductor device is described below with reference to FIG. 29. Note that in this section, the materials described in detail in the above embodiments can be used as materials of the components of the semiconductor device.

The semiconductor device of one embodiment of the present invention includes the memory string 112, an insulating film 752 functioning as an interlayer film, an insulating film 761, an insulating film 762, an insulating film 763, the insulating film 721, the insulating film 724, the insulating film 726, the insulating film 728, and the insulating film 729. The semiconductor device further includes conductors 734a (a conductor 734a_1 to a conductor 734a_m (m is a natural number greater than or equal to 2)), conductors 734b (a conductor 734b_1 to a conductor 734b_m), the conductors 736 (the conductor 736a and the conductor 736b), the conductors 744 (the conductor 744a and the conductor 744b), and the conductor 748, which are electrically connected to the memory string 112 and function as wirings, and conductors 757 (a conductor 757a and a conductor 757b), conductors 730a (a conductor 730a_1 to a conductor 730a_m), conductors 730b (a conductor 730b_1 to a conductor 730b_m), the conductors 732 (the conductor 732a and the conductor 732b), and the conductor 746, which function as plugs.

In the memory string 112 included in the semiconductor device illustrated in FIG. 1, the string formed of the plurality of memory cells 114a and the selection transistor 116a and the string formed of the plurality of memory cells 114b and the selection transistor 116b are electrically connected to each other through the conductor 706. In contrast, in the memory string 112 included in the semiconductor device illustrated in FIG. 29, the string formed of the plurality of memory cells 114a and the selection transistor 116a and the string formed of the plurality of memory cells 114b and the selection transistor 116b are electrically connected to each other through a transistor 118. That is, the memory string 112 illustrated in FIG. 29 is different from the memory string 112 illustrated in FIG. 1 in including the transistor 118 between two strings.

Furthermore, the semiconductor device illustrated in FIG. 29 is different from the semiconductor device illustrated in FIG. 1 in performing wiring with alternately arranged word lines. Specifically, as illustrated in FIG. 29, the conductor 734a and the conductor 734b are alternately arranged in the y-axis direction. Furthermore, the conductor 730a_1 to the conductor 730a_m are electrically connected to the conductor 734a_1 to the conductor 734a_m, respectively, and the conductor 730b_1 to the conductor 730b_m are electrically connected to the conductor 734b_1 to the conductor 734b_m, respectively. By performing wiring with the alternately arranged conductors 734a and 734b functioning as part of the word line, the word line shared by two strings can be separated.

The memory string 112 according to one embodiment of the present invention includes the selection transistor 116a, the selection transistor 116b, the memory cell 114a, the memory cell 114b, and the transistor 118. Note that the transistor 118 is mainly described below with reference to FIG. 30, and the description of the above embodiments can be referred to for the selection transistor 116a, the selection transistor 116b, and the memory cell 114 (the memory cell 114a and the memory cell 114b).

An enlarged view of the transistor 118 and a region in the vicinity thereof included in the semiconductor device illustrated in FIG. 29 is illustrated in FIG. 30. FIG. 30(A) is a top view of the transistor 118 and a region in the vicinity thereof. FIG. 30(B) is a cross-sectional view of a portion indicated by a dashed-dotted line A1-A2 in FIG. 30(A). FIG. 30(C) is a cross-sectional view of a portion indicated by a dashed-dotted line A3-A4 in FIG. 30(A). Note that in the following description, a rectangular coordinate system using an x-axis, a y-axis, and a z-axis is set as illustrated in FIG. 30 for the sake of convenience.

The transistor 118 illustrated in FIG. 30 includes a conductor 751 provided over the base 720, an insulator 753 provided over the conductor 751, an oxide 754 provided over the insulator 753, and conductors 756 (a conductor 756a and a conductor 756b) provided over the oxide 754.

The conductor 751 functions as a gate of the transistor 118. For the conductor 751, a material that is the same as or different from that of the conductors 701 may be used. Furthermore, the conductor 751 is determined depending on the usage in consideration of the work function and the like.

The insulator 753 functions as a gate insulating film of the transistor 118. For the insulator 753, silicon oxide or silicon oxynitride is preferably used. Aluminum oxide, hafnium oxide, or an oxide containing aluminum and hafnium may be used. Alternatively, a stack of any of these materials may be used for the insulator 753.

The oxide 754 functions as a channel formation region of the transistor 118. As the oxide 754, a metal oxide functioning as an oxide semiconductor (hereinafter also referred to as an oxide semiconductor) is preferably used. The oxide semiconductor is preferable because a transistor including the oxide semiconductor can have more favorable switching characteristics and extremely lower off-state current than a transistor including a semiconductor made of silicon or the like.

The conductors 756 functions as a source electrode or a drain electrode. For the conductors 756, a material that is the same as or different from that of the conductor 706 may be used.

A metal compound layer containing the metal element contained in the conductors 756 and the component of the oxide 754 is preferably formed at the interface between the conductors 756 and the oxide 754. Formation of the metal compound is preferable because the contact resistance between the conductors 756 and the oxide 754 can be reduced. Alternatively, oxygen contained in the oxide 754 is absorbed by the conductors 756 and the resistance of the oxide 754 in the vicinity of the interface between the conductors 756 and the oxide 754 is reduced, whereby the contact resistance between the conductors 756 and the oxide 754 can be reduced.

The conductors 757 function as plugs. Furthermore, the conductor 757a and the conductor 757b are electrically connected to the conductor 756a and the conductor 756b, respectively. For the conductors 757, a material similar to that of the conductors 701 can be used.

As illustrated in FIG. 30, the conductor 756a and the conductor 756b are preferably arranged over the same oxide 754 so as not to be adjacent to each other in the x-axis direction and not to be adjacent to each other in the y-axis direction. Furthermore, the conductor 757a and the conductor 757b are electrically connected to electrically separated conductors 706. As a result, different potentials can be applied to the gate of the selection transistor 116a provided above the conductor 757a and the gate of the selection transistor 116b provided above the conductor 757b.

For the insulating film 752, the insulating film 761, and the insulating film 763 functioning as interlayer films, a material having a low dielectric constant is preferably used. When a material having a low dielectric constant is used for an interlayer film, the parasitic capacitance generated between wirings can be reduced.

For example, as the insulating film 752, the insulating film 761, and the insulating film 763, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), $(Ba,Sr)TiO_3$ (BST), or the like can be used. In addition, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. A layer of silicon oxide, silicon oxynitride, or silicon nitride may be stacked over the insulators.

Moreover, the insulating film 762 preferably functions as a barrier film which prevents diffusion of impurities such as water or hydrogen from below the insulating film toward the memory cell 114 side. Accordingly, for the insulating film 762, it is preferable to use an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom (an insulating material which does not easily transmit the above impurities). Alternatively, an insulating material having a function of inhibiting diffusion of oxygen (e.g., at least one of oxygen atoms, oxygen molecules, and the like) (an insulating material which does not easily transmit the above oxygen).

For example, aluminum oxide, silicon nitride, or the like is preferably used for the insulating film 762. Thus, impurities such as water or hydrogen can be prevented from diffusing to an area above the insulating film 762 (the memory cell 114 side). For the insulating film 762, the same material as that of the insulating film 752 or the like may be used.

Note that the insulating film 752, the insulating film 761, the insulating film 762, and the insulating film 763 may have a stacked-layer structure of two or more layers. The stacked-layer structure is not limited to one formed of the same material and may be one formed of different materials.

(Configuration Example of 3D NAND)

For details of a configuration example of a 3D NAND in one embodiment of the present invention, the description of the configuration example of the 3D NAND illustrated in FIG. 25(A) can be referred to.

Figure 31:
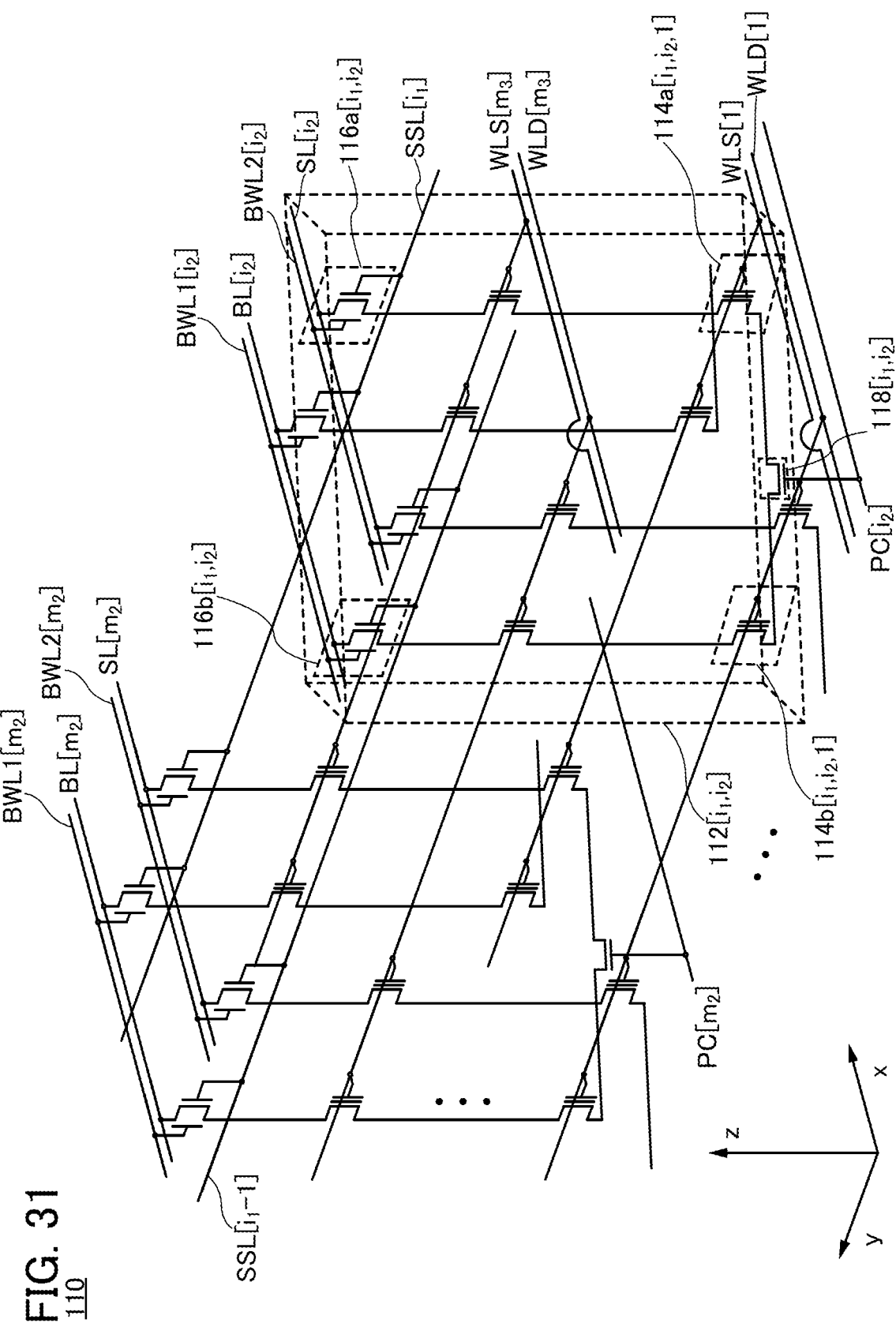
FIG. 31 A view illustrating a configuration example of a three-dimensional structure of a memory cell array of one embodiment of the present invention.

FIG. 31 illustrates an example of a three-dimensional structure of the memory cell array 110. FIG. 31 is a view schematically illustrating the example of the three-dimensional structure of the memory cell array 110 in the form of a circuit diagram. Note that in the following description, rectangular coordinates using an x-axis, a y-axis, and a z-axis are set as illustrated in FIG. 31 for the sake of convenience.

As illustrated in FIG. 31, the memory cell array 110 includes $(m_1-1) \times m_2$ ($m_1$ and $m_2$ are natural numbers greater than or equal to 2) memory strings 112, where $(m_1-1)$ memory strings 112 and $m_2$ memory strings 112 are arranged in the x-axis direction and the y-axis direction, respectively, in a matrix. Furthermore, each of the memory strings 112 includes two strings and the transistor 118 which are electrically connected to each other. One of the strings includes $m_3$ ($m_3$ is a natural number greater than or equal to 2) memory cells 114a, where the $m_3$ memory cells are arranged in the z-axis direction. The other string includes $m_3$ memory cells 114b, where the $m_3$ memory cells are arranged in the z-axis direction. In other words, the memory cell array 110 includes $(m_1-1) \times m_2 \times m_3$ memory cells 114a and $(m_1-1) \times m_2 \times m_3$ memory cells 114b, where $2 \times (m_1-1)$ memory cells, $m_2$ memory cells, and $m_3$ memory cells are arranged in the x-axis direction, the y-axis direction, and the z-axis direction, respectively, to have a rectangular solid shape. Hereinafter, using the coordinates, the memory cells 114a and the memory cells 114b may be represented as the memory cell $114a[1,1,1]$ to the memory cell $114a[m_1-1,m_2,m_3]$ and the memory cell $114b[1,1,1]$ to the memory cell $114b[m_1-1,m_2,m_3]$.

Furthermore, as illustrated in FIG. 31, the memory cell array 110 includes $m_1$ string selection lines SSL provided to extend in the y-axis direction; $m_2$ bit lines BL, $m_2$ source lines SL, $m_2$ wirings BWL1, $m_2$ wirings BWL2, and $m_2$ wirings PC provided to extend in the x-axis direction; and $m_3$ word lines WLS and $m_3$ word lines WLD provided to extend in the x-axis direction.

Hereinafter, using the coordinate of the x-axis direction, the string selection lines SSL may be represented as the string selection line SSL[1] to the string selection line SSL[$m_1$]. Moreover, using the coordinate of the y-axis direction, the bit lines BL, the source lines SL, the wirings BWL1, the wirings BWL2, and the wirings PC may be represented as the bit line BL[1] to the bit line BL[$m_2$], the source line SL[1] to the source line SL[$m_2$], the wiring BWL1[1] to the wiring BWL1[$m_2$], the wiring BWL2[1] to the wiring BWL2[$m_2$], and the wiring PC[1] to the wiring PC[$m_2$]. In addition, using the z-axis direction coordinate, the word lines WLS and the word lines WLD may be represented as the word line WLS[1] to the word line WLS[$m_3$] and the word line WLD[1] to the word line WLD[$m_3$].

As illustrated in FIG. 31, the memory cell array 110 includes $(m_1-1) \times m_2$ memory strings 112 arranged in a matrix in the x-axis direction and the y-axis direction. Hereinafter, using the coordinates of the x-axis direction and the y-axis direction, the memory strings 112 may be represented as the memory string 112[1,1] to the memory string 112[$m_1-1,m_2$]. Each of the memory strings 112 includes two strings and the transistor 118 which are electrically connected to each other. One of the strings includes $m_3$ memory cells 114a and the selection transistor 116a arranged in the z-axis direction, and the other string includes $m_3$ memory cells 114b and the selection transistor 116b arranged in the z-axis direction. Hereinafter, using the coordinates of the x-axis direction and the y-axis direction, the selection transistor 116a and the selection transistor 116b may be represented as the selection transistor 116a[1,1] to the selection transistor 116a[$m_1-1,m_2$] and the selection transistor 116b [1,1] to the selection transistor 116b[$m_1-1,m_2$]. Moreover, using the coordinates of the x-axis direction and the y-axis direction, the transistor 118 may be represented as the transistor 118[1,1] to the transistor 118[$m_1-1,m_2$].

The selection transistor 116a, the selection transistor 116b, the memory cell 114a, and the memory cell 114b are each a transistor whose channel is formed of a metal oxide as mentioned above. The memory cell 114a and the memory cell 114b include a charge accumulation layer and form nonvolatile memory cells.

Figure 32:
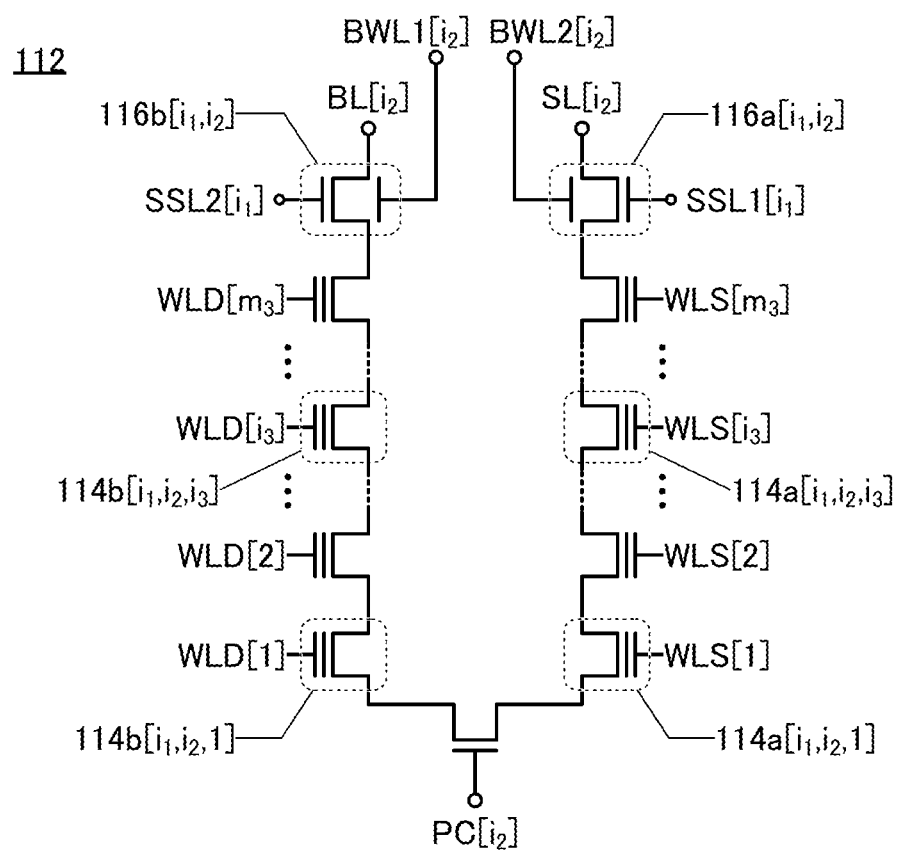
FIG. 32 A circuit diagram illustrating a configuration example of a memory string of one embodiment of the present invention.

FIG. 32 illustrates a circuit configuration example of a memory string 112[$i_1,i_2$] ($i_1$ is a natural number greater than or equal to 1 and less than or equal to $m_1-1$ and $i_2$ is a natural number greater than or equal to 1 and less than or equal to $m_2$). In the memory string 112[$i_1,i_2$], the selection transistor 116a[$i_1,i_2$], the memory cell 114a[$i_1,i_2$,1] to the memory cell 114a[$i_1,i_2,m_3$], the transistor 118[$i_1,i_2$], the memory cell 114b[$i_1,i_2$,1] to the memory cell 114b[$i_1,i_2,m_3$], and the selection transistor 116b[$i_1,i_2$] are electrically connected in series between the bit line BL[$i_2$] and the source line SL[$i_2$].

As illustrated in FIG. 32, a gate of the selection transistor 116a[$i_1,i_2$] is electrically connected to a string selection line SSL1[$i_1$]. Furthermore, a second gate electrode of the selection transistor 116a[$i_1,i_2$] is electrically connected to the wiring BWL2[$i_2$]. One of a source and a drain of the selection transistor 116a[$i_1,i_2$] is electrically connected to the source line SL[$i_2$].

Furthermore, a gate of the selection transistor 116b[$i_1,i_2$] is electrically connected to a string selection line SSL2[$i_1$]. Furthermore, a second gate electrode of the selection transistor 116b[$i_1,i_2$] is electrically connected to the wiring BWL1[$i_2$]. One of a source and a drain of the selection transistor 116a[$i_1,i_2$] is electrically connected to the bit line BL[$i_2$].

Although the string selection line SSL connected to the gate of the selection transistor 116a[$i_1,i_2$] and the string selection line SSL connected to the gate of the selection transistor 116b[$i_1,i_2$] are separately denoted by the string selection line SSL1[$i_1$] and the string selection line SSL2[$i_1$] for the sake of convenience, they may have a shared wiring function in terms of circuit operation or their functions may be interchanged in some cases. This is similar to exchanging the functions of a source and a drain of a transistor, for example. The gate of the selection transistor 116a[$i_1,i_2$] whose source or drain is connected to the source line SL[$i_2$] is connected to the string selection line SSL[$i_1$]. Furthermore, the gate of the selection transistor 116b[$i_1+1,i_2$] whose source or drain is connected to the bit line BL[$i_2$] is connected to the string selection line SSL[$i_1$]. Thus, the string selection line SSL[$i_1$] serves as the string selection line SSL1 for the selection transistor 116a[$i_1,i_2$] and also serves as the string selection line SSL2 for the selection transistor 116b[$i_1+1,i_2$]. Using the coordinate of the x-axis direction, the string selection line SSL1 and the string selection line SSL2 may be represented as the string selection line SSL1[1] to the string selection line SSL1[$m_1-1$] and the string selection line SSL2[1] to the string selection line SSL2[$m_1-1$].

The memory cell is connected to one of the word line WLS and the word line WLD. As illustrated in FIG. 32, the word line electrically connected to the gate of the memory cell 114a[$i_1,i_2,i_3$] ($i_3$ is a natural number greater than or equal to 1 and less than or equal to $m_3$) is denoted by the word line WLS[$i_3$]. Furthermore, the word line electrically connected to the gate of the memory cell 114b[$i_1,i_2,i_3$] is denoted by the word line WLD[$i_3$].

As illustrated in FIG. 32, the memory cell 114a[$i_1,i_2$,1] to the memory cell 114a[$i_1,i_2,m_3$] which form the memory string 112[$i_1,i_2$] are serially connected in the z-axis direction, and the memory cell 114b[$i_1,i_2$,1] to the memory cell 114b [$i_1,i_2,m_3$] which form the memory string 112[$i_1,i_2$] are serially connected in the z-axis direction. Accordingly, only the memory cell 114a[$i_1,i_2,m_3$] is connected to the selection transistor 116a[$i_1,i_2$] without any other memory cells in between, and only the memory cell 114b[$i_1,i_2,m_3$] is connected to the selection transistor 116b[$i_1,i_2$] without any other memory cells in between. The other memory cells 114 are electrically connected to the selection transistor 116a[$i_1,i_2$] and the selection transistor 116b[$i_1,i_2$] through the other memory cells 114 of the same memory string 112[$i_1,i_2$].

Thus, the memory string 112 includes the plurality of memory cells 114a and the plurality of memory cells 114b, and stacking can be performed so that the memory cells 114a are serially connected and the memory cells 114b are serially connected. The memory string 112 can increase storage capacity of the memory string 112 in accordance with the number of stacked memory cells 114a and 114b. As a result, the memory cell array 110 formed of the plurality of memory strings 112 can increase storage capacity per unit area in accordance with the number of stacked memory cells 114a and 114b.

(Description of Circuit Operation of Memory Device)

Next, data writing and reading operations of the memory cell 114 will be described with reference to FIG. 33. For the Ids-Vgs characteristics of the selection transistor 116a, the selection transistor 116b, the memory cell 114 (the memory cell 114a and the memory cell 114b) illustrated in FIG. 29, the Ids-Vgs characteristics shown in FIG. 27 can be referred to.

In the memory cell array 110 formed of the transistors having the Ids-Vgs characteristics shown in FIG. 27, a memory rewriting and reading method for the memory cell 114b[1,1,1] will be described with reference to FIG. 33.

Note that although an example of single-level-cell (SLC) is shown in this embodiment, a multilevel memory cell may be formed.

Furthermore, for example, potentials for controlling the threshold voltage of the selection transistors are applied to the wiring BWL1 and the wiring BWL2 which are connected to the second gate electrodes of the selection transistor 116b and the selection transistor 116a, respectively, or the wiring BWL1 and the wiring BWL2 are brought into a floating state so as to hold charges.

Note that since the gate of the memory cell 114a[$i_1,i_2,i_3$] and the gate of the memory cell 114b[$i_1,i_2,i_3$] do not share a word line in the memory string 112[$i_1,i_2$], the memory cell 114a[$i_1,i_2,i_3$] and the memory cell 114b[$i_1,i_2,i_3$] can store different data. This can increase storage capacity as compared with the case where the gate of the memory cell 114a[$i_1,i_2,i_3$] and the gate of the memory cell 114b[$i_1,i_2,i_3$] share a word line.

Note that in the memory string 112[$i_1,i_2$], the gate of the memory cell 114a[$i_1,i_2,i_3$] and the gate of the memory cell 114b[$i_1,i_2,i_3$] may share a word line. With this structure, the memory cell 114a[$i_1,i_2,i_3$] and the memory cell 114b[$i_1,i_2,i_3$] store the same data, which can increase the redundancy of the storage data and improve the reliability such as memory retention characteristics. Alternatively, they may store different data to increase storage capacity.

Figure 33:
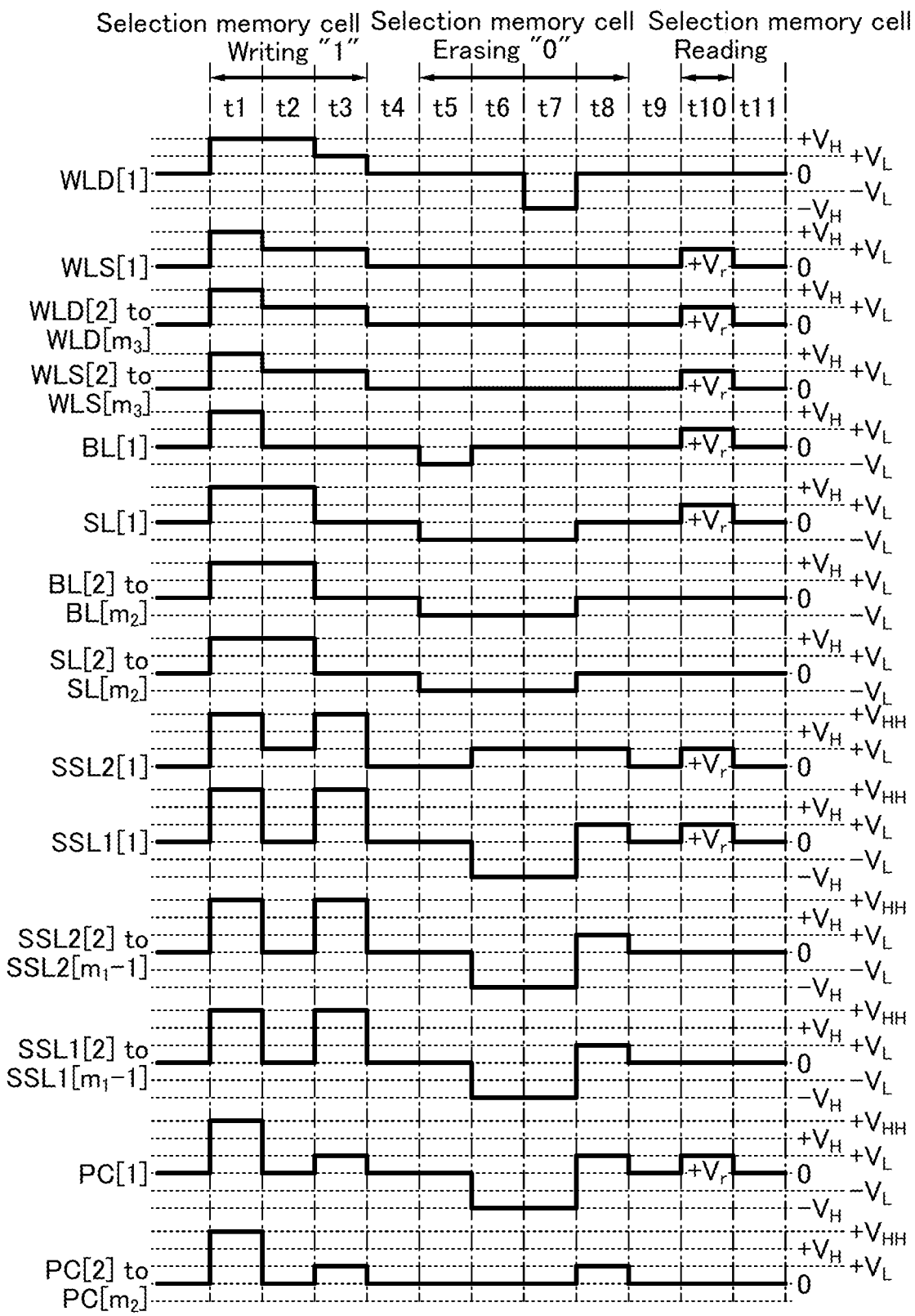
FIG. 33 A timing chart illustrating a driving method of a memory device of one embodiment of the present invention.

An example of a timing chart of the case where data "1" or data "0" is written to the memory cell 114b[1,1,1] and the case where reading is performed is shown in FIG. 33. The timing chart shown in FIG. 33 shows a relation between potentials of the wirings in writing, erasing, and reading in the memory cell 114b[1,1,1]. Writing in the memory cell 114b[1,1,1] is an operation of writing data "1" to the memory cell 114b[1,1,1]. Erasing in the memory cell 114b[1,1,1] is an operation of writing data "0" to the memory cell 114b[1,1,1]. Reading in the memory cell 114b[1,1,1] is an operation of reading data written to the memory cell 114b[1,1,1].

Note that the memory cell 114b[1,1,1] which conducts writing, erasing, and reading may be referred to as the selected memory cell or the selected memory cell 114b[1,1,1]. The memory cells 114 except the selected memory cell 114b[1,1,1] may be referred to as the non-selected memory cells 114. The memory string 112[1,1] including the selected memory cell 114b[1,1,1] may be referred to as the selected memory string 112[1,1]. The memory strings 112 except the selected memory string 112[1,1] may be referred to as the non-selected memory strings 112.

(Writing Operation)

In a period from the start of a period t1 to the end of a period t4 in FIG. 33, data "1" is written to the selected memory cell 114b[1,1,1]. The period t1 is a period for preventing an error in rewriting in the non-selected memory cells 114. A period t2 is a period for writing data "1" to the selected memory cell 114b[1,1,1]. A period t3 is a period for returning the precharge potential in the period t1. The period t4 is a period for returning the potential of each wiring to 0.

The potentials applied to the wirings in the period t1 for preventing an error in rewriting in the non-selected memory cells 114 will be described.

First, a potential +$V_{HH}$ is applied to the string selection line SSL1[1] to the string selection line SSL1[$m_1$-1] to turn on the selection transistor 116a[1,1] to the selection transistor 116a[$m_1$-1,$m_2$]. Furthermore, a potential +$V_{HH}$ is applied to the string selection line SSL2[1] to the string selection line SSL2[$m_1$-1] to turn on the selection transistor 116b[1,1] to the selection transistor 116b[$m_1$-1,$m_2$]. In addition, a potential +$V_{HH}$ is applied to the wiring PC[1] to the wiring PC[$m_2$] to turn on the transistor 118[1,1] to the transistor 118[$m_1$-1,$m_2$]. In the above-described manner, the memory string 112[1,1] to the memory string 112[$m_1$-1,$m_2$] are turned on.

Then, a potential +$V_H$ is applied to the bit line BL[1] to the bit line BL[$m_2$] and the source line SL[1] to the source line SL[$m_2$] to precharge the active layers of the non-selected memory cells 114 with the potential +$V_H$. At this time, a potential +$V_H$ is applied to the word line WLS[1] to the word line WLS[$m_3$] which are electrically connected to the gates of the memory cells 114a and the word line WLD[1] to the word line WLD[$m_3$] which are electrically connected to the gates of the memory cells 114b, so that the memory cell 114a[1,1,1] to the memory cell 114a[$m_1$-1,$m_2$,$m_3$] and the memory cell 114b[1,1,1] to the memory cell 114b[$m_1$-1,$m_2$,$m_3$] are turned on. In the above-described manner, the occurrence of a large difference in potential between the potential applied to the gates of the non-selected memory cells 114 and the potential applied to the active layers of the non-selected memory cells 114 can be prevented in the period t2; thus, an error in rewriting can be prevented.

Next, the potentials applied to the wirings in the period t2 for writing data "1" to the selected memory cell 114b[1,1,1] and preventing an error in rewriting in the non-selected memory cells 114 will be described.

As shown in FIG. 33, in the period t2, a potential +$V_L$ is applied to the string selection line SSL2[1], and a potential 0 is applied to the string selection line SSL1[1] to the string selection line SSL1[$m_1$-1] and the string selection line SSL2[2] to the string selection line SSL2[$m_1$-1]. Furthermore, a potential 0 is applied to the bit line BL[1], and a potential +$V_H$ is applied to the bit line BL[2] to the bit line BL[$m_2$] and the source line SL[1] to the source line SL[$m_2$]. Moreover, a potential +$V_H$ is applied to the word line WLD[1], and a potential +$V_L$ is applied to the word line WLS[1] to the word line WLS[$m_3$] and the word line WLD[2] to the word line WLD[$m_3$]. Furthermore, a potential 0 is applied to the wiring PC[1] to the wiring PC[$m_2$], so that each memory string 112 is divided into two strings.

First, an operation of the selected memory cell 114b[1,1,1] will be described. The application of the above-described potentials to the wirings turns on the selection transistor 116b[1,1]. Furthermore, a potential +$V_H$ is applied to the gate of the selected memory cell 114b[1,1,1], and a potential 0 is applied to the active layer of the selected memory cell 114b[1,1,1]. The application of a high voltage of positive polarity between the gate and the active layer causes injection of electrons to the charge accumulation layer through the tunnel insulating film and thus can write data "1" to the selected memory cell 114b[1,1,1].

Next, an operation of the non-selected memory cell 114b[1,1,2] to the non-selected memory cell 114b[1,1,$m_3$] will be described. The application of the above-described potentials to the wirings turns on the selection transistor 116b[1,1]. Furthermore, a potential +$V_L$ is applied to the gates of the non-selected memory cell 114b[1,1,2] to the non-selected memory cell 114b[1,1,$m_3$], and a potential 0 is applied to the active layers of the non-selected memory cell 114b[1,1,2] to the non-selected memory cell 114b[1,1,$m_3$]. Accordingly, in each of the non-selected memory cell 114b[1,1,2] to the non-selected memory cell 114b[1,1,$m_3$], the generation of a positive large potential difference between the gate and the active layer can be prevented; thus, an error in writing can be prevented.

Next, an operation of the non-selected memory cell 114b[1,2,1] to the non-selected memory cell 114b[1,$m_2$,1] will be described. The application of the above-described potentials to the wirings turns off the selection transistor 116b[1,2] to the selection transistor 116b[1,$m_2$]. Thus, the precharge potential in the period t1 (approximately +$V_H$) is held in the active layers of the non-selected memory cell 114b[1,2,1] to the non-selected memory cell 114b[1,$m_2$,1] during the writing operation. A potential +$V_H$ is applied to the gates of the non-selected memory cell 114b[1,2,1] to the non-selected memory cell 114b[1,$m_2$,1]. Accordingly, in each of the non-selected memory cell 114b[1,2,1] to the non-selected memory cell 114b[1,$m_2$,1], the generation of a positive large potential difference between the gate and the active layer can be prevented; thus, an error in writing can be prevented.

Next, an operation of the non-selected memory cell 114*b* [1,2,2] to the non-selected memory cell 114*b*[1,$m_2$,$m_3$] will be described. The application of the above-described potentials to the wirings turns off the selection transistor 116*b*[1,2] to the selection transistor 116*b*[1,$m_2$]. Thus, the precharge potential in the period t1 (approximately +$V_H$) is held in the active layers of the non-selected memory cell 114*b*[1,2,2] to the non-selected memory cell 114*b*[1,$m_2$,$m_3$] during the writing operation. A potential +$V_L$ is applied to the gates of the non-selected memory cell 114*b*[1,2,2] to the non-selected memory cell 114*b*[1,$m_2$,$m_3$]. Accordingly, in each of the non-selected memory cell 114*b*[1,2,2] to the non-selected memory cell 114*b*[1,$m_2$,$m_3$], the generation of a positive large potential difference between the gate and the active layer can be prevented; thus, an error in writing can be prevented.

Next, an operation of the non-selected memory cell 114*b* [2,1,1] to the non-selected memory cell 114*b*[$m_1$–1,$m_2$,1] will be described. The application of the above-described potentials to the wirings turns off the selection transistor 116*b*[2,1] to the selection transistor 116*b*[$m_1$–1,$m_2$]. Thus, the precharge potential in the period t1 (approximately +$V_H$) is held in the active layers of the non-selected memory cell 114*b*[2,1,1] to the non-selected memory cell 114*b*[$m_1$–1,$m_2$,1] during the writing operation. A potential +$V_H$ is applied to the gates of the non-selected memory cell 114*b*[2,1,1] to the non-selected memory cell 114*b*[$m_1$–1,$m_2$,1]. Accordingly, in each of the non-selected memory cell 114*b*[2,1,1] to the non-selected memory cell 114*b*[$m_1$–1,$m_2$,1], the generation of a positive large potential difference between the gate and the active layer can be prevented; thus, an error in writing can be prevented.

Next, an operation of the non-selected memory cell 114*b* [2,1,2] to the non-selected memory cell 114*b*[$m_1$–1,$m_2$,$m_3$] will be described. The application of the above-described potentials to the wirings turns off the selection transistor 116*b*[2,1] to the selection transistor 116*b*[$m_1$–1,$m_2$]. Thus, the precharge potential in the period t1 (approximately +$V_H$) is held in the active layers of the non-selected memory cell 114*b*[2,1,2] to the non-selected memory cell 114*b*[$m_1$–1,$m_2$,$m_3$] during the writing operation. A potential +$V_L$ is applied to the gates of the non-selected memory cell 114*b*[2,1,2] to the non-selected memory cell 114*b*[$m_1$–1,$m_2$,$m_3$]. Accordingly, in each of the non-selected memory cell 114*b*[2,1,2] to the non-selected memory cell 114*b*[$m_1$–1,$m_2$,$m_3$], the generation of a positive large potential difference between the gate and the active layer can be prevented; thus, an error in writing can be prevented.

Next, an operation of the non-selected memory cell 114*a* [1,1,1] to the non-selected memory cell 114*a*[$m_1$–1,$m_2$,$m_3$] will be described. The application of the above-described potentials to the wirings turns off the selection transistor 116*a*[1,1] to the selection transistor 116*a*[$m_1$–1,$m_2$]. Thus, the precharge potential in the period t1 (approximately +$V_H$) is held in the active layers of the non-selected memory cell 114*a*[1,1,1] to the non-selected memory cell 114*a*[$m_1$–1,$m_2$,$m_3$] during the writing operation. A potential +$V_L$ is applied to the gates of the non-selected memory cell 114*a*[1,1,1] to the non-selected memory cell 114*a*[$m_1$–1,$m_2$,$m_3$]. Accordingly, in each of the non-selected memory cell 114*a*[1,1,1] to the non-selected memory cell 114*a*[$m_1$–1,$m_2$,$m_3$], the generation of a positive large potential difference between the gate and the active layer can be prevented; thus, an error in writing can be prevented.

Next, the potentials applied to the wirings in the period t3 for returning the precharge potentials in the period t1 will be described.

As shown in FIG. 33, in the period t3, a potential +$V_{HH}$ is applied to the string selection line SSL1[1] to the string selection line SSL1[$m_1$–1] and the string selection line SSL2[1] to the string selection line SSL2[$m_1$–1]. Furthermore, a potential 0 is applied to the bit line BL[1] to the bit line BL[$m_2$] and the source line SL[1] to the source line SL[$m_2$]. Moreover, a potential +$V_L$ is applied to the word line WLS[1] to the word line WLS[$m_3$] and the word line WLD[1] to the word line WLD[$m_3$]. Furthermore, a potential +$V_L$ is applied to the wiring PC[1] to the wiring PC[$m_2$].

The application of the above-described potentials to the wirings turns on the selection transistor 116*a*[1,1] to the selection transistor 116*a*[$m_1$–1,$m_2$] and the selection transistor 116*b*[1,1] to the selection transistor 116*b*[$m_1$–1,$m_2$]. Thus, in the memory cell 114*a*[1,1,1] to the memory cell 114*a*[$m_1$–1,$m_2$,$m_3$] and the memory cell 114*b*[1,1,1] to the memory cell 114*b*[$m_1$–1,$m_2$,$m_3$], a large potential difference is not generated between the gate and the active layer. Accordingly, the potentials of the active layers of the memory cell 114*a*[1,1,1] to the memory cell 114*a*[$m_1$–1,$m_2$,$m_3$] and the memory cell 114*b*[1,1,1] to the memory cell 114*b*[$m_1$–1,$m_2$,$m_3$] are returned to 0 and an error in writing can be prevented.

Note that the time for which the precharge potential is held depends on the leakage current in the off state of the selection transistor 116*a* and the selection transistor 116*b*. If the time for which the precharge potential is held is substantially equal to the writing time, returning the precharge potential in the period t3 may be omitted.

(Erasing Operation)

In a period from the start of a period t5 to the end of a period t9 in FIG. 33, data "0" is written to the memory cell 114*b*[1,1,1]. The period t5 is a period for preventing an error in rewriting in the non-selected memory cell 114. A period t6 is a period for returning the precharge potential in the period t5 to 0 in only the selected memory string 112[1,1]. A period t7 is a period for writing data "0" to the selected memory cell 114*b*[1,1,1]. A period t8 is a period for returning the precharge potential in the period t5. The period t9 is a period for returning the potentials of the wirings to 0.

The potentials applied to the wirings in the period t5 for preventing an error in rewriting in the non-selected memory cell 114 will be described.

As shown in FIG. 33, in the period t5, a potential 0 is applied to the string selection line SSL1[1] to the string selection line SSL1[$m_1$–1] and the string selection line SSL2[1] to the string selection line SSL2[$m_1$–1]. Furthermore, a potential –$V_L$ is applied to the bit line BL[1] to the bit line BL[$m_2$] and the source line SL[1] to the source line SL[$m_2$]. Moreover, a potential 0 is applied to the word line WLS[1] to the word line WLS[$m_3$] and the word line WLD[1] to the word line WLD[$m_3$]. Furthermore, a potential 0 is applied to the wiring PC[1] to the wiring PC[$m_2$].

The application of the above-described potentials to the wirings turns on the selection transistor 116*a*[1,1] to the selection transistor 116*a*[$m_1$–1,$m_2$] and the selection transistor 116*b*[1,1] to the selection transistor 116*b*[$m_1$–1,$m_2$,$m_3$], to precharge the active layers of the non-selected memory cells 114 with a potential –$V_L$. Furthermore, the application of a potential 0 to the gates of the memory cell 114*a*[1,1,1] to the memory cell 114*a*[$m_1$–1,$m_2$,$m_3$] and the memory cell 114*b*[1,1,1] to the memory cell 114*b*[$m_1$–1,$m_2$,$m_3$] turns on the memory cell 114*a*[1,1,1] to the memory cell 114*a*[$m_1$–1,$m_2$,$m_3$] and the memory cell 114*b*[1,1,1] to the memory cell 114*b*[$m_1$–1,$m_2$,$m_3$]. In the above-described manner, the occurrence of a large difference in potential between the potential applied to the gates of the non-selected memory cells 114 and the potential applied to the active layers of the non-selected memory cells 114 can be prevented in the period t7; thus, an error in rewriting can be prevented.

The potentials applied to the wirings in the period t6 for returning the potentials of the active layers of the memory cells 114 in the selected memory string 112[1,1] to 0 will be described.

As shown in FIG. 33, in the period t6, a potential +$V_L$ is applied to the string selection line SSL2[1], and a potential −$V_H$ is applied to the string selection line SSL1[1] to the string selection line SSL1[$m_1$−1] and the string selection line SSL2[2] to the string selection line SSL2[$m_1$−1]. Furthermore, a potential 0 is applied to the bit line BL[1], and a potential −$V_L$ is applied to the bit line BL[2] to the bit line BL[$m_2$] and the source line SL[1] to the source line SL[$m_2$]. Moreover, a potential 0 is applied to the word line WLS[1] to the word line WLS[$m_3$] and the word line WLD[1] to the word line WLD[$m_3$]. Furthermore, an electricity −$V_H$ is applied to the wiring PC[1], and a potential 0 is applied to the wiring PC[2] to the wiring PC[$m_2$].

The application of the above-described potentials to the wirings turns on the selection transistor 116b[1,1] and the memory cell 114b[1,1,1] to the memory cell 114b[1,1,$m_3$] and return the potentials of the active layers of the memory cell 114b[1,1,1] to the memory cell 114b[1,1,$m_3$] to 0.

Although the application of the above-described potentials to the wirings turns on the selection transistor 116b[1,2] to the selection transistor 116b[1,$m_2$], owing to no potential difference between the sources and the drains, a potential −$V_L$ with which the active layers of the non-selected memory cell 114b[1,2,1] to the non-selected memory cell 114b[1,$m_2$,$m_3$] are precharged in the period t5 is held.

The application of the above-described potentials to the wirings turns off the selection transistor 116a[1,1] to the selection transistor 116a[$m_1$−1,$m_2$] and the selection transistor 116b[2,1] to the selection transistor 116b[$m_1$−1,$m_2$], so that a potential −$V_L$ with which the active layers of the non-selected memory cell 114a[1,1,1] to the non-selected memory cell 114a[$m_1$−1,$m_2$,$m_3$] and the memory cell 114b[2,1,1] to the memory cell 114b[$m_1$−1,$m_2$,$m_3$] are precharged in the period t5 is held.

Next, the potentials applied to the wirings in the period t7 for writing data "0" to the memory cell 114b[1,1,1] and preventing an error in rewriting in the non-selected memory cells 114 will be described.

As shown in FIG. 33, in the period t7, a potential +$V_L$ is applied to the string selection line SSL2[1], and a potential −$V_H$ is applied to the string selection line SSL2[2] to the string selection line SSL2[$m_1$−1] and the string selection line SSL1[1] to the string selection line SSL1[$m_1$−1]. Furthermore, a potential 0 is applied to the bit line BL[1], and a potential −$V_L$ is applied to the bit line BL[2] to the bit line BL[$m_2$] and the source line SL[1] to the source line SL[$m_2$]. Moreover, a potential −$V_H$ is applied to the word line WLD[1], and a potential 0 is applied to the word line WLS[1] to the word line WLS[$m_3$] and the word line WLD[2] to the word line WLD[$m_3$]. Furthermore, an electricity −$V_H$ is applied to the wiring PC[1], and a potential 0 is applied to the wiring PC[2] to the wiring PC[$m_2$].

First, an operation of the selected memory cell 114b[1,1,1] will be described. The application of the above-described potentials to the wirings turns on the selection transistor 116b[1,1]. Furthermore, the memory string 112[1,1] including the selected memory cell 114b[1,1,1] is divided into two strings. Furthermore, a potential −$V_H$ is applied to the gate of the selected memory cell 114b[1,1,1], and a potential 0 is applied to the active layer of the selected memory cell 114b[1,1,1]. The application of a high voltage of negative polarity between the gate and the active layer causes extraction of electrons trapped by the charge accumulation layer through the tunnel insulating film and thus can write data "0" to the selected memory cell 114b[1,1,1].

Next, an operation of the non-selected memory cell 114b[1,1,2] to the non-selected memory cell 114b[1,1,$m_3$] will be described. The application of the above-described potentials to the wirings turns on the selection transistor 116b[1,1]. Furthermore, a potential 0 is applied to the gates of the non-selected memory cell 114b[1,1,2] to the non-selected memory cell 114b[1,1,$m_3$], and a potential 0 is applied to the active layers of the non-selected memory cell 114b[1,1,2] to the non-selected memory cell 114b[1,1,$m_3$]. Accordingly, in each of the non-selected memory cell 114b[1,1,2] to the non-selected memory cell 114b[1,1,$m_3$], the generation of a negative large potential difference between the gate and the active layer can be prevented; thus, an error in writing can be prevented.

Next, an operation of the non-selected memory cell 114b[1,2,1] to the non-selected memory cell 114b[1,$m_2$,1] will be described. The application of the above-described potentials to the wirings turns on the selection transistor 116b[1,2] to the selection transistor 116b[1,$m_2$]. A potential −$V_H$ is applied to the gates of the non-selected memory cell 114b[1,2,1] to the non-selected memory cell 114b[1,$m_2$,1], and a potential −$V_L$ is applied to the active layers of the non-selected memory cell 114b[1,2,1] to the non-selected memory cell 114b[1,$m_2$,1]. Accordingly, in each of the non-selected memory cell 114b[1,2,1] to the non-selected memory cell 114b[1,$m_2$,1], the generation of a negative large potential difference between the gate and the active layer can be prevented; thus, an error in writing can be prevented.

Next, an operation of the non-selected memory cell 114b[1,2,2] to the non-selected memory cell 114b[1,$m_2$,$m_3$] will be described. The application of the above-described potentials to the wirings turns on the selection transistor 116b[1,2] to the selection transistor 116b[1,$m_2$]. Furthermore, a potential 0 is applied to the gates of the non-selected memory cell 114b[1,2,2] to the non-selected memory cell 114b[1,$m_2$,$m_3$], and a potential −$V_L$ is applied to the active layers of the non-selected memory cell 114b[1,2,2] to the non-selected memory cell 114b[1,$m_2$,$m_3$]. Accordingly, in each of the non-selected memory cell 114b[1,2,2] to the non-selected memory cell 114b[1,$m_2$,$m_3$], the generation of a negative large potential difference between the gate and the active layer can be prevented; thus, an error in writing can be prevented.

Next, an operation of the non-selected memory cell 114b[2,1,1] to the non-selected memory cell 114b[$m_1$−1,$m_2$,1] will be described. The application of the above-described potentials to the wirings turns off the selection transistor 116b[2,1] to the selection transistor 116b[$m_1$−1,$m_2$]. Thus, the precharge potential in the period t5 (approximately −$V_L$) is held in the active layers of the non-selected memory cell 114b[2,1,1] to the non-selected memory cell 114b[$m_1$−1,$m_2$,1] during the writing operation. A potential −$V_H$ is applied to the gates of the non-selected memory cell 114b[2,1,1] to the non-selected memory cell 114b[$m_1$−1,$m_2$,1]. Accordingly, in each of the non-selected memory cell 114b[2,1,1] to the non-selected memory cell 114b[$m_1$−1,$m_2$,1], the generation of a negative large potential difference between the gate and the active layer can be prevented; thus, an error in writing can be prevented.

Next, an operation of the non-selected memory cell 114b[2,1,2] to the non-selected memory cell 114b[$m_1$−1,$m_2$,$m_3$]

will be described. The application of the above-described potentials to the wirings turns off the selection transistor $116b[2,1]$ to the selection transistor $116b[m_1-1,m_2]$. Thus, the precharge potential in the period t5 (approximately $-V_L$) is held in the active layers of the non-selected memory cell $114b[2,1,2]$ to the non-selected memory cell $114b[m_1-1,m_2,m_3]$ during the writing operation. A potential 0 is applied to the gates of the non-selected memory cell $114b[2,1,2]$ to the non-selected memory cell $114b[m_1-1,m_2,m_3]$. Accordingly, in each of the non-selected memory cell $114b[2,1,2]$ to the non-selected memory cell $114b[m_1-1,m_2,m_3]$, the generation of a negative large potential difference between the gate and the active layer can be prevented; thus, an error in writing can be prevented.

Next, an operation of the non-selected memory cell $114a[1,1,1]$ to the non-selected memory cell $114a[m_1-1,m_2,m_3]$ will be described. The application of the above-described potentials to the wirings turns off the selection transistor $116a[1,1]$ to the selection transistor $116a[m_1-1,m_2]$. Thus, the precharge potential in the period t5 (approximately $-V_L$) is held in the active layers of the non-selected memory cell $114a[1,1,1]$ to the non-selected memory cell $114a[m_1-1,m_2,m_3]$ during the writing operation. A potential 0 is applied to the gates of the non-selected memory cell $114a[1,1,1]$ to the non-selected memory cell $114a[m_1-1,m_2,m_3]$. Accordingly, in each of the non-selected memory cell $114a[1,1,1]$ to the non-selected memory cell $114a[m_1-1,m_2,m_3]$, the generation of a negative large potential difference between the gate and the active layer can be prevented; thus, an error in writing can be prevented.

Next, the potentials applied to the wirings in the period t8 for returning the precharge potentials in the period t5 will be described.

As illustrated in FIG. 33, in the period t8, a potential $+V_L$ is applied to the string selection line SSL2[1] to the string selection line SSL2[$m_1$-1] and the string selection line SSL1[1] to the string selection line SSL1[$m_1$-1]. Furthermore, a potential 0 is applied to the bit line BL[1] to the bit line BL[$m_2$] and the source line SL[1] to the source line SL[$m_2$]. Furthermore, a potential 0 is applied to the word line WLS[1] to the word line WLS[$m_3$] and the word line WLD[1] to the word line WLD[$m_3$]. Moreover, a potential $+V_L$ is applied to the wiring PC[1] to the wiring PC[$m_2$].

The application of the above-described potentials to the wirings turns on the selection transistor $116a[1,1]$ to the selection transistor $116a[m_1-1,m_2]$ and the selection transistor $116b[1,1]$ to the selection transistor $116b[m_1-1,m_2]$. Furthermore, in the memory cell $114a[1,1,1]$ to the memory cell $114a[m_1-1,m_2,m_3]$ and the memory cell $114b[1,1,1]$ to the memory cell $114b[m_1-1,m_2,m_3]$, a large potential difference is not generated between the gate and the active layer, and the memory cells are turned on. Accordingly, the potentials of the active layers of the memory cells are returned to 0 and an error in writing can be prevented.

Note that the time for which the precharge potential is held depends on the leakage current in the off state of the selection transistor $116a$ and the selection transistor $116b$. If the time for which the precharge potential is held is substantially equal to the writing time, returning the precharge potential in the period t8 may be omitted.

(Reading Operation)

In a period from the start of a period t10 to the end of a period t11 in FIG. 33, data written to the selected memory cell $114b[1,1,1]$ is read. The period t10 is a period for reading data written to the selected memory cell $114b[1,1,1]$. The period t11 is a period for returning the potential of each wiring to 0.

The potentials applied to the wirings in the period t10 for reading data written to the selected memory cell $114b[1,1,1]$ will be described.

As illustrated in FIG. 33, in the period t10, a potential $+V_r$ is applied to the string selection line SSL1[1], the string selection line SSL2[1], and the source line SL[1] to turn on the selection transistor $116a[1,1]$ and the selection transistor $116b[1,1]$. Furthermore, a potential $+V_r$ is applied to the wiring PC[1] to turn on the memory string $112[1,1]$. Moreover, a potential 0 is applied to the word line WLD[1], and a potential $+V_r$ is applied to the word line WLD[2] to the word line WLD[$m_3$] and the word line WLS[1] to the word line WLS[$m_3$].

In the case where data "1" is written to the memory cell $114b[1,1,1]$, the application of the above-described potentials to the wirings turns off the memory string $112[1,1]$ and brings the bit line BL[1] to a potential 0. Furthermore, in the case where data "0" is written to the memory cell $114b[1,1,1]$, the application of the above-described potentials to the wirings turns on the memory string $112[1,1]$ and increases the potential of the bit line BL[1]. The sense amplifier 123 senses the potential of the bit line BL[1] and amplifies it. Through the above process, data of the memory cell $114b[1,1,1]$ can be read.

The structures described in this embodiment can be used in an appropriate combination with the structures described in the other embodiments.

Embodiment 4

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desk-top computers, but also to large computers such as server systems. Alternatively, the semiconductor device described in the above embodiment is applied to removable memory devices such as memory cards (e.g., SD cards), USB memories, and solid state drives (SSD). FIG. 34 schematically illustrates some structural examples of removable memory devices. For example, the semiconductor device described in the above embodiment is processed into a packaged memory chip and used in a variety of storage devices and removable memories.

Figure 34A:
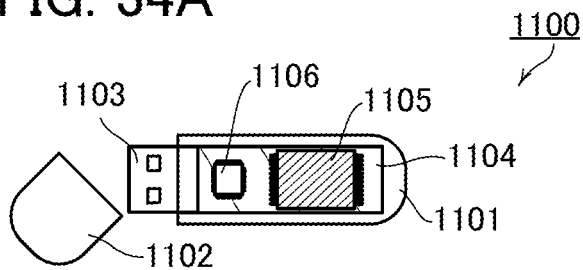
FIGS. 34A-34E Schematic views of a memory device of one embodiment of the present invention.

FIG. 34(A) is a schematic diagram of a USB memory. A USB memory 1100 includes a housing 1101, a cap 1102, a USB connector 1103, and a substrate 1104. The substrate 1104 is stored in the housing 1101. For example, a memory chip 1105 and a controller chip 1106 are attached to the substrate 1104. The semiconductor device described in the above embodiment can be incorporated in the memory chip 1105 or the like on the substrate 1104.

Figures 34B, 34C:
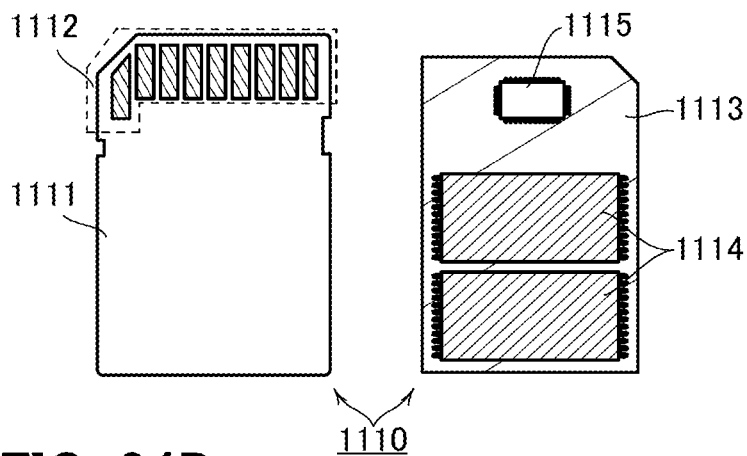

FIG. 34(B) is a schematic external diagram of an SD card, and FIG. 34(C) is a schematic diagram illustrating the internal structure of the SD card. An SD card 1110 includes a housing 1111, a connector 1112, and a substrate 1113. The substrate 1113 is stored in the housing 1111. For example, a memory chip 1114 and a controller chip 1115 are attached to the substrate 1113. When the memory chip 1114 is provided on the back side of the substrate 1113 as well, the capacity of the SD card 1110 can be increased. In addition, a wireless chip with a radio communication function may be provided on the substrate 1113. With such a wireless chip, the memory chip 1114 can read and write data by radio communication between the host device and the SD card 1110. The semiconductor device described in the above embodiment can be incorporated in the memory chip 1114 or the like on the substrate 1113.

Figures 34D, 34E:
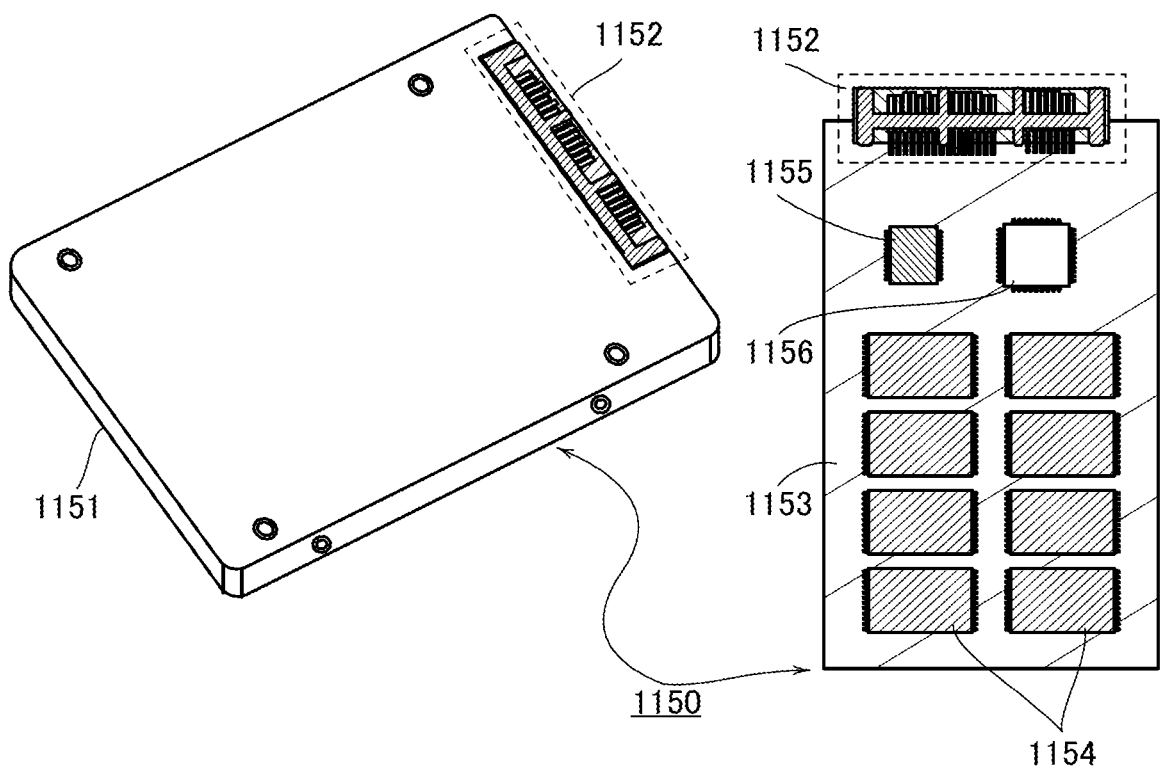

FIG. 34(D) is a schematic external diagram of an SSD, and FIG. 34(E) is a schematic diagram illustrating the internal structure of the SSD. An SSD 1150 includes a housing 1151, a connector 1152, and a substrate 1153. The substrate 1153 is stored in the housing 1151. For example, a memory chip 1154, a memory chip 1155, and a controller chip 1156 are attached to the substrate 1153. The memory chip 1155 is a work memory of the controller chip 1156, and a DRAM chip may be used, for example. When the memory chip 1154 is provided on the back side of the substrate 1153 as well, the capacity of the SSD 1150 can be increased. The semiconductor device described in the above embodiment can be incorporated in the memory chip 1154 or the like on the substrate 1153.

Embodiment 5

In this embodiment, an AI system in which the semiconductor device of the above embodiment is used is described with reference to FIG. 35.

Figure 35:
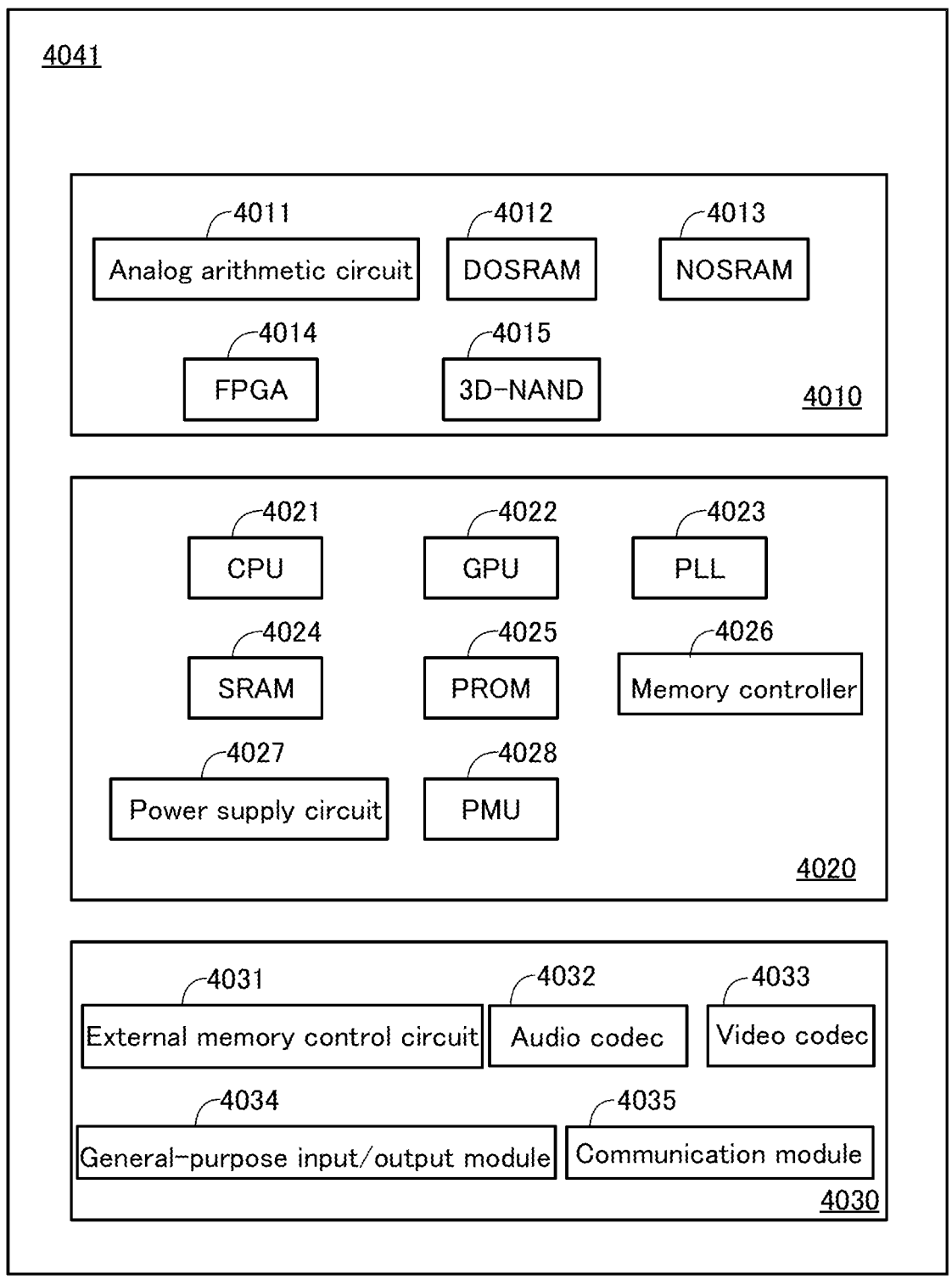
FIG. 35 A block diagram illustrating a structure example of an AI system of one embodiment of the present invention.

FIG. 35 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, an FPGA 4014, and a 3D-NAND 4015.

Here, DOSRAM (registered trademark) is an abbreviation for "Dynamic Oxide Semiconductor RAM" and refers to a RAM including 1T (transistor) 1C (capacitor)-type memory cell.

Furthermore, NOSRAM (registered trademark) is an abbreviation for "Nonvolatile Oxide Semiconductor RAM" and refers to a RAM including a gain cell-type (2T-type or 3T-type) memory cell. DOSRAM and NOSRAM are memories that utilize a low off-state current of an OS transistor.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in the SRAM, the input data have to be subdivided and stored because of the circuit area limitation and small storage capacity of the SRAM. The DOSRAM 4012 has a larger storage capacity than the SRAM because the memory cells can be arranged to be highly integrated even in a limited circuit area. Therefore, the DOSRAM 4012 can efficiently store the input data.

The NOSRAM 4013 is a nonvolatile memory using an OS transistor. The NOSRAM 4013 consumes less power in data writing than the other nonvolatile memories such as a flash memory, a ReRAM (Resistive Random Access Memory), and an MRAM (Magnetoresistive Random Access Memory). Furthermore, unlike in a flash memory and a ReRAM, elements do not deteriorate by data writing and there is no limitation on the number of times of data writing.

Furthermore, the NOSRAM 4013 can store multilevel data of two or more bits as well as one-bit binary data. Storage of the multilevel data in the NOSRAM 4013 leads to a reduction in the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data is included in the analog data in some cases.

Data and parameters used in the neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 can have a longer bit line than the DOSRAM 4012 and thus can have an increased storage capacity.

The FPGA 4014 is an FPGA using an OS transistor. With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) described later, with a hardware. Establishing the connection of the neural network with a hardware enables higher speed performance.

The FPGA 4014 is an OS-FPGA. An OS-FPGA can have a smaller memory area than an FPGA including an SRAM. Thus, adding a context switching function only causes a small increase in area. Moreover, an OS-FPGA can transmit data and parameters at high speed by boosting.

The 3D-NAND 4015 is a nonvolatile memory using an OS transistor. The 3D-NAND 4015 is a highly integrated memory in which the storage capacity per unit area is large. Furthermore, the 3D-NAND 4015 can store multilevel data of two or more bits as well as one-bit binary data. The multilevel data storage in the 3D-NAND 4015 leads to a further reduction in the memory cell area per bit.

As the 3D-NAND 4015, for example, the semiconductor device in the above embodiment can be used. Accordingly, the area occupied by the memory cell can be reduced, and the semiconductor device including the memory circuit of this embodiment can be further increased. Thus, storage capacity per unit area of the memory device of this embodiment can be increased.

In the AI system 4041, the analog arithmetic circuit 4011, the DOSRAM 4012, the NOSRAM 4013, and the FPGA 4014 can be provided on one die (chip). Thus, the AI system 4041 can execute calculation of the neural network quickly with low power consumption. In addition, the analog arithmetic circuit 4011, the DOSRAM 4012, the NOSRAM 4013, and the FPGA 4014 can be fabricated through the same manufacturing process. Therefore, the AI system 4041 can be fabricated at low cost.

Note that the arithmetic portion 4010 does not need to include all of the following: the DOSRAM 4012, the NOSRAM 4013, and the FPGA 4014. One or more selected from the DOSRAM 4012, the NOSRAM 4013, and the FPGA 4014 are provided in accordance with a problem that is desired to be solved by the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013.

Most of the existing programs used as libraries are premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and can execute the other product-sum operations in the GPU 4022. In this manner, the learning and inference can be executed at high speed.

The power supply circuit 4027 generates not only a low power supply potential for a logic circuit but also a potential for an analog operation. An OS memory may be used for the power supply circuit 4027. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. By including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 performs an operation on the basis of the clock generated by the PLL 4023. The PLL 4023 preferably includes an OS memory. By including the OS memory, the PLL 4023 can retain an analog potential with which the clock oscillation cycle is controlled.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute the neural network calculation at high speed with low power consumption.

Data used for the neural network calculation is stored in an external memory device (an HDD (Hard Disk Drive), an SSD (Solid State Drive), or the like) in many cases. Therefore, the AI system 4041 preferably includes the external memory control circuit 4031 functioning as an interface with the external storage device.

Because the neural network often deals with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the AI system 4041 includes the general-purpose input/output module 4034. The general-purpose input/output module 4034 includes a USB (Universal Serial Bus), an I2C (Inter-Integrated Circuit), or the like, for example.

The AI system 4041 can perform learning or inference using data obtained via the Internet. For this reason, the AI system 4041 preferably includes the communication module 4035.

The analog arithmetic circuit 4011 may use a multi-level flash memory as an analog memory. However, the flash memory has a limitation on the number of rewriting times. In addition, the multi-level flash memory is extremely difficult to embed (to form the arithmetic circuit and the memory on the same die).

Alternatively, the analog arithmetic circuit 4011 may use a ReRAM as an analog memory. However, the ReRAM has a limitation on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The structures described in this embodiment can be used in an appropriate combination with the structures described in the other embodiments.

Embodiment 6

<Application Example of AI System>

In this embodiment, application examples of the AI system described in the above embodiment are described with reference to FIG. 36.

Figure 36A:
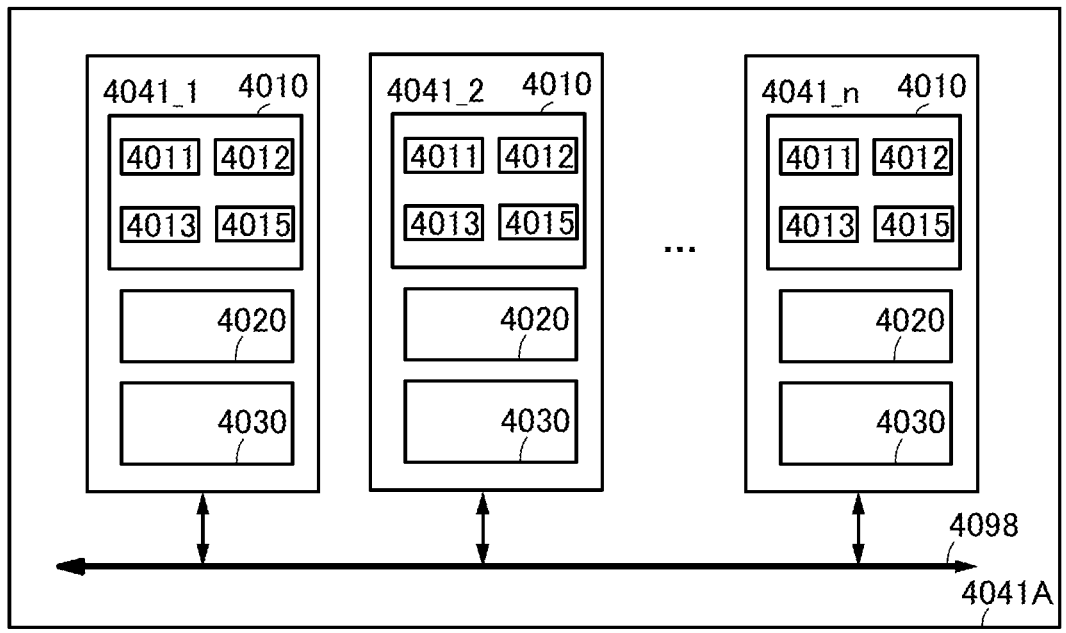
FIGS. 36A and 36B Block diagrams illustrating application examples of an AI system of one embodiment of the present invention.

FIG. 36(A) is an AI system 4041A in which the AI systems 4041 described with FIG. 35 are arranged in parallel and a signal can be transmitted between the systems via a bus line.

The AI system 4041A illustrated in FIG. 36(A) includes a plurality of AI systems 4041_1 to 4041_n (n is a natural number). The AI system 4041_1 to the AI system 4041_n are connected to each other via a bus line 4098.

Figure 36B:
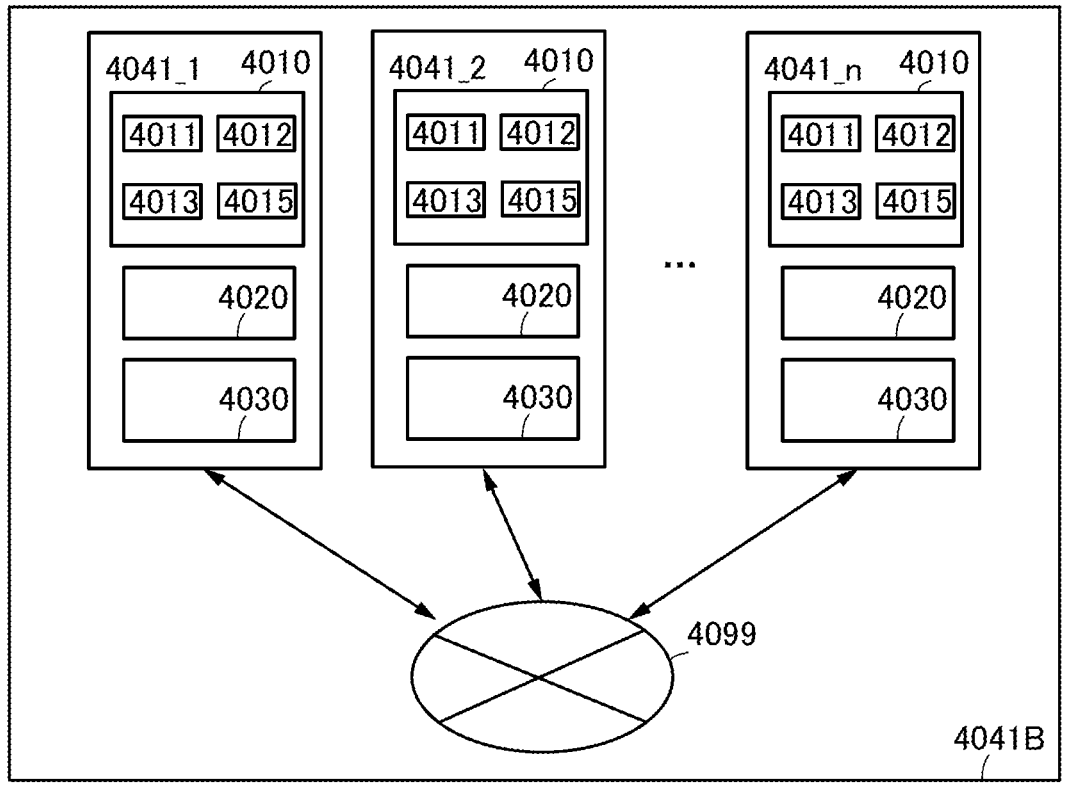

FIG. 36(B) is an AI system 4041B in which the AI systems 4041 described with FIG. 35 are arranged in parallel as in FIG. 36(A) and a signal can be transmitted between the systems via a network.

The AI system 4041B illustrated in FIG. 36(B) includes the plurality of AI systems 4041_1 to 4041_n. The AI system 4041_1 to the AI system 4041_n are connected to each other via a network 4099.

A structure may be employed in which a communication module is provided for each of the AI system 4041_1 to the AI system 4041_n to perform wireless or wired communication via the network 4099. The communication module can perform communication via an antenna. For example, the communication can be performed in such a manner that each electronic device is connected to a computer network such as the Internet that is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a specification that is communication standardized by IEEE such as Wi-Fi (registered trademark), Bluetooth (registered trademark), or ZigBee (registered trademark).

With the structure in FIG. 36(A) or 36(B), analog signals obtained with external sensors or the like can be processed by different AI systems. For example, biological information such as brain waves, a pulse, blood pressure, and body temperature can be obtained with a variety of sensors such as a brain wave sensor, a pulse wave sensor, a blood pressure sensor, and a temperature sensor, and analog signals can be processed by different AI systems. When the signal processing or learning is performed by different AI systems, the amount of information processed by each AI system can be reduced. Accordingly, the signal processing or learning can be performed with a smaller amount of arithmetic processing. As a result, recognition accuracy can be increased. The information obtained with each AI system is expected to enable instant understanding of collective biological information that irregularly changes.

The structures described in this embodiment can be used in an appropriate combination with the structures described in the other embodiments.

Embodiment 7

In this embodiment, an example of an IC incorporating the AI system described in the above embodiment is described.

In the AI system described in the above embodiment, a digital processing circuit including a Si transistor such as a CPU, an analog arithmetic circuit including an OS transistor, an OS-FPGA, and an OS memory such as a DOSRAM or a NOSRAM can be integrated into one die.

Figure 37:
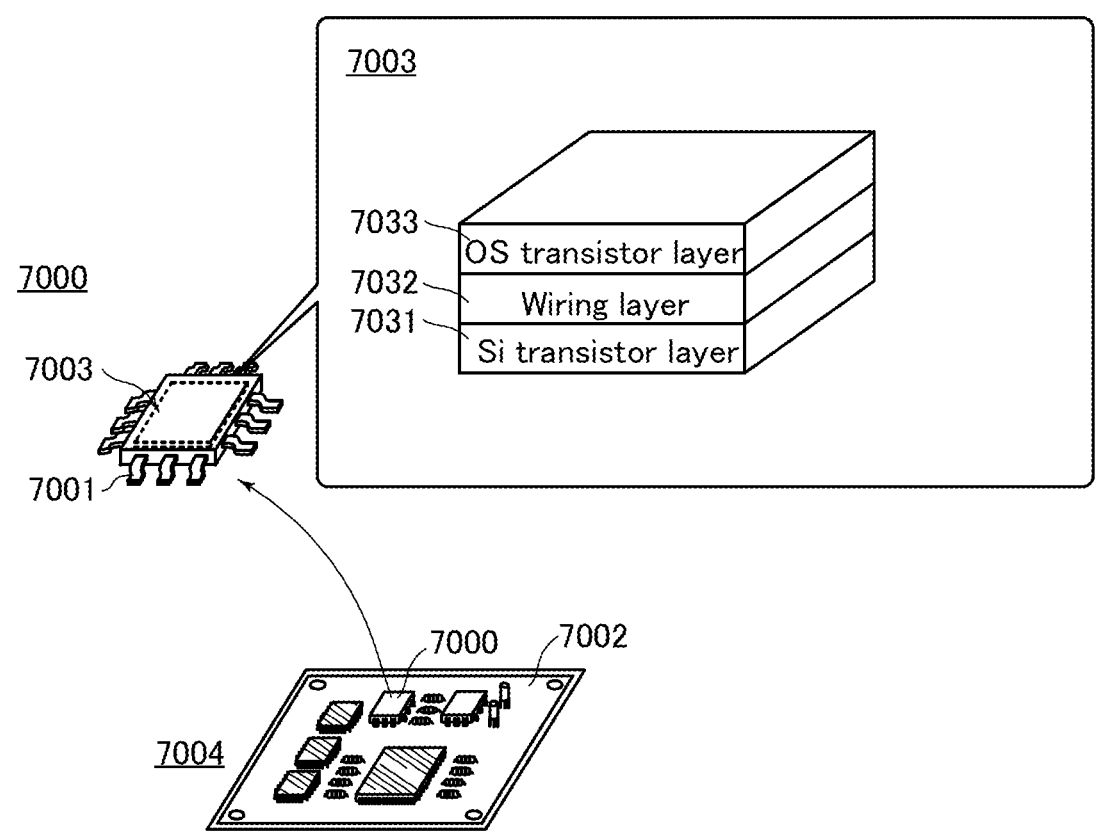
FIG. 37 A schematic perspective view illustrating a structure example of an IC incorporating an AI system of one embodiment of the present invention.

FIG. 37 illustrates the example of the IC incorporating the AI system. An AI system IC 7000 illustrated in FIG. 37 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a mounted board 7004) is completed. In the circuit portion 7003, the various circuits described in the above embodiment are provided on one die. The circuit portion 7003 has a stacked-layer structure, which is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 37, the embodiment of the package is not limited thereto.

The digital processing circuit such as a CPU, the analog arithmetic circuit including an OS transistor, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated at low cost.

The structures described in this embodiment can be used in an appropriate combination with the structures described in the other embodiments.

Embodiment 8

<Electronic Device>

The semiconductor device of one embodiment of the present invention can be used for a variety of electronic devices. FIG. 38 and FIG. 39 illustrate specific examples of the electronic devices each including the semiconductor device of one embodiment of the present invention.

Figure 38A:
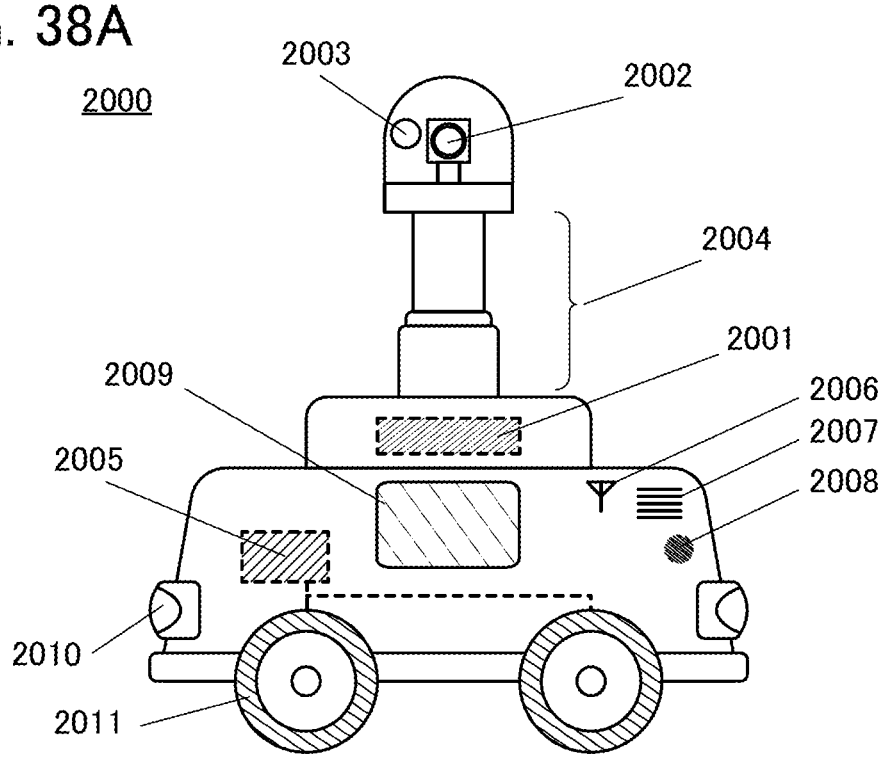
FIGS. 38A and 38B Views illustrating an electronic device of one embodiment of the present invention.

A robot 2000 illustrated in FIG. 38(A) includes an arithmetic device 2001, a sensor 2002, a light 2003, a lift 2004, a driver portion 2005, and a moving mechanism 2011, and can take a still image and a moving image while being moved. Such a robot can be used for a security system or a monitoring system.

The robot 2000 may further include a communication means 2006, a speaker 2007, a microphone 2008, a display portion 2009, a light-emitting portion 2010, and the like.

For the arithmetic device 2001, the semiconductor device of one embodiment of the present invention can be used. In the arithmetic device 2001, an IC in which the AI system of one embodiment of the present invention is incorporated can be used. The sensor 2002 functions as a camera which takes images of surroundings of the robot 2000. The light 2003 can be used when the images of the surroundings of the robot 2000 are taken by the sensor 2002. When a still image is taken by the sensor 2002, the light 2003 preferably functions as a flashlight. The sensor 2002 is connected to a main body of the robot via the lift 2004. The height of the sensor 2002 can be adjusted by the lift 2004. The lift 2004 is preferably telescopic. Alternatively, the lift 2004 may be a foldable lift composed of a plurality of booms. The robot 2000 including the driver portion 2005 and the moving mechanism 2011 connected to the driver portion 2005 is preferable because an imaging range of the sensor 2002, that is, a monitoring range, is expanded.

The communication means 2006 can send data taken by the sensor 2002 to a manager or the server owned by the manager. In addition, when the arithmetic device 2001 analyzes the data taken by the sensor 2002 and judges that there is an emergency such as a crime, an accident, or a fire, the communication means 2006 can report to the security company, the police, the fire station, the medical institution, or the owner of the land or the building. The speaker 2007 can transmit information such as an alert to a criminal, a call to an injured person or an emergency patient, and evacuation guidance, to the surroundings of the robot. The microphone 2008 can be used to obtain sounds around the robot 2000. The use of the communication means 2006 and the speaker 2007 enables the robot 2000 to function as a telephone. A person around the robot 2000 can have a conversation with the manager or a specific person. The display portion 2009 can display specific data. In emergency, the disaster information and the evacuation route can be displayed. The use of the communication means 2006, the speaker 2007, and the microphone 2008 enables the robot 2000 to function as the videophone. A person around the robot 2000 can have a conversation with the manager or a given person while seeing the display portion 2009.

The light-emitting portion 2010 emits light or displays characters to show the direction of movement and the stopped state of the robot 2000. In addition, emergency may also be shown.

Figure 38B:
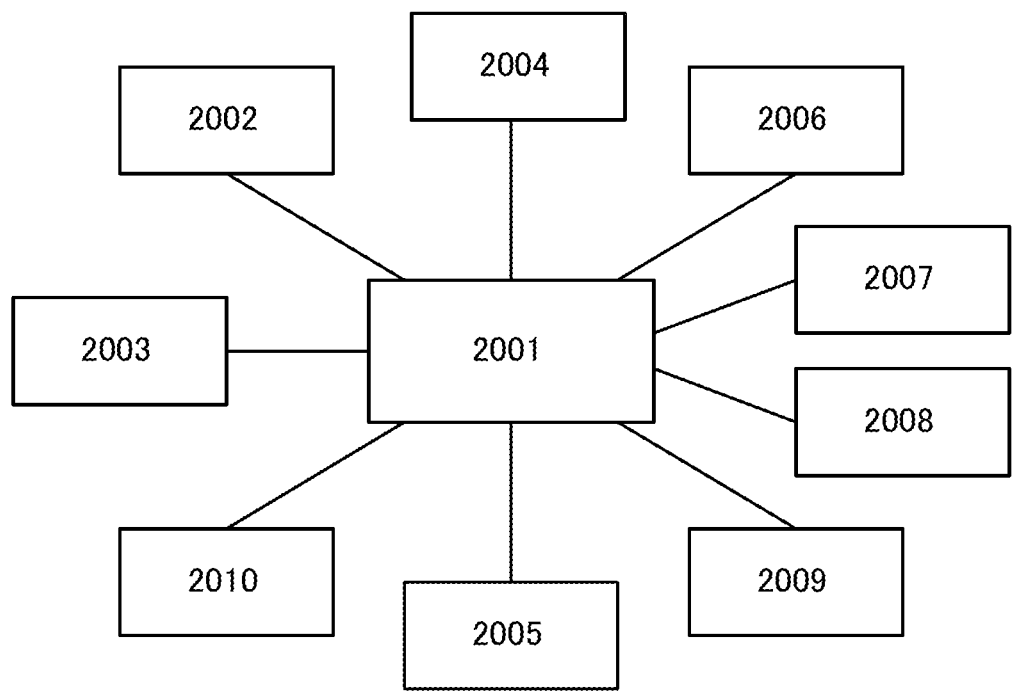

FIG. 38(B) is a block diagram illustrating a configuration of the robot 2000. The arithmetic device 2001 adjusts turning on or off and the brightness of the light 2003 from data such as an image obtained by the sensor 2002. In addition, the height of the lift 2004 is adjusted or the driver portion 2005 is controlled to align the positions of the robot 2000 and the sensor 2002. The operating condition of the driver portion 2005 can be shown by using the light-emitting portion 2010. With the communication means 2006, information around the robot 2000 obtained from the sensor 2002 and the microphone 2008 can be transmitted to the manager or the server owned by the manager. Depending on the judgement of the arithmetic device 2001 or the manager, information can be sent to the surroundings of the robot 2000 with the speaker 2007 and the display portion 2009.

In the case where a sensor that can take an image even in dark surroundings is used as a sensor used as the sensor 2002, the light 2003 is not necessarily provided. As such a sensor, an image sensor containing selenium (Se) in the light receiving portion can be used.

The robot 2000 can be used in commercial facilities and for security of the office. Data obtained from the sensor 2002 and the microphone 2008 is stored in the arithmetic device 2001 or the server. The stored data is analyzed by an AI system to check whether there is an unusual situation such as loss or damage of an object, entry of a suspicious individual, or disaster such as a fire. For the data analysis, deep learning may be used. When there is an unusual situation, the robot 2000 performs report to the manager and transmits information to the surroundings, and records the conditions of the surroundings.

The robot 2000 may be used for monitoring the growing conditions of the crops. The robot 2000 placed in a rice field or a field monitors the shapes, the sizes, or the colors of leaves or fruit by the sensor 2002 to check whether the crops are damaged or whether the crops are harmed by pests. Since the moving mechanism 2011 is provided for the robot 2000, the growing conditions of the crops can be monitored in a wide range. In addition, since the robot 2000 is provided with the lift 2004, the leaves and fruit at a certain height can be monitored regardless of the kind of crops and the growing conditions. The monitoring results are transmitted to a grower using the communication means 2006, and the grower can determine the kind, the amount, and the spraying timing of fertilizer and agricultural chemicals necessary for the crops. Alternatively, the monitoring results may be analyzed with an AI system using the arithmetic device 2001, and the kind, the amount, and the spraying timing of fertilizer and agricultural chemicals necessary for the crops may be determined and reported to the grower. Deep learning may be used for analysis of the monitoring results.

Figure 39A:
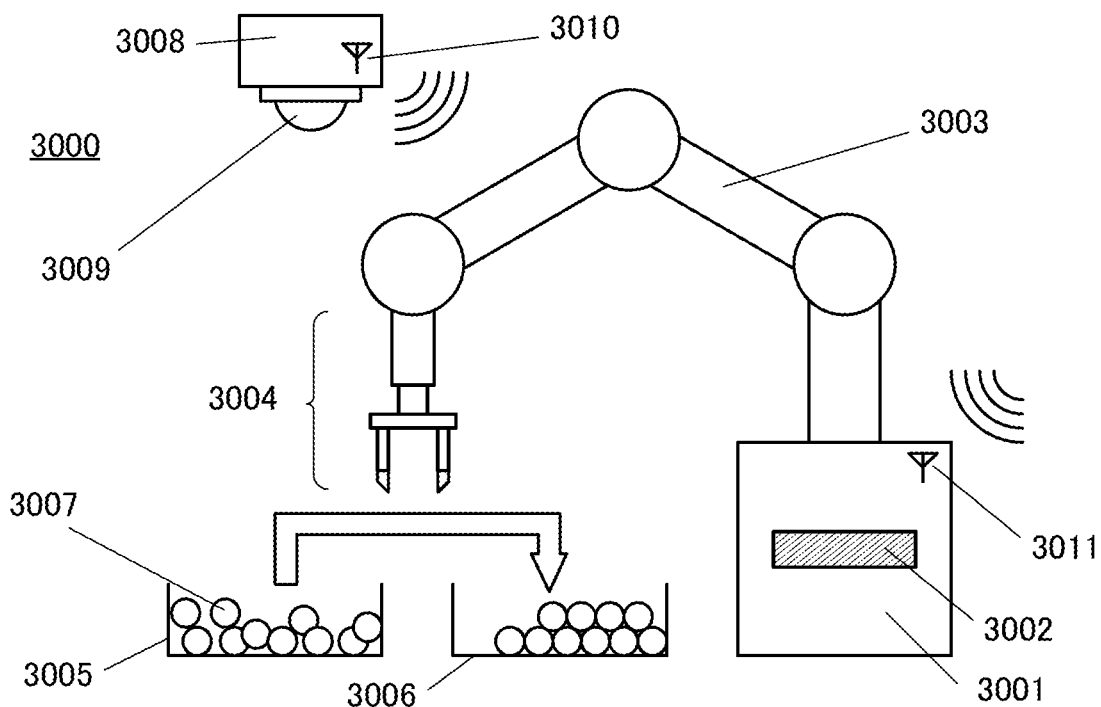
FIGS. 39A-39F Views illustrating an electronic device of one embodiment of the present invention.

FIG. 39(A) illustrates a sorting system 3000 using a robot 3001. The robot 3001 includes an arithmetic device 3002, a boom 3003, and an arm 3004. The robot 3001 may further include a wired or wireless communication means 3011. In addition, the sorting system 3000 includes a housing 3008 including a sensor 3009. The housing 3008 includes a communication means 3010. The housing 3008 is provided for a ceiling, a wall, or a beam (not illustrated) of the sorting system 3000 or a sorting operation area. The housing 3008 may be provided in the robot 3001. For example, the housing 3008 may be provided for the boom 3003 or the arm 3004. In the case where the housing 3008 is provided in the robot 3001, data obtained by the sensor 3009 may be transmitted to the arithmetic device 3002 without passing through the communication means 3010 or the communication means 3011, and processed.

The boom 3003 is movable, whereby the arm 3004 can be placed at a desired position. The arm 3004 may be telescopic. The arm 3004 placed over a desired object 3007 may be stretched to grab the desired object 3007, shortened, and then moved by the boom 3003.

The sorting system 3000 can transfer the object 3007 in a container 3005 to a container 3006. The container 3005 and the container 3006 may have the same shape or different shapes. Furthermore, a plurality of objects 3007 put in one container 3005 may be moved separately to a plurality of containers 3006.

As the container 3005 and the container 3006, a container, a cardboard box, a box for packing a product, a case, a film, a bag, a tray for storing foods, a lunch box, or the like is used. Furthermore, at least one of the container 3005 and the container 3006 may be cooking utensils such as a pot or a frying pan.

For the arithmetic device 3002, the semiconductor device of one embodiment of the present invention can be used. In the arithmetic device 3002, an IC in which the AI system of one embodiment of the present invention is incorporated can be used.

The sensor 3009 receives the position of the container 3005, the position of the container 3006, the state of the inside of the container 3005, and the state of the object 3007 in the container 3005 and transmits the data to the arithmetic device 3002 using the communication means 3010. Transmission of data is performed with or without a wire. Alternatively, the data may be transmitted through a wire without the communication means 3010. The arithmetic device 3002 analyzes the transmitted data. Here, the state of the object 3007 indicates the shape or the number of the objects 3007, the overlap between the objects 3007, or the like. The arithmetic device 3002 performs analyzation on the basis of information from the sensor 3009 and obtains detailed information of the object 3007. The three-dimensional shape and hardness (or softness) of the object 3007 are obtained by comparison with the data stored in the arithmetic device 3002 or the server that can be communicated with the robot 3001. Depending on the three-dimensional shape and hardness (or softness) of the object 3007, the shape of the arm 3004 can be changed.

To obtain the detailed data of the object 3007, analysis using an AI system can be utilized. Deep learning may be used to analyze the data.

Figure 39B:
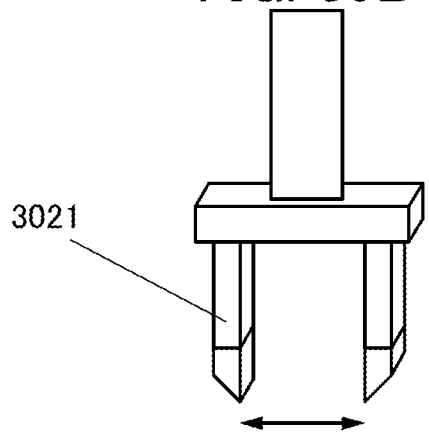
Figure 39C:
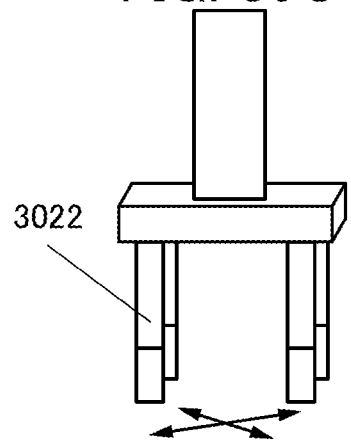
Figure 39D:
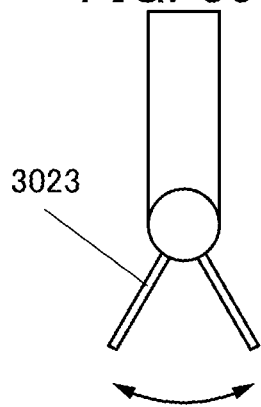
Figure 39E:
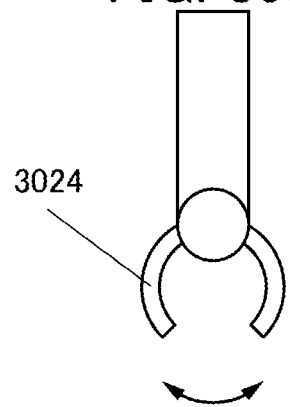
Figure 39F:
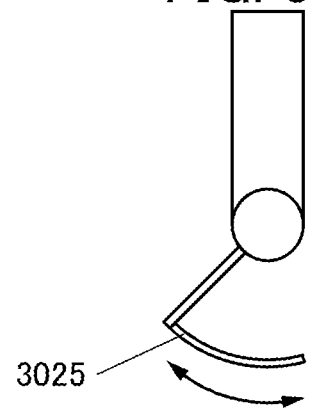

FIG. 39(B) illustrates an arm in which a pair of plates 3021 can move in the horizontal direction to pick up the object 3007. The pair of plates 3021 moves toward the center horizontally, whereby the object 3007 can be picked up. Such an arm can hold a surface of the object 3007, and is suitable for picking up the object 3007 with a columnar shape, such as a cube or a rectangular solid. FIG. 39(C) illustrates an arm in which a plurality of bars 3022 can move in the horizontal direction to pick up the object 3007. The plurality of bars 3022 move toward the center horizontally, whereby the object 3007 can be picked up. Such an arm can pinch a point of the object 3007, and is suitable for picking up the object 3007 in a spherical shape or in a non-fixed shape, that is, the object 3007 in an irregular shape. Note that although the number of the bars 3022 is four in FIG. 39(C), it is not limited thereto in this embodiment. The number of the bars 3022 may be three or five or more. FIG. 39(D) illustrates an arm in which a pair of plates 3023 rotates around the common axis to become closer to each other to pick up the object 3007. Such an arm can hold a surface of the object 3007, and is suitable for picking up the object 3007 with a thin-film shape, such as paper or films. FIG. 39(E) illustrates an arm in which a pair of crook-shaped plates 3024 rotates around the common axis so that the ends of them become closer to each other to pick up the object 3007. Such an arm can pinch a point or a line of the object 3007, and is suitable for picking up the object 3007 with a thin-film shape, such as paper or films or the object 3007 with a smaller particulate shape. As illustrated in FIG. 39(F), a spatula 3025 may be attached to the tip of the arm, and the object 3007 with a smaller particulate shape may be scooped.

The arms illustrated in FIGS. 39(A) to 39(F) are just examples and one embodiment of the present invention is not limited to these shapes. In addition, the applications of the arms are just examples and one embodiment of the present invention is not limited thereto.

The robot 3001 moves the boom 3003 to move the arm 3004 to a position over the desired object 3007 in the container 3005 on the basis of signals from the arithmetic device 3002. In the case of using the telescopic arm 3004, the arm 3004 is stretched, and the tip of the arm 3004 is brought down to a position on the same level as the object 3007. The tip of the arm is moved to catch the desired object 3007. The arm is shortened while catching the object 3007. The boom 3003 is moved again to transfer the arm 3004 to the desired position in the container 3006. At this time, the arm 3004 may be rotated to adjust the angle of the object 3007 to the container 3006. The arm 3004 is stretched to place the object 3007 in the container 3006, and the arm 3004 releases the object 3007. The above operation is repeated, so that the robot 3001 can move the objects 3007 from the container 3005 to the container 3006.

Since the positional information on the containers 3005 and 3006 and the state of the object 3007 are analyzed using the AI system, the object 3007 can be moved surely regardless of the shape or hardness of the object 3007. Examples of the object 3007 include not only an object packed in a box or a case with a cubic shape, a rectangular solid shape, or an arbitrary shape but also shaped processed foods such as an egg, a hamburger steak, and a croquette, foods such as vegetables with an irregular shape such as a potato and a tomato, machine parts such as a screw and a nut, a thin film of a paper or a film, and the like. Since in the sorting system 3000 in this embodiment, the shape of the arm can be changed in consideration of the shape and the hardness of the object 3007, the objects 3007 given above as examples can be transferred from the container 3005 to the container 3006 regardless of the shape and the hardness.

A memory device including the semiconductor device of one embodiment of the present invention can hold control data, a control program, or the like of the above electronic device for a long time. With the use of the semiconductor device of one embodiment of the present invention, a highly reliable electronic device can be provided.

An IC in which the above AI system is incorporated can be used for the arithmetic device or the like of the above-described electronic device, for example. Accordingly, the electronic device of this embodiment can perform optimal operations depending on circumstances with low power consumption by utilizing the AI system.

This embodiment can be implemented in combination with the structures described in the other embodiments as appropriate.

REFERENCE NUMERALS

100: memory device, 105: control circuit, 110: memory cell array, 112: memory string, 114: memory cell, 114*a*: memory cell, 114*b*: memory cell, 116*a*: selection transistor, 116*b*: selection transistor, 118: transistor, 121: row decoder, 122: row driver, 123: sense amplifier, 124: source line driver, 125: input/output circuit, 126: column driver, 701: conductor, 701_1: conductor, 701_*m*: conductor, 701A: conductive film, 701B: conductive film, 702: conductor, 702A: conductive film, 702B: conductive film, 703: insulator, 703*a*: insulator, 703A: insulating film, 703*b*: insulator, 703B: insulating film, 703*c*: insulator, 703C: insulating film, 704: oxide, 704A: oxide film, 705: insulator, 705A: insulating film, 706: conductor, 707: conductor, 707*a*: conductor, 707*b*: conductor, 708: insulator, 708A: insulating film, 720: base, 721: insulating film, 722: insulator, 722_1: insulator, 722_*m*: insulator, 722A: insulating film, 722B: insulating film, 723: mask, 724: insulating film, 726: insulating film, 725: mask, 725A: mask, 728: insulating film, 729: insulating film, 730: conductor, 730_1: conductor, 730_*m*: conductor, 730A: conductive film, 730*a*: conductor, 730*a*_1: conductor, 730*a*_*m*: conductor, 730*b*: conductor, 730*b*_1: conductor, 730*b*_*m*: conductor, 732: conductor, 732*a*: conductor, 732*b*: conductor, 734: conductor, 734_1: conductor, 734_*m*: conductor, 734*a*: conductor, 734*a*_1: conductor, 734*a*_*m*: conductor, 734*b*: conductor, 734*b*_1: conductor, 734*b*_*m*: conductor, 736: conductor, 736*a*: conductor, 736*b*: conductor, 740: insulator, 740A: insulating film, 742: conductor, 742A: conductive film, 744: conductor, 744*a*: conductor, 744*b*: conductor, 746: conductor, 748: conductor, 751: conductor, 752: insulating film, 753: insulator, 754: oxide, 756: conductor, 756*a*: conductor, 756*b*: conductor, 757: conductor, 757*a*: conductor, 757*b*: conductor, 761: insulating film, 762: insulating film, 763: insulating film, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 2000: robot, 2001: arithmetic device, 2002: sensor, 2003: light, 2004: lift, 2005: driver portion, 2006: communication means, 2007: speaker, 2008: microphone, 2009: display portion, 2010: light-emitting portion, 2011: moving mechanism, 3000: sorting system, 3001: robot, 3002: arithmetic device, 3003: boom, 3004: arm, 3005: container, 3006: container, 3007: object, 3008: housing, 3009: sensor, 3010: communication means, 3011: communication means, 3021: plate, 3022: bar, 3023: plate, 3024: plate, 3025: spatula, 4010: arithmetic portion, 4011: analog arithmetic circuit, 4012: DOSRAM,

4013: NOSRAM, 4014: FPGA, 4015: 3D-NAND, 4020: control portion, 4021: CPU, 4022: GPU, 4023: PLL, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041_1: AI system, 4041_n: AI system, 4041A: AI system, 4041B: AI system, 4098: bus line, 4099: network, 7000: AI system IC, 7001: lead, 7002: printed circuit board, 7003: circuit portion, 7004: mounted board, 7031: Si transistor layer, 7032: wiring layer, 7033: OS transistor layer

The invention claimed is:

1. A semiconductor device comprising a memory string,
wherein the memory string comprises a memory cell and a transistor,
wherein the memory cell comprises:
 a first conductor having a first opening;
 a first insulator inside the first opening;
 a second insulator provided inside the first insulator;
 a third insulator provided inside the second insulator;
 a first oxide provided inside the third insulator; and
 a fourth insulator provided inside the first oxide,
wherein the transistor comprises:
 a second conductor having a second opening;
 the first insulator provided inside the second opening;
 the third insulator provided inside the first insulator;
 the first oxide provided inside the third insulator;
 a fifth insulator provided inside the first oxide; and
 a third conductor provided inside the fifth insulator,
wherein the second conductor comprises a region overlapping with the first oxide with the first insulator therebetween, and
wherein the third conductor comprises a region overlapping with the first oxide with the fifth insulator therebetween.

2. The semiconductor device according to claim 1, wherein the second conductor functions as a first gate, and
wherein the third conductor functions as a second gate.

3. The semiconductor device according to claim 1, wherein the first oxide comprises In, an element M (M is Al, Ga, Y, or Sn), and Zn.

4. The semiconductor device according to claim 1, wherein the fourth insulator has a stacked-layer structure.

5. The semiconductor device according to claim 1, wherein the semiconductor device comprises a base,
wherein the semiconductor device comprises a plurality of the memory cells over the base, and
wherein the plurality of the memory cells and the transistor are stacked in a direction perpendicular to one surface of the base.

6. The semiconductor device according to claim 5, wherein the second insulator is formed over or under the third conductor in a direction perpendicular to one surface of the base.

7. The semiconductor device according to claim 1, wherein the first insulator is an oxide comprising any one of silicon, aluminum, and hafnium.

8. The semiconductor device according to claim 1, wherein the third insulator is an oxide comprising any one of silicon, aluminum, and hafnium.

* * * * *